(12) United States Patent
Kanskar et al.

(10) Patent No.: US 10,243,320 B2
(45) Date of Patent: Mar. 26, 2019

(54) LOW SWAP LASER PUMP DIODE MODULE AND LASER AMPLIFIER INCORPORATING THE SAME

(71) Applicant: NLIGHT, INC., Vancouver, WA (US)

(72) Inventors: Manoj Kanskar, Portland, OR (US); Johannes Boelen, Hudson, CA (US)

(73) Assignee: NLIGHT, INC., Vancouver, WA (US)

( * ) Notice: Subject to any disclaimer, the term of this patent is extended or adjusted under 35 U.S.C. 154(b) by 0 days.

(21) Appl. No.: 15/968,139

(22) Filed: May 1, 2018

(65) Prior Publication Data

US 2018/0278013 A1   Sep. 27, 2018

Related U.S. Application Data

(63) Continuation-in-part of application No. 15/498,422, filed on Apr. 26, 2017, now Pat. No. 10,109,978.

(60) Provisional application No. 62/492,869, filed on May 1, 2017, provisional application No. 62/458,569, filed on Feb. 13, 2017, provisional application No. 62/327,971, filed on Apr. 26, 2016.

(51) Int. Cl.
| | | |
|---|---|---|
| *H01S 5/02* | (2006.01) | |
| *H01S 5/024* | (2006.01) | |
| *H01S 5/022* | (2006.01) | |
| *H01S 3/0941* | (2006.01) | |
| *H01S 3/04* | (2006.01) | |
| *H01S 3/094* | (2006.01) | |

(52) U.S. Cl.
CPC ........ *H01S 5/02423* (2013.01); *H01S 3/0401* (2013.01); *H01S 3/0407* (2013.01); *H01S 3/09415* (2013.01); *H01S 3/094003* (2013.01); *H01S 5/02284* (2013.01); *H01S 5/02288* (2013.01)

(58) Field of Classification Search
CPC ............ H01S 5/02423; H01S 5/02284; H01S 5/02288; H01S 3/0401; H01S 3/0407; H01S 3/094003; H01S 3/09415
See application file for complete search history.

(56) References Cited

U.S. PATENT DOCUMENTS

| | | | |
|---|---|---|---|
| 9,413,136 B1 * | 8/2016 | Vethake | ............. H01S 5/02407 |
| 2010/0118902 A1 | 5/2010 | Wu | |
| 2010/0158058 A1 | 6/2010 | Kress | |
| 2014/0328360 A1 | 11/2014 | Ertel et al. | |
| 2016/0072254 A1 | 3/2016 | Suzuki | |

OTHER PUBLICATIONS

International Searching Authority, Written Opinion, etc., in PCT/US2018/029637, dated Aug. 10, 2018.

* cited by examiner

*Primary Examiner* — Armando Rodriguez
(74) *Attorney, Agent, or Firm* — Michelle Craig

(57) ABSTRACT

Disclosed herein are Low Size Weight and Power efficient Laser Diode pump modules and High Power Fiber Amplifiers incorporating such pump modules for amplifying laser light produced by a seed laser. The pump modules are configured for forced fluid cooling, and are provided with cooling channels that allow for varying combinations of a coolant mass flow rate F of the coolant, a pressure drop P of the coolant, and a steady state temperature T of the laser diodes in the pump modules, uniquely and significantly, and thereby allowing for optimizing such variables for a particular application.

22 Claims, 37 Drawing Sheets

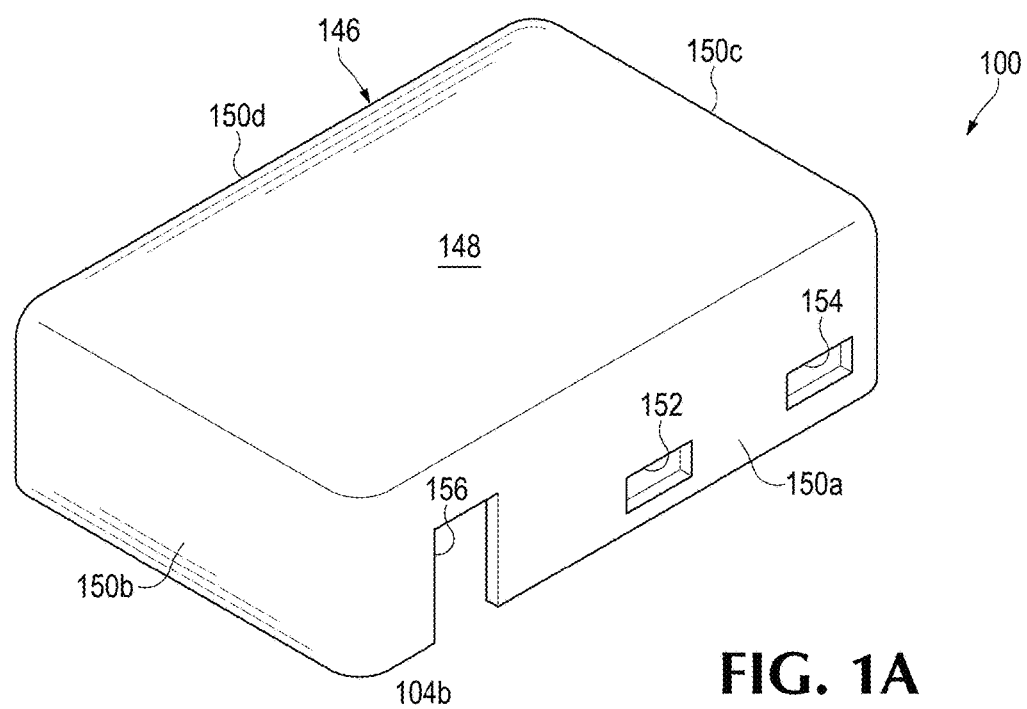
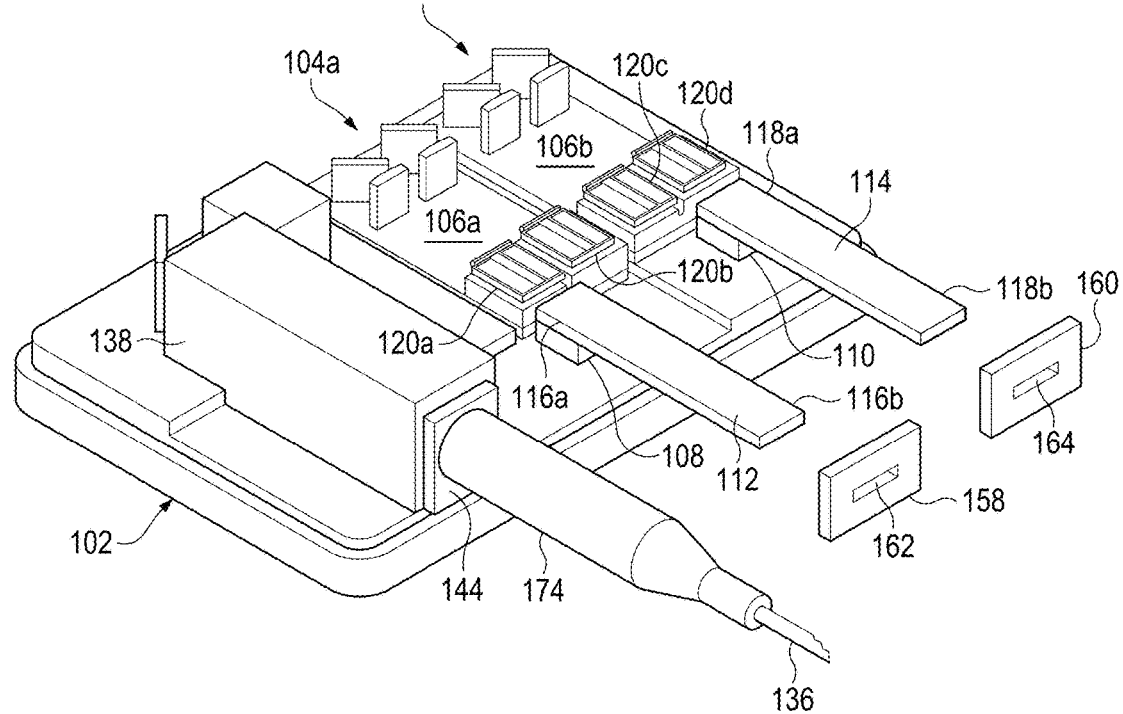
FIG. 1A

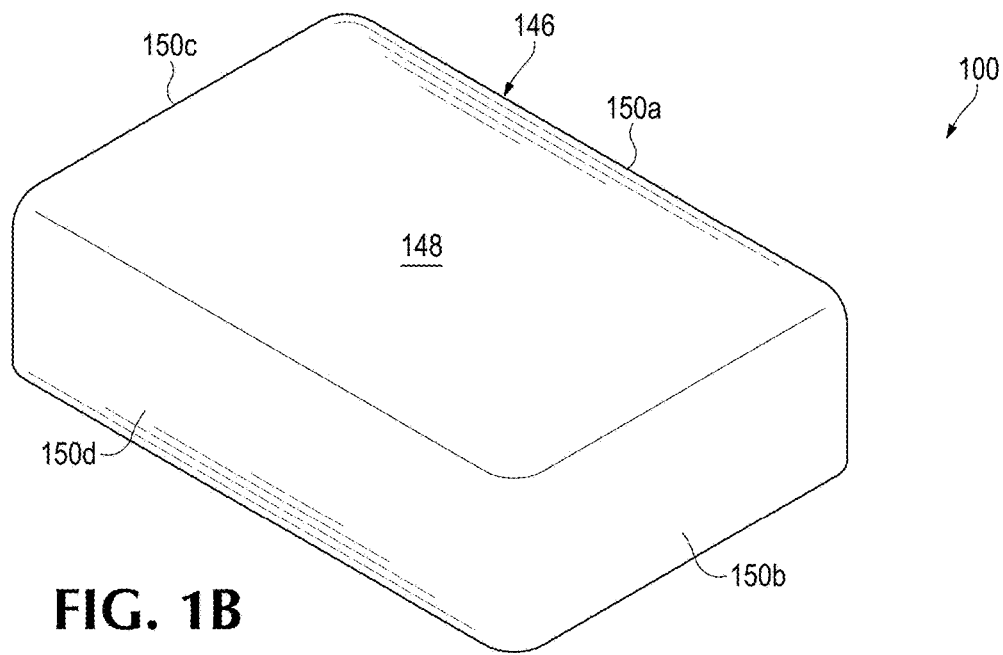
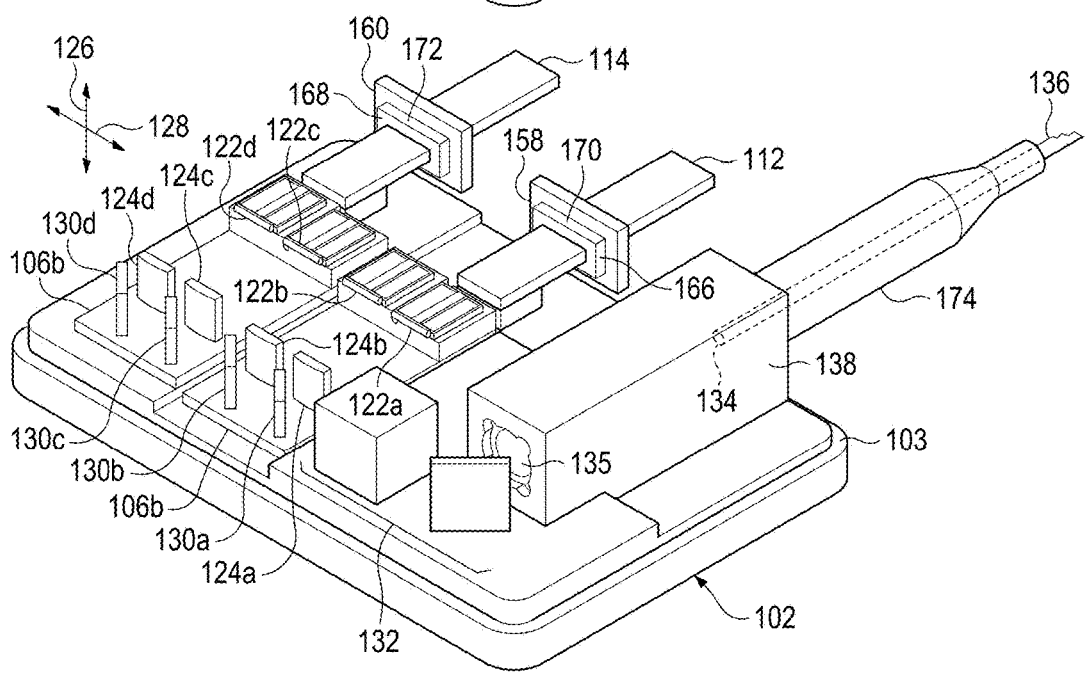
FIG. 1B

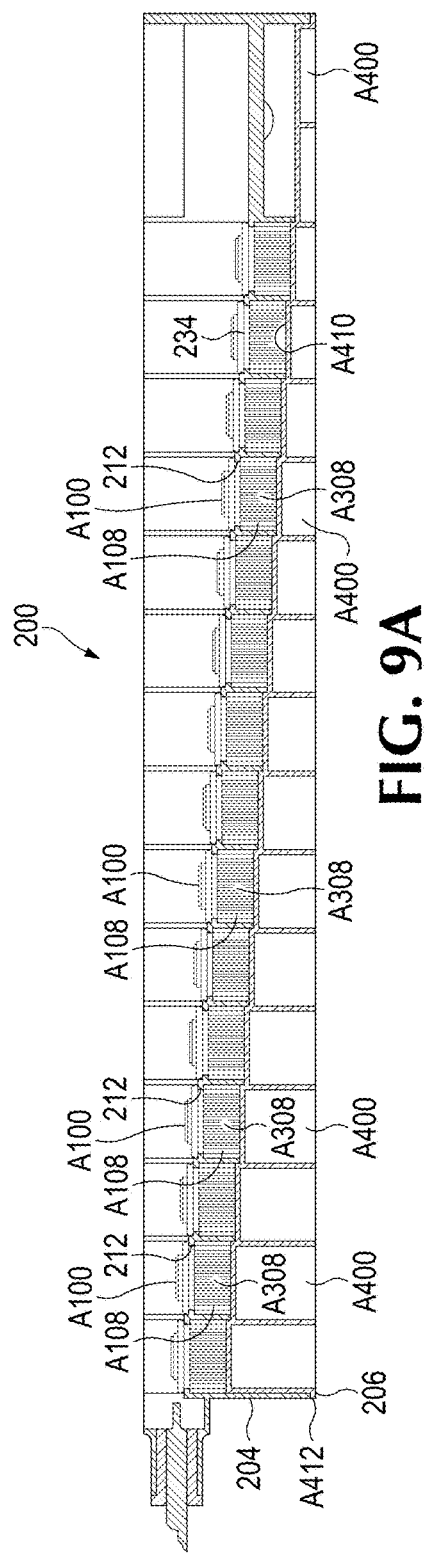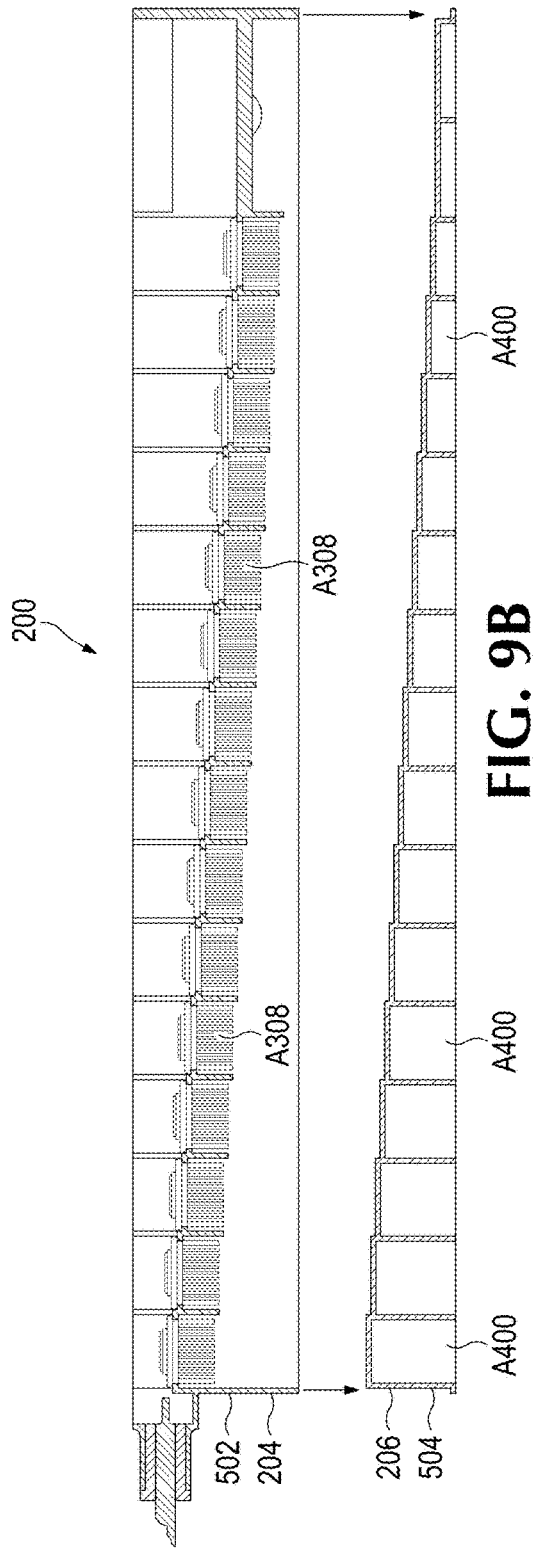

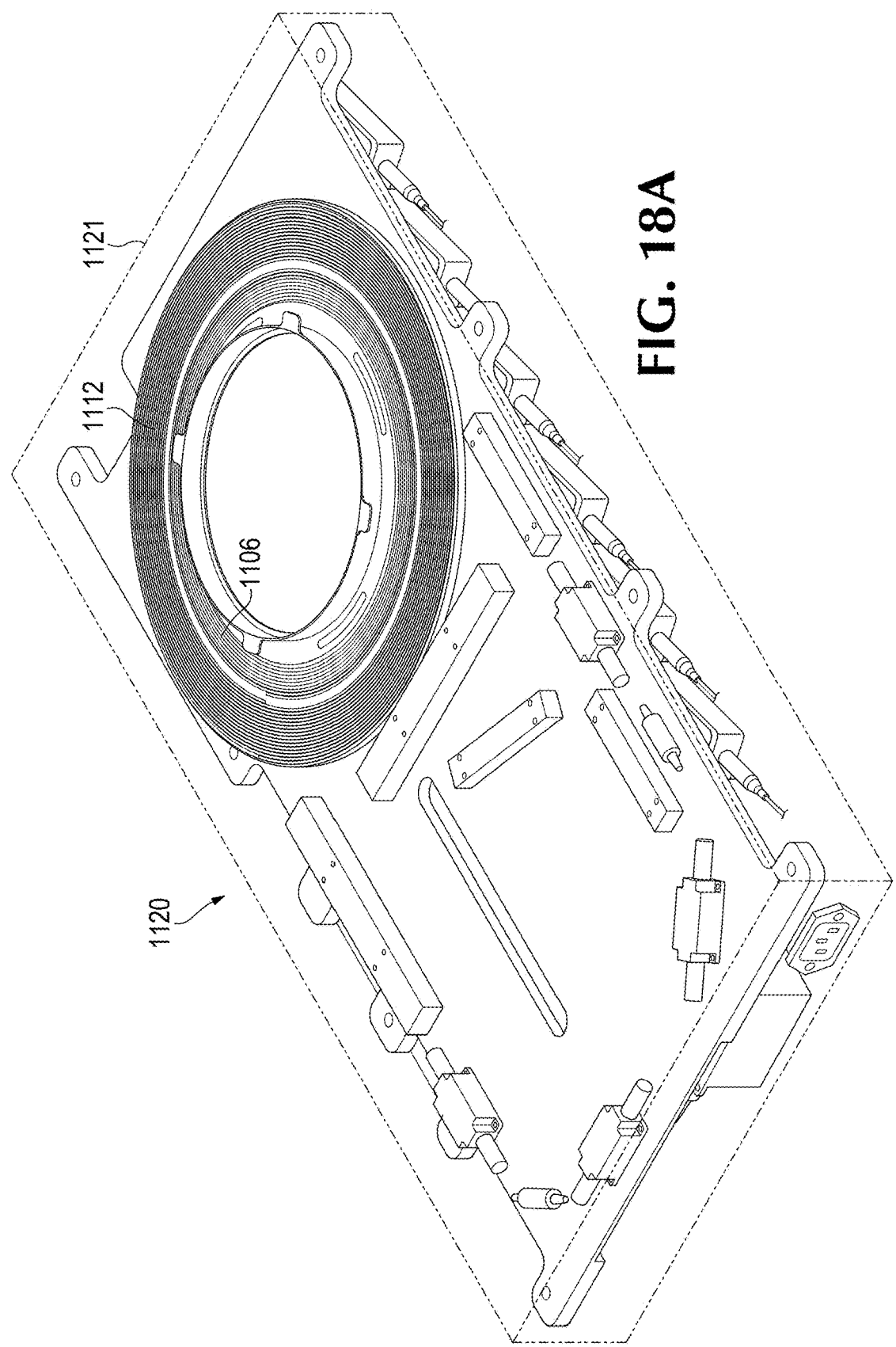

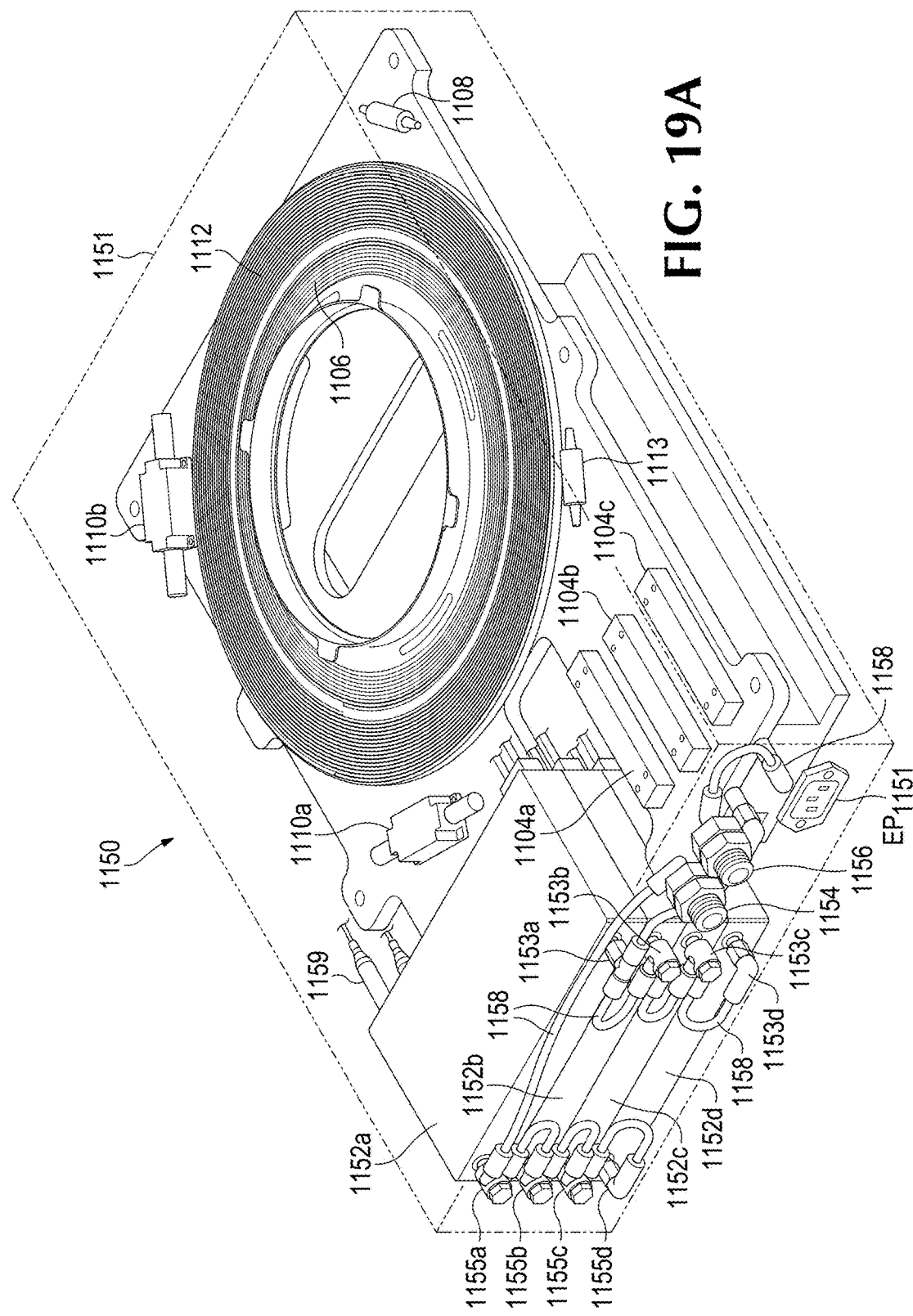

LOW SWAP LASER PUMP DIODE MODULE AND LASER AMPLIFIER INCORPORATING THE SAME

CROSS-REFERENCE TO RELATED APPLICATIONS

This application claims priority from, and the benefit of, U.S. nonprovisional patent application Ser. No. 15/498,422, filed Apr. 26, 2017, which claims priority from, and the benefit of, U.S. provisional patent application Ser. No. 62/327,971, filed Apr. 26, 2016, and U.S. provisional patent application Ser. No. 62/458,569, filed Feb. 13, 2017. This application also claims priority from, and the benefit of, U.S. provisional patent application Ser. No. 62/492,869, filed May 1, 2017. All of the aforementioned applications are incorporated by reference herein in their entireties.

TECHNICAL FIELD

This invention relates primarily to thermal management of low size, weight and power efficient laser diode pump modules and optical fiber coupled laser amplifiers incorporating the same.

BACKGROUND

Most fiber-coupled laser (Light Amplification by Stimulated Emission of Radiation) diode pumps have been developed for large volume industrial applications where the primary metrics are price-per-bright-watts and reliability. In conventional high-power fiber laser technology a significant portion of the weight and volume of the total fiber laser system is in the high powered diode pumps where much of the weight and volume is devoted to waste heat removal. For example, high-powered laser diode pumps are commonly cooled with chilling plates made of highly thermally conductive material such as copper (Cu). This adds significant excess mass and volume to a laser system.

In mobile laser applications the key metrics also include volume, weight, and electrical-to-optical power conversion efficiency (PCE). Industrial diode lasers typically weigh more than 1 kg/kW (kilograms/kilowatt) of power output, and have volumes that are greater than twice what would be acceptable for mobile High Energy Laser (TEEL) applications. Furthermore, industrial diode lasers typically have a PCE of approximately 50% whereas mobile HEL applications require a PCE above 55%. So there is a need for laser diode pumps that are optimized for size, weight, and power efficiency (SWAP) in addition to price-per-bright-watts and reliability.

Directed (laser) energy continues to offer promise as the Department of Defense (DOD) encounters new asymmetric and disruptive threats as well as increasingly sophisticated traditional challenges. Recent advances in electrically-based solid-state and, especially, optical fiber lasers have shown improved power levels and efficiency, paving the way towards deployable >100 kW class high energy lasers. However, for many DoD applications, size, weight and power (SWAP) consumption are still too large.

SUMMARY

Disclosed herein are Low Size Weight and Power efficient (SWAP) Laser Diode pump modules and High Power Fiber Amplifiers (HPFA) incorporating such pump modules for amplifying laser light produced by a seed laser.

Included in the disclosure herein is a laser assembly comprising a plurality H of distinct, spaced-apart heatsinks for mounting a respective plurality of distinct, spaced apart laser diodes. The heatsinks have respective diode mounting members, and the diode mounting members have respective attachment surfaces for receiving respective laser diodes. The laser assembly also comprises a carrier having a plurality M of fluid coolant flow channels for conducting a coolant from an inlet of the carrier, through the carrier, to an outlet of the carrier. Each of the channels is configured to conduct the coolant past a predetermined number N of the heatsinks in series, where M multiplied by N equals H, and where, for a given coolant and a given rate of heat generation by the laser diodes, a coolant mass flow rate F of the coolant through the carrier, a coolant pressure drop P of the coolant across the carrier, and a steady state temperature T of the laser diodes, depends on the combination of M and N. This allows for selecting M and N to vary the combinations of the variables F, P and T uniquely and significantly, and thereby allowing for optimizing said variables for a particular application.

Optionally, the heatsinks may each have respective sets of cooling members disposed opposite the respective attachment surfaces and extending away therefrom into a respective one of the coolant flow channels so as to provide for coolant flowing therethrough.

Optionally, the heatsinks may be arranged in an integer number R of substantially parallel rows of the heatsinks, and the rows define an integer number C of substantially parallel columns of the heatsinks. In an embodiment shown in FIGS. 15B-16F, R=2 and C=15.

As examples corresponding to embodiments where R=2 and C=15, M may be 15 and N may be 2; or M may be 3 and N may be 10.

Optionally, the number of laser diodes may equal the number H of heatsinks.

Optionally, where the laser diodes emit respective laser diode beams, the laser assembly may further comprise a laser diode beam multiplexer for multiplexing the laser diode beams to produce a single laser module output beam.

Optionally, where the laser assembly includes a laser diode beam multiplexer, and where R=2, the laser diode beams of the lasers of one of the rows may point inwardly toward the other row, the laser assembly may further comprise a plurality of mirrors, and each of the laser diode beams may be redirected by a respective one of the mirrors toward the multiplexer.

Optionally, the multiplexer may comprise a cross-polarization beam combiner for producing the laser module output beam.

Optionally, where the laser module output beam defines a first pump beam, the laser assembly may further comprise a seed laser signal source, a signal source laser preamplifier for producing a pre-amplified laser signal source, a combiner for combining the first pump beam with the pre-amplified laser signal source, and a power laser amplifier for receiving the combined first pump beam and pre-amplified laser signal source for amplifying the pre-amplified laser signal source in response to the first pump beam.

Optionally, the laser assembly may further comprise one or more additional laser assemblies for producing respective additional pump beams, where the combiner is configured for combining the additional pump beams with the first pump beam.

Also disclosed is a method for configuring a laser diode package for forced fluid cooling. The method comprises providing a plurality H of distinct, spaced-apart heatsinks for mounting a respective plurality of distinct, spaced apart laser diodes, the heatsinks having respective diode mounting members having respective attachment surfaces for receiving respective laser diodes.

The method further comprises providing a carrier having a plurality M of fluid coolant flow channels for conducting a coolant from an inlet of the carrier, through the carrier, to an outlet of the carrier, each of the channels being configured to conduct the coolant past a predetermined number N of the heatsinks in series, wherein M multiplied by N equals H.

The method still further comprises selecting a desired combination of environmental variables F, P, and T, where, for a given coolant and a given rate of heat generation by the laser diodes, F is a coolant mass flow rate through the carrier, P is a coolant pressure drop of the coolant across the carrier, and T is a steady state temperature of the laser diodes.

The method yet further comprises selecting a combination of M and N so as to most closely achieve the desired combination.

Another method is disclosed for configuring a laser fiber amplifier for forced fluid cooling. The method comprises providing a plurality of carriers for mounting respective pluralities of laser diodes, each carrier having one or more cooling channels for conducting a coolant from an inlet of the carrier, through the carrier, to an outlet of the carrier, for cooling the laser diodes.

The method further comprises either or both of (A), selecting a desired coolant pressure drop P across the amplifier for a given coolant mass flow rate through the amplifier, and (B), selecting a desired coolant mass flow rate F through the amplifier for a given coolant pressure drop across the amplifier.

The method still further comprises plumbing the inlets and outlets of the carriers together in a selected combination of parallel and series connections that achieve either or both of (A), a real coolant pressure drop across the amplifier, at the given coolant mass flow rate, that most closely matches the desired coolant pressure drop P, and (B), a real coolant mass flow rate through the amplifier, for the given coolant pressure drop, that most closely matches the desired coolant mass flow rate F.

It is to be understood that this summary is provided as a means of generally determining what follows in the drawings and detailed description, and is not intended to limit the scope of the invention. Objects, features, and advantages of the invention will be readily understood upon consideration of the following detailed description taken in conjunction with the accompanying drawings.

BRIEF DESCRIPTION OF DRAWINGS

The accompanying drawings, wherein like reference numerals represent like elements, are incorporated in and constitute a part of this specification.

FIG. 1A is a partially exploded isometric view of an embodiment of a laser diode package according to the invention.

FIG. 1B is a partially exploded isometric view of the laser diode package of FIG. 1A, from the opposite side of that shown in FIG. 1A.

FIG. 9A is a cross-sectional side view of the LSLD pump of FIG. 6A.

FIG. 9B is an exploded cross-sectional side view of the LSLD pump of FIG. 9A.

FIG. 18A is an isometric top view of an HPFA amplifier employing six conductively cooled laser diode packages according to the present invention.

FIG. 19A is an isometric top view of an HPFA amplifier employing four fluid cooled LSLD pumps according to the invention.

DETAILED DESCRIPTION

Figure 1C:
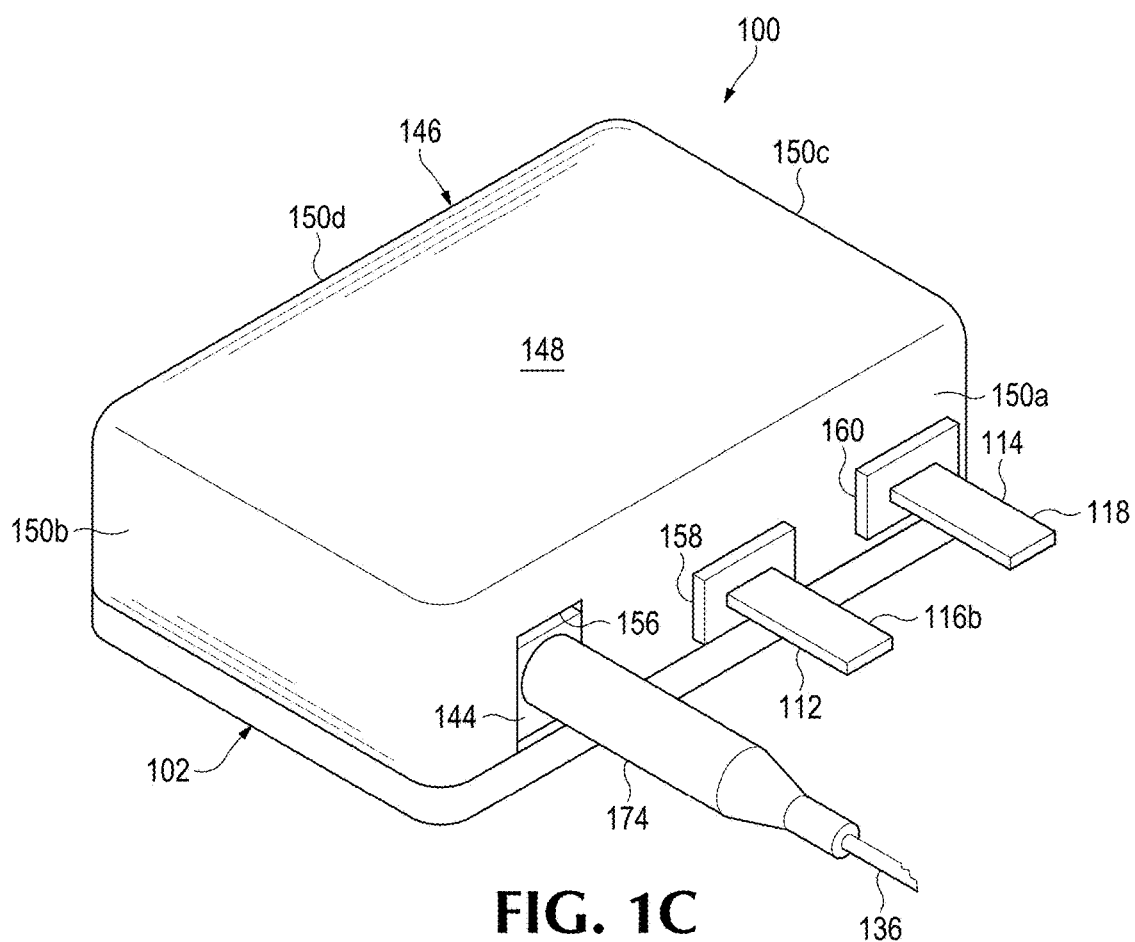
FIG. 1C is an isometric view of the laser diode package of FIGS. 1A-1B.

As used herein throughout this disclosure and in the claims, the singular forms "a," "an," and "the" include the plural forms unless the context clearly dictates otherwise. Additionally, the terms "includes" means "comprises." Further, the term "coupled" does not exclude the presence of intermediate elements between the coupled items. Still further, the terms "modify" and "adjust" are used interchangeably to mean "alter."

The systems, apparatuses, and methods described herein should not be construed as limiting in any way. Instead, the present disclosure is directed to all novel and non-obvious features and aspects of the various disclosed embodiments, alone and in various combinations and sub-combinations with one another. The disclosed systems, apparatuses, and methods are not limited to any specific aspect or feature or combinations thereof, nor do the disclosed systems, apparatuses, and methods require that any one or more specific advantages be present or problems be solved. Any theories of operation are to facilitate explanation, but the disclosed systems, apparatuses, and methods are not limited to such theories of operation.

Although operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged, or performed concurrently. Moreover, for sake of simplicity, the attached figures may not show the various ways in which the disclosed systems, apparatuses, and methods can be used in conjunction with other systems, apparatuses, and methods. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest," "best," "minimum," or the like. It will be appreciated that such descriptions are intended to indicate that a selection among many functional alternatives can be made, and such selections need not be better, smaller, or otherwise preferable to other selections. Examples may also be described with reference to directions indicated as "above," "below," "upper," "lower," or the like. These terms are used for convenient description, but do not imply any particular spatial orientation.

Herein throughout the following disclosure lists examples of various elements, materials, structures, features, or the like or any combination thereof are provided. While these lists are representative of the types of elements, materials, structures, features, or the like or any combination thereof various examples may comprise, the lists are not intended to be exhaustive and are merely intended to elucidate the disclosed technology and claimed subject matter is not limited in this regard.

Laser diodes generally produce optical radiation at wavelengths of between about 100 nanometers (nm) and 10 micrometers ($\mu$m), and typically between about 500 nm and 2 $\mu$m. Examples provided herein based on available laser diode sources and optical fibers generally are associated with wavelengths of between about 800-1700 nm. In some examples, propagating optical radiation is referred to as one or more beams having diameters, asymmetric fast and slow axes, beam cross-sectional areas, and beam divergences that can depend on beam wavelength and the optical systems used for beam shaping. For convenience optical radiation is referred to as light in some examples, but need not be at visible wavelengths.

Typical laser diodes have emission regions having non-circular cross-sections. An emission region of a laser diode can be associated with a slow axis that is directed along a longest dimension of the emission region and a fast axis that is directed along a shortest dimension of the emission region. Along the slow axis, an emitted beam tends to have a smaller angular divergence than the angular divergence along the fast axis. In addition, the slow axis tends to be associated with beam propagation in more transverse modes than beam propagation in the fast axis, so that a beam parameter product (corresponding to a product of an angular divergence and a beam dimension) measured along the slow axis is larger than that measured along the fast axis. Beam divergence and diameters along the slow axis, the fast axis, or both can be adjusted with one or more lenses, prisms, or mirrors to provide selected beam characteristics.

Representative embodiments are described with reference to optical fibers, but other types of optical waveguides can be used having square, rectangular, polygonal, oval, elliptical or other cross-sections. Optical fibers are typically formed of silica (glass) that is doped (or undoped) so as to provide predetermined refractive indices or refractive index differences. In some examples, fibers or other waveguides are formed of other materials, such as fluorozirconates, fluoroaluminates, fluoride or phosphate glasses, chalcogenide glasses, or crystalline materials such as sapphire, depending on desired wavelength. Refractive indices of silica and fluoride glasses are typically about 1.5, but refractive indices of other materials such as chalcogenides can be 3 or more. In still other examples, optical fibers can be formed in part of plastics. In typical examples, a doped waveguide core such as a fiber core provides optical gain in response to pumping, and core and claddings are approximately concentric. In other examples, one or more of the core and claddings are decentered, and in some examples, core and cladding orientation and/or displacement vary along a waveguide length.

As used herein, numerical aperture (NA) refers to a largest angle of incidence with respect to a propagation axis defined by an optical waveguide for which propagating optical radiation is substantially confined. In optical fibers, fiber cores and fiber claddings can have associated numerical apertures, typically defined by refractive index differences between a core and cladding layer, or adjacent cladding layers, respectively. While optical radiation propagating at such numerical apertures is generally well confined, associated electromagnetic fields such as evanescent fields typically extend into an adjacent cladding layer. In some examples, a core NA is associated with a core/inner cladding refractive index difference, and a cladding NA is associated with an inner cladding/outer cladding refractive index difference. For an optical fiber having a core and a cladding, a fiber core NA is equal to the square root of the square of the core refractive index minus the square of the cladding refractive index. For an optical fiber having an inner core and an outer core adjacent the inner core, a core NA is equal to the square root of the square of the refractive index of the inner core minus the square of the refractive index of the outer core. Optical beams as discussed above can also be referred to as having a beam NA which is associated with a beam angular radius. While multi-core step index fibers are described below, gradient index designs can also be used.

In the examples disclosed herein, a waveguide core such as an optical fiber core is doped with a rare earth element such as Nd, Yb, Ho, Er, or other active dopants or combinations thereof. Such actively doped cores can provide optical gain in response to optical or other pumping. As disclosed below, waveguides having such active dopants can be used to form optical amplifiers, or, if provided with suitable optical feedback such as reflective layers, mirrors, Bragg gratings, or other feedback mechanisms, such waveguides can generate laser emissions. Optical pump radiation can be arranged to co-propagate and/or counter-propagate in the waveguide with respect to a propagation direction of an emitted laser beam or an amplified beam.

The beam brightness is used herein to refer to optical beam power per unit area per solid angle. In some examples, optical beam power is provided with one or more laser diodes that produce beams whose solid angles are proportional to beam wavelength and inversely proportional to beam area. Selection of beam area and beam solid angle can produce pump beams that couple selected pump beam powers into one or more core or cladding layers of double, triple, or other single or multi-clad optical fibers. Beam cross-sectional areas, diameters, or other beam dimensions can be described using boundaries that generally correspond to a zero intensity value, a $1/e$ value, a $1/e^2$ value, a full-width half-maximum (FWHM) value, or other suitable metric.

Optical beams and optical elements are described in some examples with respect to one or more axes. Typically, an axis includes one or more straight line segments along which an optical beam propagates or along which one or more optical elements are situated. Such axes can be bent or folded with reflective surfaces, so that axes need not be single straight line segments. Various lenses are described or may be used, including convex-convex, planoconvex, concave-concave, planoconcave, cylindrical, Fresnel, zone plates, holographic, spherical, aspheric, and/or combinations thereof. In some examples, cylindrical lenses have cylindrical surfaces that are arranged perpendicular to each other to provide a cross-cylinder or crossed-cylinder lens or lens assembly. In typical examples, planoconvex cylindrical lenses have a plane surface and a cylindrically convex surface that defines local axes that can be parallel to or collinear with an axial center of curvature associated with the cylindrically convex surface. Beams are typically incident to such lenses parallel to an optical axis that is perpendicular to the plano surface. Such beams tend to focus along an axis (e.g., slow axis, fast axis) perpendicular to the focal axes and optical axis, and collimated beams tend to be brought to focus with respect to that axis at the focal axis. It will be appreciated that focal axes can be other than straight depending on the characteristics of the lens. In some cross-cylinder examples, a first and second objective are spaced apart along an optical axis and provide a set of corresponding focal axes which are perpendicular to each other and intersect each other at a focal plane.

In various embodiments, optical components, such as lenses, mounts, housings, etc., are registered to other optical components. Surfaces of two or more optical components can be registered so as to align the corresponding optical components or to align other optical components or beams. Such registration and alignment can occur axially or transversely or in other ways suitable to provide corresponding alignment of optical components and beams. The term "surface" is used in connection with registering optical components, and it will be appreciated that surfaces can include other features, including edges, planes, threads, serrations, textures, chamfers, notches, detents, clamping members, etc., and that such surfaces can be arranged in orientations other than parallel or perpendicular to different features of optical components.

Laser diode package examples typically provide a housing to conduct heat out of the package (e.g., through a housing base), provide a protective enclosure from the external environment for the optics, lasers, and other components, and provide a mechanically stable platform for optical and substructure attachment that will maintain internal optical alignments through use, provide electrical feedthroughs of sufficient current handling, and optical feedthroughs of sufficient size, and provide fastening locations for attaching (e.g., with screws or clamps) the housing to a rigid support that will then ally conduct heat away from the base of the laser package housing. Packages with a rigid sidewall consisting of Kovar or cold rolled steel, or copper (Cu), with a copper or copper/moly or copper/tungsten base, and copper or copper-cored leads within a ceramic or glass feedthrough, can provide the corresponding heat transfer. A separate lid is later attached via welding, solder, or epoxy, and the optical feedthrough port that is typically a part of the optical train is attached to a sidewall of the package, and not to the baseplate. Such configurations are susceptible to optic or fiber movement with the sidewalls of the package, which are mechanically removed from the laser/optics typically attached to the base of the package. Additionally, during fabrication and brazing or firing of the electrical pins to the sidewall, the materials in the base, typically copper or an alloy of copper, anneal during the firing process, causing the base to become soft and easily deformed. Holes used to screw down packages will often result in a slightly defoinied base surface, causing a non-flat base on the package. Subsequent attachment of the package to other surfaces will result in a gap between the package and the mounting surface, reducing thermal transfer, increasing operating temperature of laser diodes within the package, and reducing reliability or varying laser wavelength outside of acceptable tolerance for particular applications.

To mitigate the aforementioned problems, very thick baseplates can be used along with harder but less thermally conductive materials (aluminum, copper/moly, or copper tungsten), or very thin mounting tabs that deform independent of the package, but provide little downward pressure across the package, especially in larger packages (greater than 1 cm square).

In typical examples, an entire interior surface of the laser diode package and electrical pins is gold plated to provide solderability for various diode package components, but the gold plating can be applied to some surfaces unnecessarily, such as side surfaces, thereby wasting gold material and increasing costs. As the package housings increase in size, the packages become prohibitively expensive and heavy, which increases cost, decreases suitability for various low-weight applications, and increases susceptibility to stress and handling damage. Multiple pins or large pins are needed for larger currents, but the connectors typically needed are relatively expensive.

A base can be selected that is formed of a material with acceptably high thermal conductivity (often Cu or CuW), and mated to sidewalls formed of a less thermally conductive, but more dimensionally stable material (such as an alloy like Kovar, or a less expensive stainless steel alloy), with the mating performed via a relatively high temperature soldering or brazing process. The high temperature process significantly softens the material used in the baseplate. Additionally, the electrical connectors (usually Cu or Cu alloy conductor with a glass or ceramic insulator) are mounted through the sidewall of the package by use of a high temperature process which can further soften the baseplate material. A base can also be selected where the base and the sidewalls are made from the same material (usually having a sufficiently high thermal conductivity which is balanced with the needs for dimensional stability), and the center of the package is machined away in a "bathtub-like" configuration having a monolithic structure. Although this process foregoes the high temperature brazing process to attach the sidewalls, the electrical connectors and insulators are inserted into the sidewalls and secured with a high temperature brazing process, and therefore the package material is again softened. A large amount of machining with complex tolerances is required and a larger surface area must be plated. A lid can be stamped or machined as a flat "plate" which is attached via an adhesive, mechanical clamping, welding or soldering.

In a representative example of the disclosed technology herein, a laser diode package platform provides a rigid base that has a high thermal conductivity and high hardness throughout package fabrication and processing, resulting in a robust, lower cost laser diode package than would otherwise be achievable. A non-annealed copper (¼, half, ¾, or full hard) or copper alloy baseplate with machined features for optical mounting and having a flat base is plated for solderability (e.g., with gold). The package sidewalls do not continuously extend from the base and are not otherwise attached nor is the lid, but instead a deep-drawn lid member that includes the sidewalls is installed after assembly of the internal components of the laser diode package is complete or nearly complete. This approach significantly reduces laser diode package cost and provides an open platform that addresses difficulties associated with manufacturing in a "box" design.

Instead of glass or ceramic feedthroughs attached to the package sidewalls, electrical leads may be attached via soldering to the base with a ceramic standoff or similar feature. In typical examples, the electrical leads are flat, but could be other shapes as well. The electrical leads provide an internal electrical surface for wirebonding or other contact to internal electrical traces, and separate stresses from the leads to the wires. The lid member may be attached during the last stages of assembly, and brought over the electrical leads via openings in one or more walls of the shell. A gap between the lid member and the protruding electrical leads may be filled with an insulator of ceramic, glass, high temperature plastic, or other non-electrically conductive material. In typical examples, the insulator provides light blockage and additional mechanical integrity to the lead/post assembly during customer handling. The lid member is then screwed, epoxied, soldered, or welded to the baseplate.

A thermal expansion and contraction of the lid and base is controlled through epoxy flexibility and/or mechanical slippage so as to inhibit deformation of the base or lid, yet maintain package and internal component integrity and alignment and to provide a seal against light leakage. In typical examples, package sidewalls and a package lid are integrated into one part, and feedthroughs are mounted to the package independent of the lid and sidewalls. Baseplate hardness can be retained throughout attachment of the ceramic post and electrical leads, which can be accomplished with soldering processes at a temperature below 350 degrees centigrade (C).

Herein, annealing generally refers to thermal processing, typically in metals, that increases grain size and softens the annealed material. Brazing generally refers to processes involving a filler metals having a liquidus above 450 degrees C.; whereas soldering generally refers to processes involving a filler metals with a liquidus below 450 degrees C. Soldering usually results in a lower strength attachment as compared to brazing. Low temperature soldering generally refers to soldering processes where the solder is liquidus at temperatures at or below 200 degrees C. High temperature soldering processes typically occur above 350 degrees C.

In representative examples herein, the baseplate is fabricated (machined, molded, cast, or stamped) from a simple plate structure of sufficiently thermally conductive material (such as Cu or a CU alloy). Because the baseplate does not undergo high temperature processing during package fabrication, the baseplate and package retain an original integrity, and experience substantially reduced surface warping (e.g., less than or equal to 50 μm, 30 μm, 10 μm, or 5 μm across a baseplate footprint), and therefore result in a more robust and reliable package product. Additionally, because the baseplate is simpler to manufacture (shorter manufacturing time, fewer critical dimensions, no high temperature processes, and reduced surface area to plate), manufacturing costs are substantially reduced. The electrical connections and standoffs may be attached to the baseplate via a (relatively) low temperature soldering process, which can be similar to soldering processes used to attach one or more other components to the baseplate.

To form the sidewalls of the package, a lid member can be inexpensively stamped from an acceptable material (e.g., an aluminum alloy) to form an upside down bathtub-like structure that is placed over the baseplate. The lid member can be attached in a manner where the differences in dimensional stability between the lid member and the baseplate do not result in the application of stresses by the lid member to the baseplate that could compromise the function or reliability of the laser package. The lid member can be secured to the baseplate with an adhesive so as to limit or reduce the amount of heat and/or stress applied to the baseplate. In additional examples, other securing mechanisms can be used, such as fasteners (e.g., screws) or a low temperature soldering process. The cross-section of the electrically conductive pins can be varied in accordance with current requirements of the diode package, allowing high power/ current operation without sacrificing reliability. Also, by removing the package sidewalls that are typically situated so that beams emitted by the laser diodes would be blocked, the baseplate provides a platform for independent modular units of laser diode assemblies to be added so as to scale output power of the package. For example, by placing the modular units within close proximity to each other, the output of each modular unit can be combined into a single afocal or fiber coupled output by polarization, wavelength, or geometrically multiplexing the laser beams from the multiple modular units in the laser diode package.

In FIGS. 1A-1C, an example of a laser diode package 100 is shown that includes a base member 102 having a base member surface 103 on which a plurality of laser diode assemblies 104a, 104b are secured to respective carrier plates 106a, 106b. A pair of electrode standoffs 108, 110 are also secured to the base member 102 and a pair of corresponding electrical leads 112, 114 are secured to the respective standoffs 108, 110 at first ends 116a, 118a of the electrical leads, with the electrical leads 112, 114 extending past the footprint of the base member 102, so that opposite, second ends 116b, 118b of the electrical leads are situated outside of the laser diode package 100. The first ends 116a, 118a of the electrical leads 112, 114 are situated proximate a plurality of laser diodes 120a-120d of the laser diode assemblies 104a, 104b so that laser diodes 120a-120d can be electrically coupled to the electrical leads 112, 114 (e.g., through wire-bonding in a series relationship) to receive electrical current and to emit corresponding laser diode beams. The second ends 116b, 118b of the electrical leads are coupled to an electrical source (not shown) to provide the current for the laser diodes 120a-120d.

The laser diode assemblies 104a, 104b further include fast axis collimators 122a-122d and slow axis collimators 124a-124d that are situated to receive the laser diode beams emitted from the respective laser diodes 120a-120d and to collimate the beams along respective fast axis divergence axes 126 and slow axis divergence axes 128. The collimated beams are received by respective turning mirrors 130a-130d and turned so that the beams are stacked with the slow axes parallel to each other and the fast axes aligned to form a beam stack that is directed to focusing optics 132 that optically couple the beams into an endface 134 of an optical fiber 136. The endface 134 is situated in an optical output terminal 138. An exterior portion 144 of the optical output terminal 138 is aligned with an edge of the base member 102. In typical examples, the laser diodes 120a-120d emit beams with maximum average optical powers in the range of 10-25 watts (W). The quantity of laser diode assemblies, laser diodes per assembly, and acceptance characteristics of the optical fiber 136 vary so that the total power of the combined beam stack coupled into the optical fiber 136 is in the range of 40-300 W for different embodiments.

The laser diode package 100 also includes a lid member 146 that can be a singular, or monolithic, deep-drawn part having a lid portion 148 that defines a top of the laser diode package 100 and having a plurality of side portions 150a-150d that continuously extend from the lid portion 148 so as to define sidewalls of the laser diode package 100. The side portion 150a includes openings 152, 154, 156. In some examples, a single opening can be defined on a selected side portion and in other examples, different openings can be defined on different selected side portions. The positions of the openings 154 and 156 in the side portion 150a respectively correspond to the electrical leads 112, 114 extending outside the laser diode package 100 when the lid member 146 is situated over the base member 102 to enclose the laser diode package 100. The position of the opening 152 corresponds to the exterior portion 144 of the optical output terminal 138 so that the optical output terminal 138 is enclosed with the lid member 146 situated over the base member 102. With the plurality of laser diode assemblies 104a, 104b, electrode standoffs 108, 110 with secured electrical leads 112, 114, and optical output terminal 138 secured to the base member 102, the lid member 146 is inserted over the second ends 116b, 118b of the electrical leads 112, 114 at the openings 152, 154 and brought in position over the footprint of the base member 102 to enclose the laser diode package 100.

A pair of insulating grommets 158, 160 include respective grommet openings 162, 164 shaped to correspond with a cross-section of the electrical leads 112, 114. With the lid member 146 situated over the base member 102, the grommets 158, 160 are inserted over the electrical leads 112, 114 through the grommet openings 162, 164 and positioned at the openings 152, 154. The grommets 158, 160 may include interior grommet portions 166, 168 that bridge at least a portion of a gap between the respective electrical leads 112, 114 and side portion 150a across the openings 152, 154. In some examples, outer surfaces 170, 172 of the interior grommet portions 166, 168 contact the side portion 150a. In further examples, adhesive secures the outer surfaces 170, 172 to the side portion 150a. The grommets 158, 160 insulate the electrical leads 112, 114 conducting the current powering the laser diodes 120a-120d from the lid member 146, the latter which can be formed of various electrically conductive or non-electrically conductive material types, including copper and aluminum. Suitable electrically insulating materials include high temperature ceramics, resins, and polymers. In some examples, the grommets 158, 160 are a fluid material that can be flowed around the electrical leads 112, 114 inserted through the openings 152, 154 and cured with the lid member 146 in position over the base member 102 forming a tight insulating seal. The size difference between the openings 152, 154 and the cross-sections of the electrical leads 112, 114 allows the lid member 146 to be positioned at an angle as the side portion 150a slides in relation to the electrical leads 112, 114 to enclose the base member 102 so as to provide clearance between the laser diode assemblies 104a, 104b and the side portion 150c.

FIG. 1C shows the laser diode package 100 with the lid member 146 secured over the base member 102 and with grommets 158, 160 secured in place over the electrical leads 112, 114.

In typical examples, as the openings 152, 154 of the lid member 146 translate along the electrical leads 112, 114, the opening 156 can translate along a fiber termination 174. The opening 156 is open ended so that the opening 156 extends to an edge of the side portion 150a allowing for clearance for the optical fiber 136 and for positioning the lid member 146 over the base member 102 while the optical fiber 136 is coupled to the optical output terminal 138. The opening 156 can form a close, snug, or interference fit with the exterior portion 144 of the optical output terminal 138. An epoxy or other adhesive can be used to secure any gap between the exterior portion 144 and the side portion 150a at the opening 156. In representative examples, the lid member 146 is secured to the base member 102 with an adhesive, such as a high temperature epoxy, along at least a portion of the region of contact between edges of the side portions 150a-150d and the surface 103 of the base member 102. In some examples, the adhesive is selectively applied to a middle region where the longer side portions 150a, 150c contact the surface 103. As the laser diode package 100 undergoes operational cycling, the selective adhesive application allows the base member 102 to be partially structurally uncoupled from the lid member 146 so that the base member 102 can expand or contract partly independently from the lid member 146.

In representative examples, the thickness of the lid member 146 is smaller than the thickness of the base member 102 as compared to a conventional thickness difference between package side and base members. In deep drawn lid member examples, the lid member 146 typically has a common thickness in the millimeter (mm) range, such as 0.5 mm, 1 mm, 2 mm, 5 mm, etc. The thickness of the base member 102 is typically measured from a bottom surface of the base member to the surface of contact with the lid member 146 enclosing the laser diode package 100. Such thicknesses are also typically in the millimeter range, such as 1 mm, 2 mm, 3 mm, 4 mm, 5 mm, or thicker. In examples where the thickness of the base member 102 is increased, the additional thickness enhances the rigidity and flexural strength of the base member 102 and corresponding resistance to deflection during construction of the laser diode package 100, and downstream implementation of the laser diode package 100 in larger systems or end-user applications. In general, the thickness difference also allows various other package variations, performance improvements, and cost reductions to be realized. For example, with the lid member 102 incorporating the package sides, typically with the lid portion 146 and side portions 150a-150d having a common thickness, a gold-plating can be applied to the base member 102 for component solderability without wasting application of the same material to the sides of the package.

As discussed above, in different embodiments the lid member 146 can be formed of aluminum, copper, or other materials. In some examples, the material of the lid member is different from the material of the base member 102. For example, the base member 102 can be formed of copper and the lid member 146 can be formed of aluminum. In some examples, the base member 102 and the lid member 146 can be different materials that have matched or non-matched coefficients of thermal expansion (CTE). In some examples, a reduced thickness of the lid member 146 relative to the base member 102 allows the side portions 150a-150d to strain during fabrication, installation, or operation and reduce a deflection of the base member 102 associated with the strain. As shown, in representative embodiments of the laser diode package 100, the electrical leads 112, 114 are secured to electrode standoffs 108, 110. This provides an advantageous alternative to brazing electrode pins to the sides of laser diode assemblies, as the firing of the pins to the sides anneals or softens the sides and any attached or monolithically/continuously formed baseplate which could result in warping the baseplate as discussed above. Additionally, by using the lid member 146, even with an increase in thickness of the base member 102, the overall weight of the laser diode package 100 may be reduced as compared to a housing that incorporates sidewalls into the baseplate.

Figure 2:
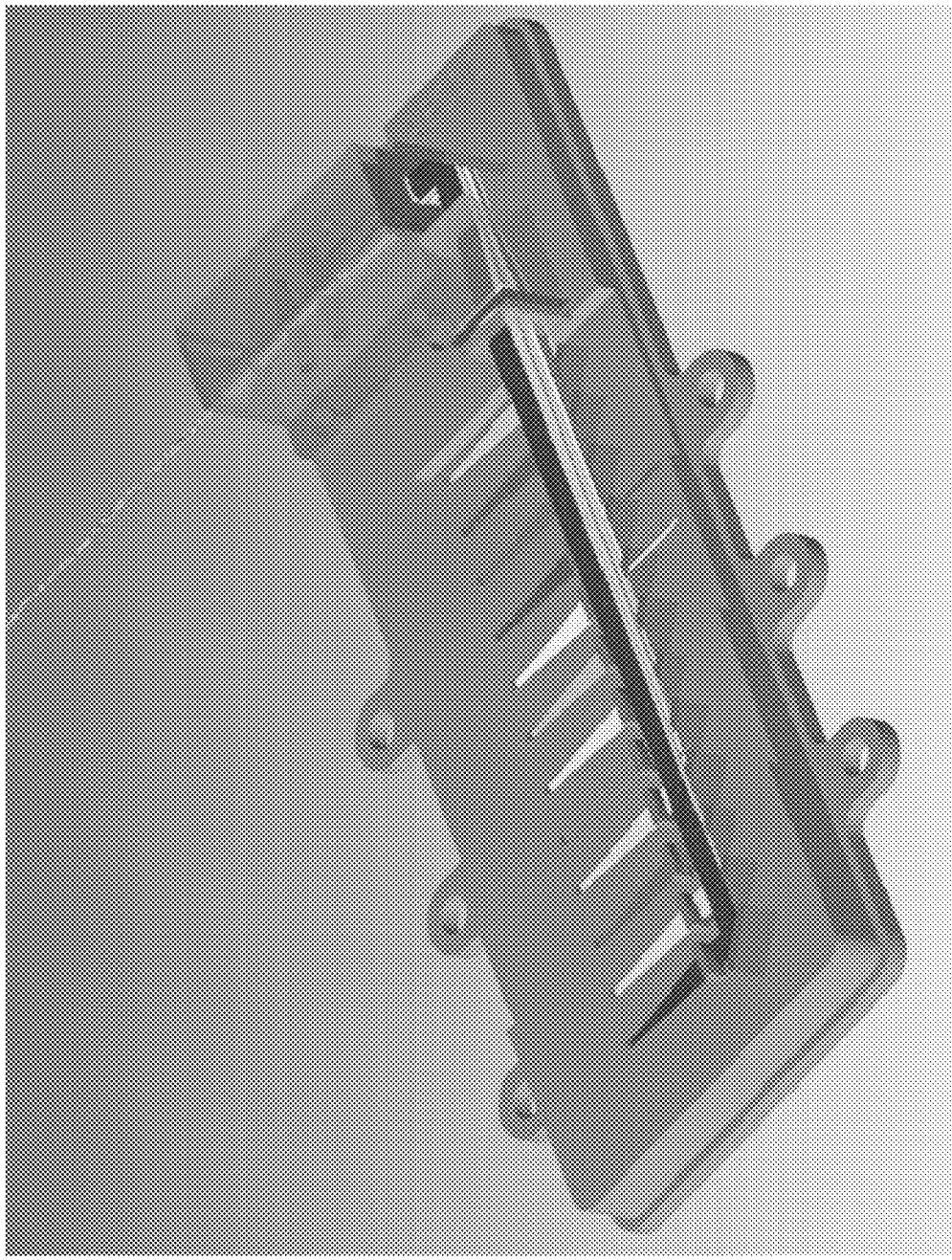
FIG. 2 shows a multiple diode laser beam ray trace for the laser diode package of FIGS. 1A-1C.

FIG. 2 shows a ray trace of laser beams emitted, combined, and coupled into an optical fiber corresponding to the laser diode package 100 shown in FIGS. 1A-1C. Laser beam wavelengths can vary based on diode materials, and are typically in the range of 700-1000 nm, though other wavelengths, including infrared and ultraviolet, are also possible. In particular examples, laser beam wavelengths center around 808 nm, 915 nm, or 976 nm, at a selected operating power and diode junction temperature.

Figure 3A:
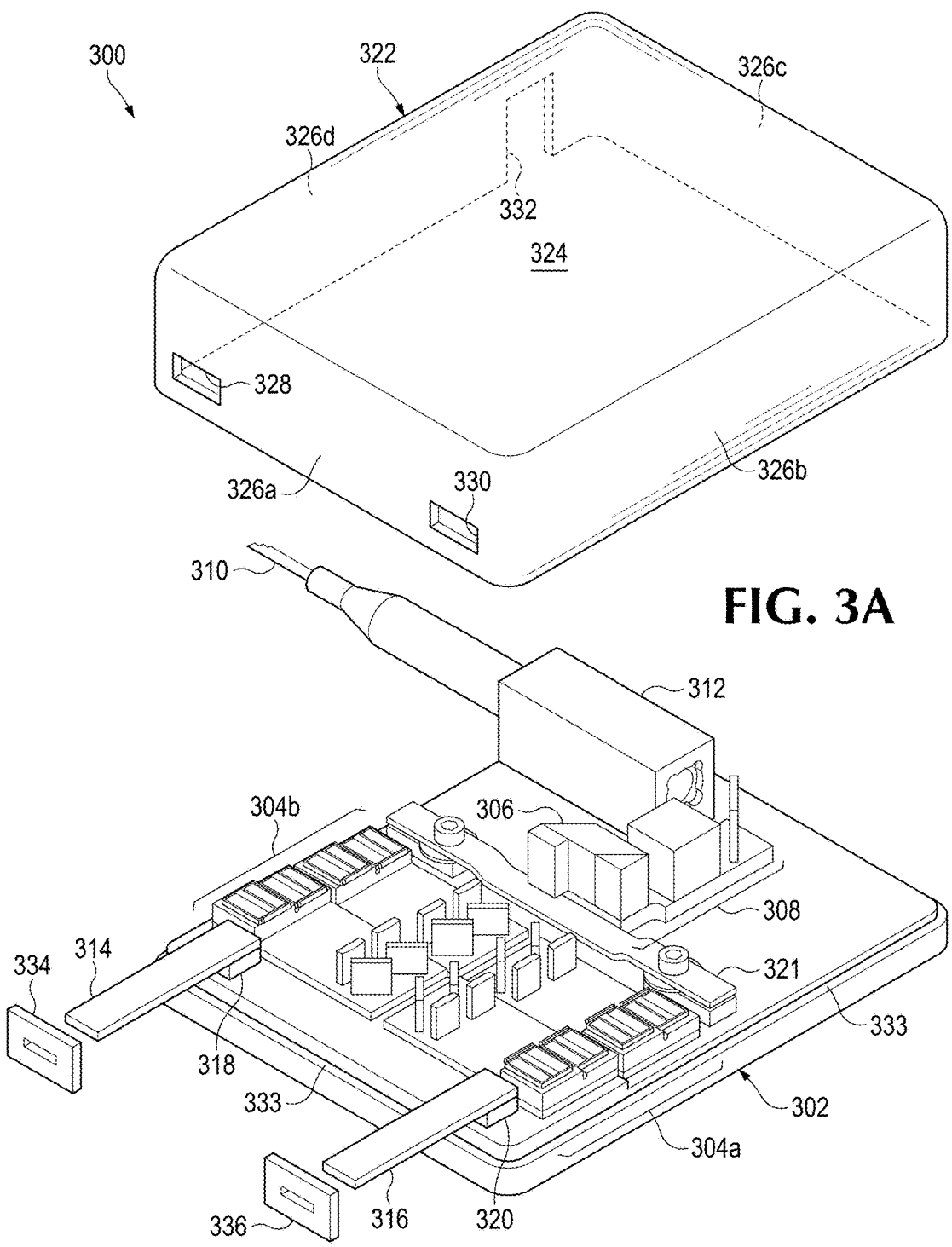
FIG. 3A is a partially exploded isometric view of a first alternative embodiment of a laser diode package according to the present invention.
Figure 3B:
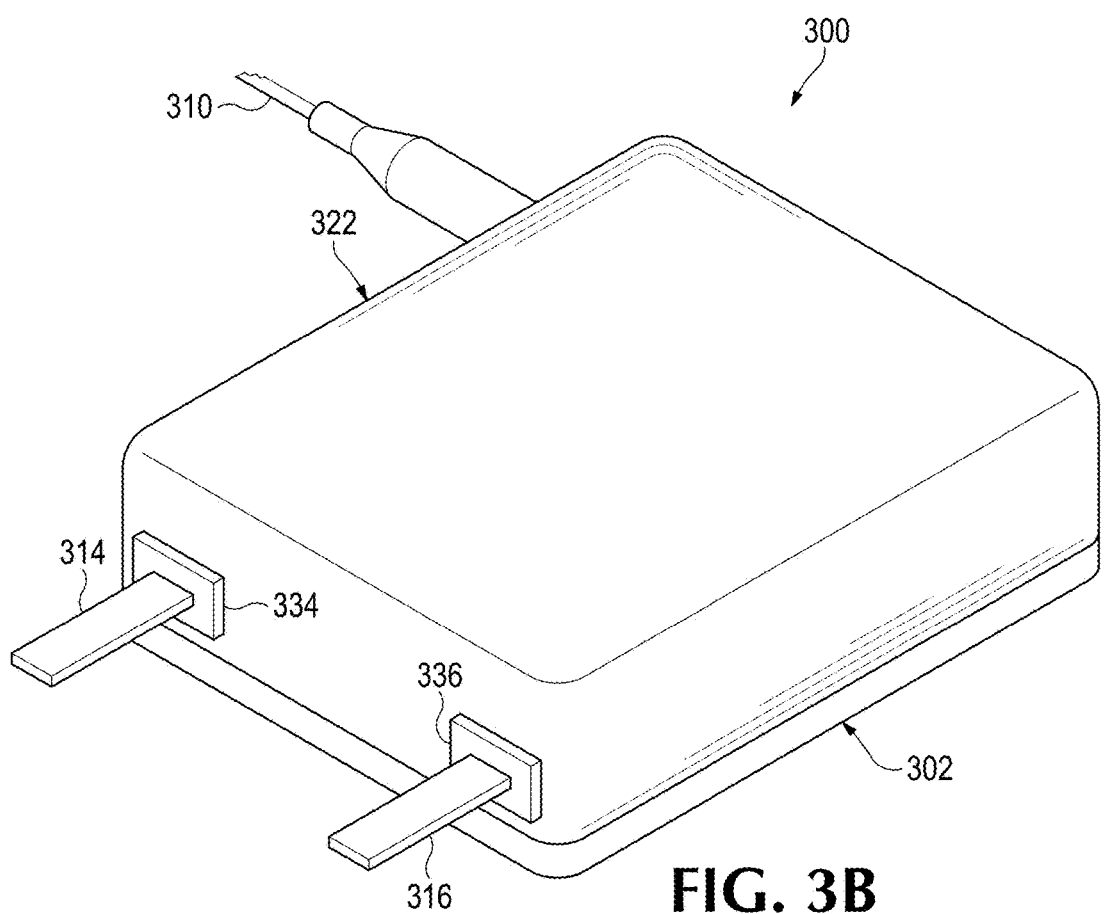
FIG. 3B is an isometric view of the laser diode package of FIG. 3A.

FIGS. 3A-3B illustrate another example of a laser diode package 300 that includes a base member 302 and a pair of laser diode assemblies 304a, 304b, each situated to emit a set of laser beams propagating along parallel propagation axes but in an opposite direction from the other, forming a pair of beam stacks. The beam stacks are received by a polarization multiplexer 306 that combines the beam stacks. Focusing optics 308 receive the combined beam stacks and couple the light into an optical fiber 310 which is in turn coupled to an optical output terminal 312. Electrical leads 314, 316 are secured to respective standoffs 318, 320 that are in turn secured to the base member 302. An internal bus bar 321 is secured to the base member 302 and provides an electrical path for completing a series circuit between the electrical lead 314 and the laser diode assembly 304a, and between the electrical lead 316 and the laser diode assembly 304b.

A lid member 322 includes a lid portion 324 defining a top of the laser diode package 300 and a plurality of side portions 326a-326d defining sidewalls of the laser diode package 300. The side portion 326a includes a pair of openings 328, 330 that are situated to receive the electrical leads 314, 316 so that the lid member 322 can be positioned over the base member 302 with the electrical leads 314, 316 secured to the standoffs 318, 320 and the base member 302. The side portion 326d includes an opening 332 that extends to an edge of the side portion 326d so that, as the lid member 322 is slidably engaging the electrical leads 314, 316, the lid member 322 can be lowered at the side portion 326c over the optical output terminal 312. The lid member 322 and base member 302 are secured together along at least a portion of a contact surface 333 so as to enclose the laser diode package 300. With the lid member 322 in position and contacting the base member 302, a pair of insulating grommets 334, 336 are inserted over the protruding electrical leads 314, 316 so as to surround the electrical leads 314, 316 in the openings 328, 330. The grommets 334, 336 are secured to the electrical leads 314, 316 and the side portion 326a.

Figure 4:
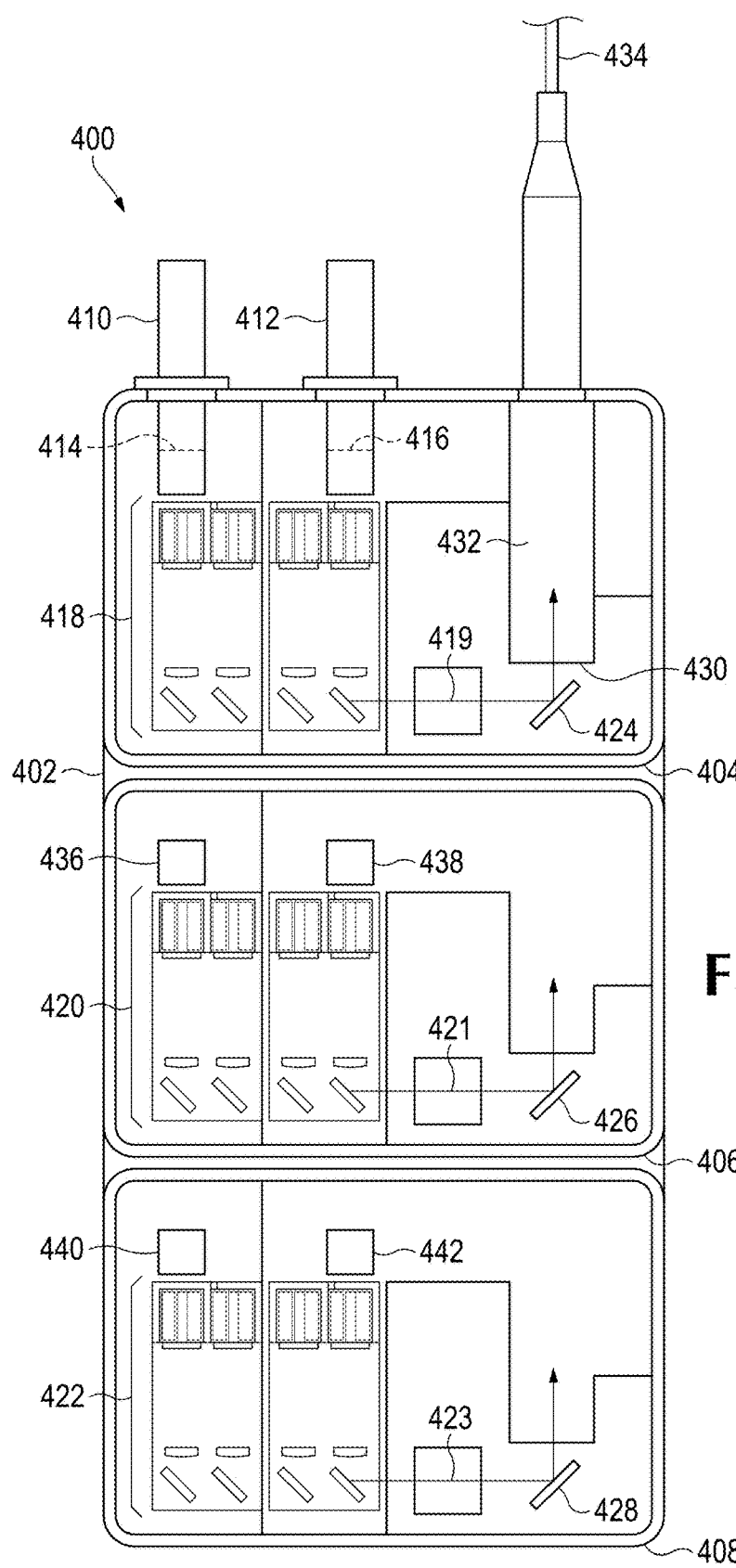
FIG. 4 is a plan view of an embodiment of a modular laser diode package according to the present invention.

FIG. 4 shows an example of a modular laser diode package 400 that has a base member 402 including three sub-members 404, 406, 408 that can have several substantially similar features that streamline manufacturability of different product categories and provide for scalability to different package output powers or other characteristics, such as numerical aperture. A pair of electrical leads 410, 412 extend outside the laser diode package 400 from standoffs 414, 416 secured to the sub-member 404. Each of the three sub-members 404, 406, 408 includes respective laser diode assemblies 418, 420, 422 situated to emit respective sets of laser diode beams directed into beam stacks 419, 421, 423. The beam stacks 419, 421, 423 are directed with turning mirrors 424, 426, 428 towards a focusing objective 430 situated in an optical output terminal 432 to become focused and coupled to an optical fiber 434. The beam stacks 419, 421, 423 can be combined in various ways. For example, one or more of the beam stacks 419, 421, 423 can be geometrically multiplexed so as to lie one above the other (i.e., in or out of the plane of FIG. 4) or side-by-side. Or, one or more of the beam stacks 419, 421, 423 can be polarization multiplexed with the turning mirrors 424, 426. In representative examples, one or more of the beam stacks 419, 421, 423 are emitted at different wavelengths, and the turning mirrors 424, 426 include dichroic coatings that pass or reflect the corresponding incident beam stacks 419, 421, 423.

In some examples, the sub-member 406 includes standoffs 436, 438 and the sub-member 408 includes standoffs 440, 442 that can be used to connect one or more internal conductive members to complete one or more circuits with the electrical leads 410, 412 and provide a current to the laser diode assemblies 416, 420, and 422.

In some examples, the electrical leads 410, 412 can be secured to the base member 402 at other locations. For example, a pair or multiple pairs of electrical leads can be coupled in from the left side of sub-members 404, 406, 408 in FIG. 4. The sub-members 404, 406, 408 are generally flat and without sidewalls that would obstruct beam stack propagation so that laser diode assemblies of various sizes and configurations can be provided and the footprint of the base member 402 can be modularly varied.

The laser diode packages 100, 300 and 400 rely on conductive heat transfer, through the respective base members, to a base plate that has not been shown for removing the heat generated by the laser diodes of the laser diode assemblies. It is desirable to remove this heat at a controlled rate, to maintain a controlled, steady state temperature of the laser diodes, for reliable and consistent operation thereof. It may be preferable to provide for active cooling of laser diode assemblies, and this possibility is contemplated herein as follows.

Figure 5:
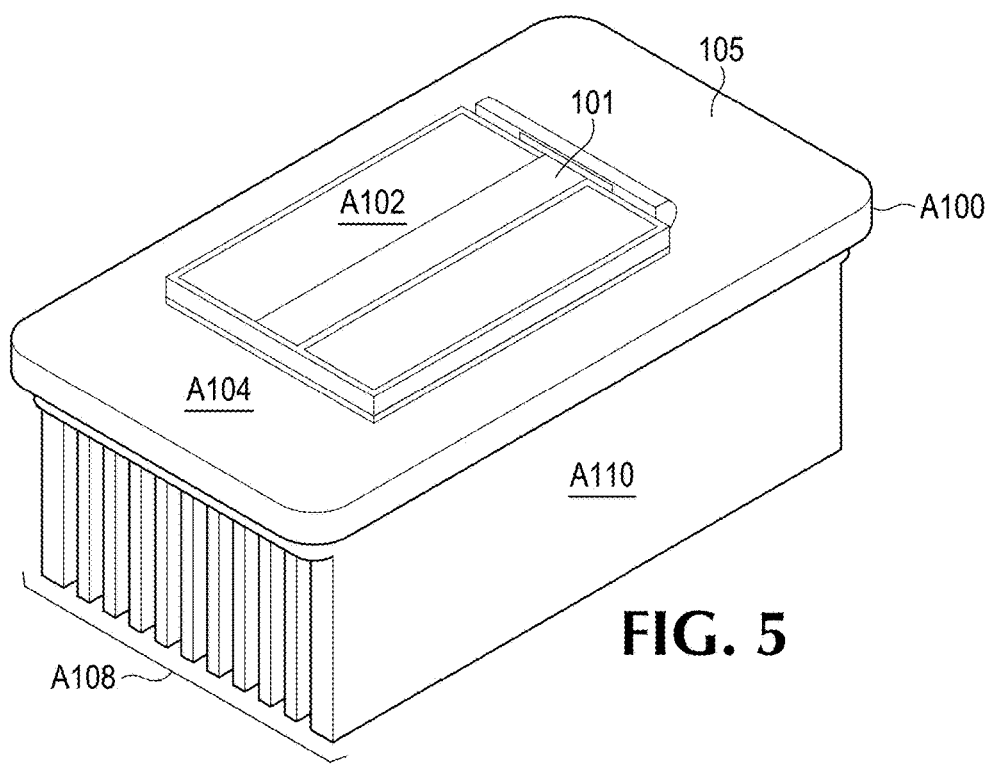
FIG. 5 illustrates an example of a Low SWAP Laser Diode (LSLD) assembly according to the present invention.

FIG. 5 illustrates an example of a low SWAP laser diode ("LSLD") assembly A100. LSLD assembly A100 comprises a laser diode 101 configured to generate a laser beam. Laser diode 101 is coupled to a submount A102 in a "Chip on Submount" (COS) formation. Submount A102 may be made of a variety of materials such as silicon carbide (SiC), chemical vapor deposition (CVD) diamond, copper (Cu), aluminum nitride (AlN), cubic boron nitride (c-BN), graphite, graphene, graphene-composites, carbon nanotubes, carbon nanotube composites, diamond or encapsulated pyrolytic graphite, or the like or any combinations thereof. It can be shown that there is an improvement in power and efficiency of laser diode 101 mounted on a SiC submount versus an AlN submount. Furthermore, a comparison of the junction temperature of laser diode 101 on a SiC submount versus CVD-diamond submount shows the CVD-diamond submount performs 25% better in thermal resistance.

In an example, submount A102 is coupled, through an attachment surface 105 of a heatsink A104, to the heatsink, for transferring heat generated by the laser diode 101 to the heatsink. Heatsink A104 may comprise any of a variety of materials such as aluminum silicon carbide (AlSiC), pyrolytic graphite, copper (Cu), aluminum (Al), or the like or any combinations thereof. Heatsink A104 may otherwise be fabricated out of something completely different from the conventional materials noted above.

Example heatsink A104 includes a plurality of cooling members A108 extending opposite the attachment surface 105 and extending away from the attachment surface. As depicted in FIG. 1, cooling members A108 comprise fins A110. In other examples, cooling members A108 can comprise any of a variety of structures having a high surface-to-volume ratio configured for efficient heat transfer. Such structures include fins, posts, pegs, structures having textured (e.g., dimpled) surfaces, or porous structures (e.g., graphite foam or micro-porous copper), structures constructed using additive manufacturing processes to optimize surface-to-volume ratio, or any combinations thereof. It is possible to reduce a conventional copper heatsink mass by 30%, for example, from a current 1.94 g (grams) to 1.4 g per heatsink. This may amount to greater than a 30% reduction in heatsink mass, and 0.27 g/W (grams/Watt) specific mass for the total package.

In an example, heatsink A104 may be fabricated by a variety of techniques known to those of ordinary skill in the art. One such technique may be computer numerical control (CNC) machining, for example. In another example, heatsink 104 may be fabricated by skiving or micro-skiving which allows introducing a large surface area to increase thermal transfer coefficient. In an example, wherein the cooling members 108 comprise fins, a range of thicknesses, gaps, and fin heights may be provided to optimize the thermal transfer coefficient, depending on the desired output power level and operating efficiency.

Figure 6A:
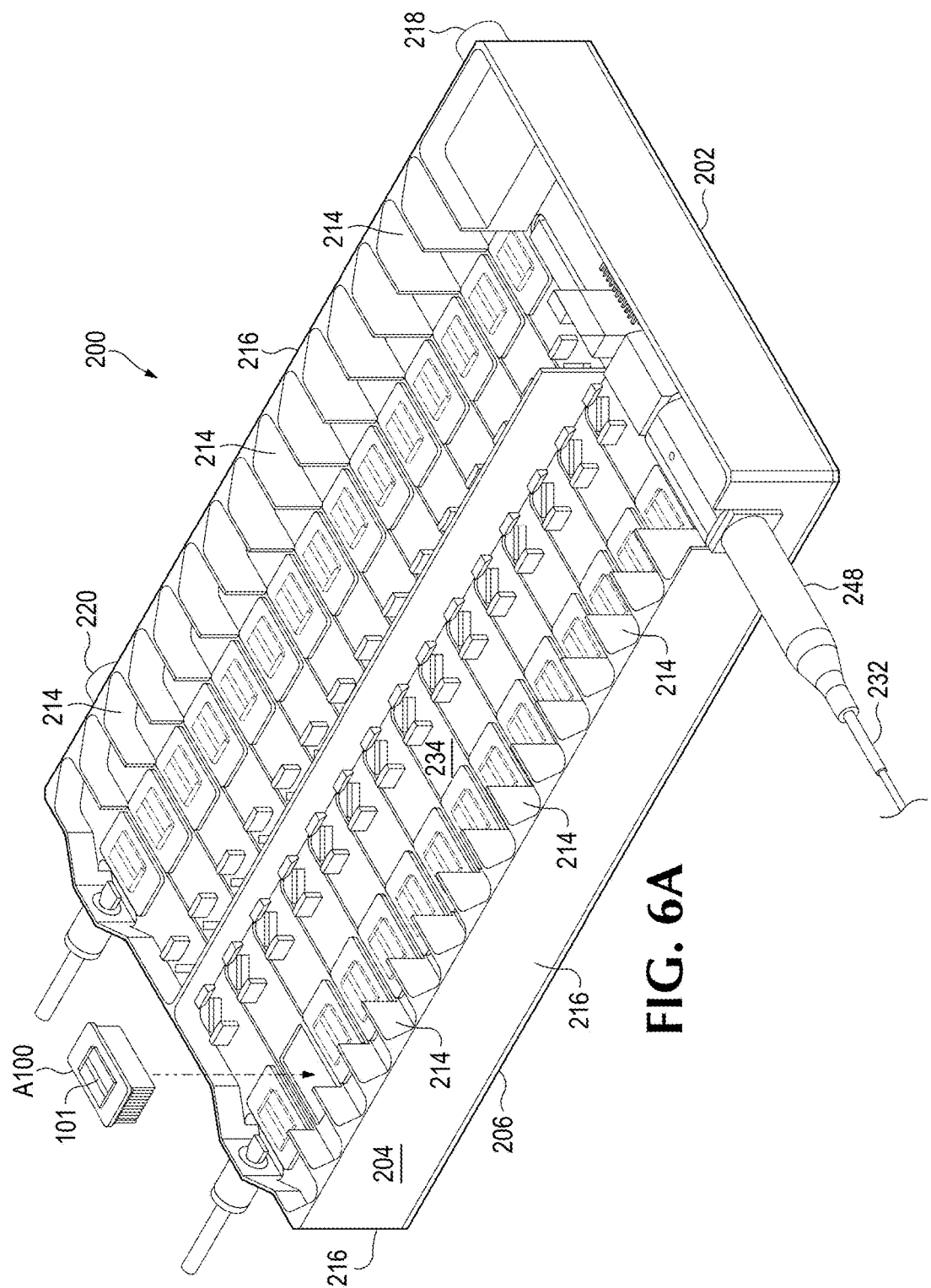
FIG. 6A illustrates an example of an LSLD pump according to the present invention.

FIG. 6A illustrates an example of a low SWAP laser diode (LSLD) pump 200. Diode pump 200 comprises a housing 202 having a carrier structure 204 configured to support one or more LSLD assemblies A100. Housing 202 may comprise a variety of rigid and lightweight materials, for example Aluminum (Al), aluminum silicon carbide (AlSiC), magnesium alloys, different forms of carbon, beryllium alloys (e.g., BeO and/or BeAl), or the like or combinations thereof. A carrier structure 204 may secure the one or more LSLD assemblies A100 in apertures 212 which are fainted to mate to and support corresponding LSLD assemblies A100. In an example, laser diodes 101 reside above the surface 234 of carrier structure 204.

Apertures 212 are configured to securely hold one or more cooling members A108 of one or more of the LSLD assemblies A100 in channels (see FIG. 7B) formed in a backside of carrier structure 204. Coolant can flow through the channels. LSLD assemblies generate significant amounts of heat during operation. As coolant flows through the channels and past, across or through (hereinafter "past") the cooling members A108 it can transfer significant amounts of heat away from the LSLD assemblies A100. Because heat is transferred very efficiently to cooling members A108 in contact with coolant flowing through the channels, LSLD pump 200 may operate more efficiently than a conventional laser diode pump having only a solid thermally conductive heatsink that is not in contact with a flowing coolant.

In an example, each LSLD assembly A100 is attached to an inner surface of a corresponding aperture 212 by gluing, soldering, brazing, welding, or the like or a combination thereof. Surface 234 may be a flat plate or may comprise a vertical stair-step structure such as shown in FIG. 6A. With such a stair-step arrangement, each aperture 212 into which the LSLD assemblies A100 are disposed can be on a separate stair so that the laser beams emanating from the LSLD assemblies A100 may likewise be disposed relative to one another in a stepwise fashion. In another example, a plurality of cavities 212 may reside on a single stair-step in order to support a plurality of laser diodes 101 at each stair-step level.

In an example, a bottom segment 206 may form a sealed chamber when coupled with carrier structure 204. Bottom segment 206 and carrier structure 204 may be coupled at a lip 210 (and/or at other locations) by a variety of methods such as welding, brazing, gluing, friction or snap fit, or the like or any combination thereof.

One or more laser diodes 101 are carefully aligned with a variety of optical components within housing 202.

Figure 6B:
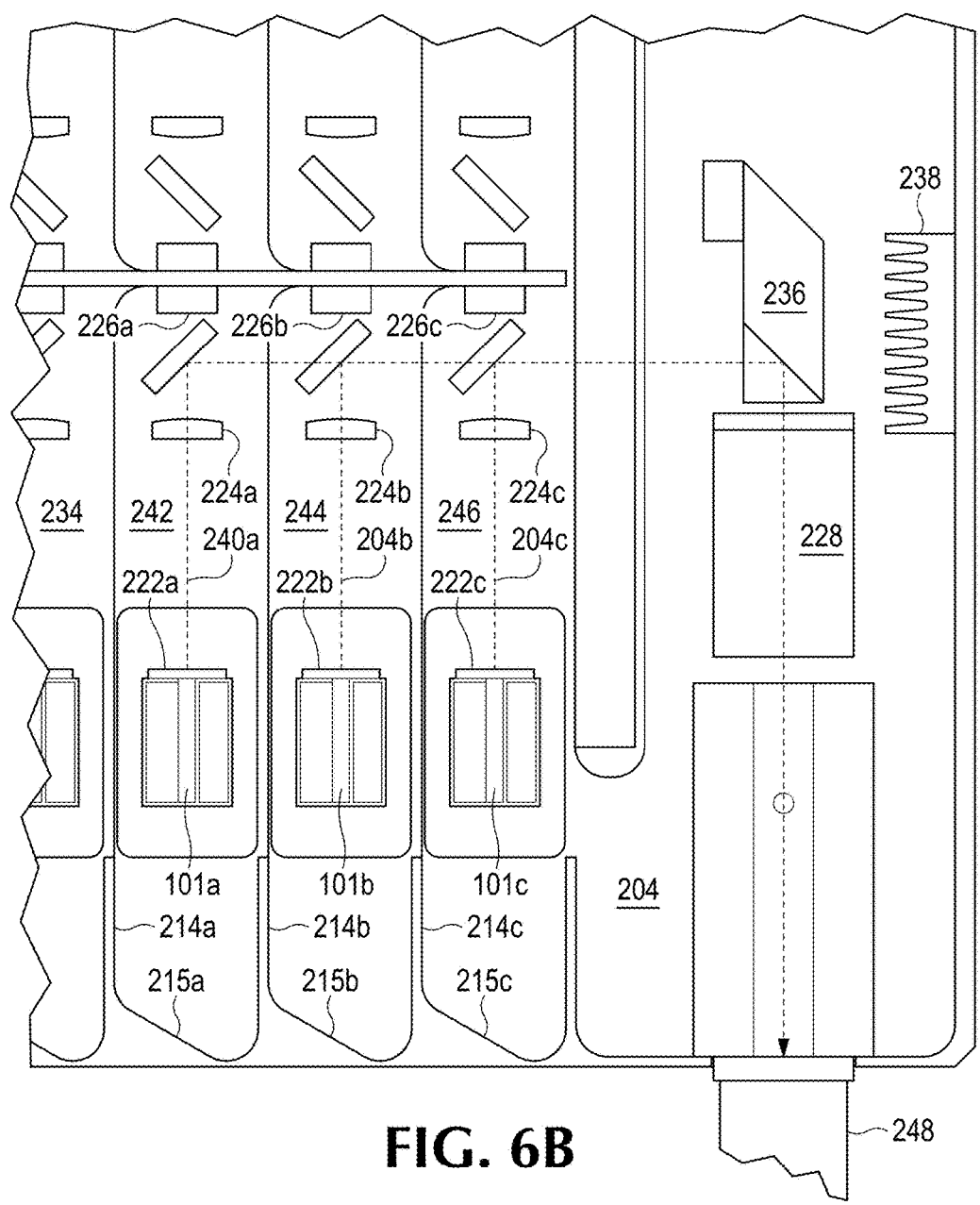
FIG. 6B is a partial section view of an example carrier structure of the LSLD pump of FIG. 6A magnified to show an example of optical components thereof.

FIG. 6B illustrates a partial section view of carrier structure 204 enlarged to shown an example of optical components that may be provided in LSLD pump 200. The following example includes laser diodes and corresponding optical components stacked in the vertical axis on stair-steps. The number of laser beams and stair-steps chosen depends on the desired output power level and operating efficiency of the LSLD pump 200. The partial section view shown in FIG. 6B shows three laser diodes 101a, 101b, and 101c, and corresponding stair-steps. However, any reasonable number of laser diodes may be included in LSLD pump 200 and claimed subject matter is not so limited. Such optical components may comprise fast axis collimating (FAC) lenses 222a-c, slow axis collimating (SAC) lenses 224a-c, angled reflex surfaces 226a-c, turning mirrors 230a-c, a polarization multiplexer (P-MUX) 236, a meniscus fast axis telescope (mFAT) 228, ferrule 248 and light absorbing element 238.

In an example, each fast axis collimating (FAC) lens 222a-c is for collimating respective laser beams 240a-c generated by laser diodes 101a-c in the fast axis; and each slow axis collimating (SAC) lens 224a-c is for collimating respective laser beams 240a-c in the slow axis. The angled reflective surfaces 226a-c are for directing retro-reflecting or stray light to a bottom surface 234 of carrier structure 204 so that it can be absorbed and the resultant heat dissipated to a coolant in a coolant portion 206 of the LSLD pump 200. Turning mirrors 230a-c are for directing respective laser beams 240a-c toward the polarization multiplexer P-MUX 236. Turning mirrors 230a-c may be angled at any of a variety of angles sufficient to direct laser beams 240a-c toward P-MUX 236. P-MUX 236 is configured for directing laser beams 240a-c toward the input surface of a fiber 232. The mFAT 222 is for telescoping laser beams 240a-c toward the input surface of fiber 232. The mFAT 222 reduces a standard two-element Galilean telescope to a single meniscus lens thereby reducing the number of elements that must be aligned with respect to each other. In another example, standard two-element Galilean telescope lenses may be used instead of the mFAT 222.

In an example, light absorbing element 238 is a nonreflective and absorbing material for absorbing residual light that may leak out of the polarization multiplexer P-MUX 236. Fiber ferrule 248 helps to direct laser beams 240a-c into fiber 232.

In an example, LSLD pump 200 may be configured with two rows of stair-stepped laser beams stacked vertically with one row per polarization using the polarization multiplexer P-MUX 236 to achieve twice the brightness. Laser beams 240a-c are then focused into a fiber using a combination of telescope and focusing lenses. Such a stair-step configuration provides a compact and efficient configuration of the laser diodes and optical elements in LSLD pump 200. Each laser beam 240a-c is individually lensed thus enabling beam-pointing that is not possible with bar technology. Bars have inherent "smile" issues which result in "rogue" beams that are not unidirectional, degrade beam quality, and introduce high numerical aperture cladding-light when coupled into fibers. This is significantly different from the currently described optical assembly of LSLD pump 200 which can achieve under-filled numerical aperture and spot size when focused into a fiber, thus eliminating the need for cooling the delivery fiber. This optical combining method is very efficient and it conserves volume since no large opto-mechanical components are required to arrange the laser beams 240a-c into a compact and nearly 100% fill-factor collimated beam format-a requirement before focusing for efficient and high brightness operation. This stair-step arrangement provides a simple, multiple-beam compactification method which achieves low volume and compared to bar-based coupling schemes.

In an example, one or more rigid support structures 214 are formed along sidewalls 216 of carrier structure 204. Rigid support structures 214 are formed to provide support to the carrier structure 204 to prevent deformation during operation when heating of carrier structure 204 or other portions of the housing 202. Deformation due to heating of carrier structure 204 may cause misalignment of optical components described above with respect to FIG. 6B, among other problems. Rigid support structures 214a-c are formed within an angle section 215 to promote redirection of stray light during operation of LSLD pump 200. A portion of light reflected off of angled section 215 may be absorbed by surfaces 214, 215, and 234, and the heat generated by that absorption may be transferred to coolant flowing through the channels as described in greater detail with respect to FIGS. 7B and 7C.

Returning to FIG. 6A, the housing 202 also may include an inlet 218 and an outlet 220 formed in the carrier structure 204 for transporting coolant into and out of the channels formed on the backside of carrier structure 204. The channels may be enclosed by a bottom segment 206. The enclosed volume may be referred to herein as a cooling manifold (shown in more detail in FIGS. 9A and 9B). Cooling members 108 may be disposed within the cooling manifold enabling the cooling members to be exposed to coolant without exposing the laser diode 101 to the coolant.

Figure 7A:
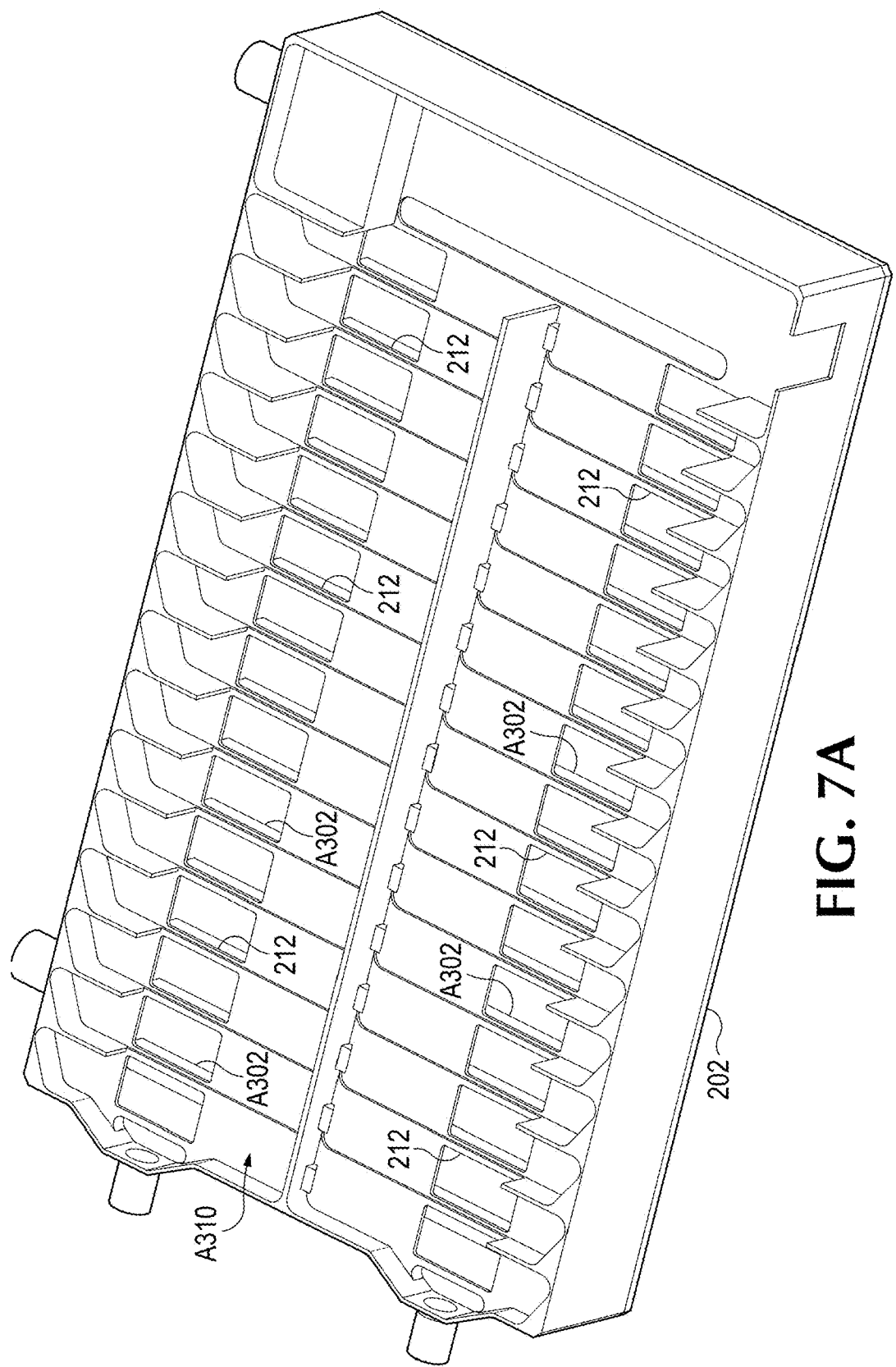
FIG. 7A is aa isometric view of the front side of a first example carrier structure of an LSLD housing.

FIG. 7A illustrates a plan view of a front side A310 of an example carrier structure 204 of housing 202. LSLD assemblies 100 are not shown so that cavities 212 can be more easily visualized. Channel walls A302 disposed on the underside of carrier structure 204 can be seen through the cavities 212. The channel walls A302 define channels A308 through which coolant may flow, in this example, in the direction of the arrows.

Figure 7B:
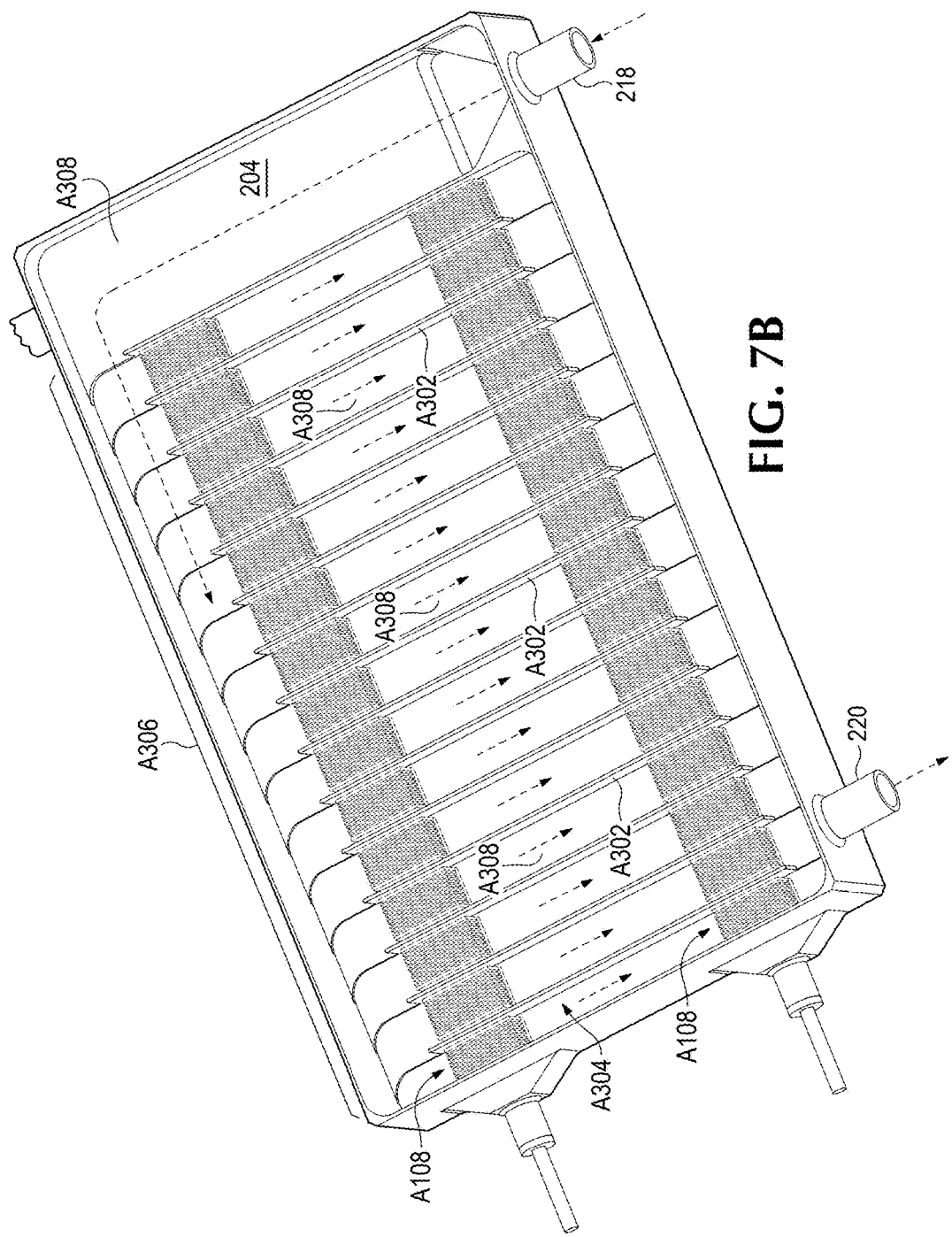
FIG. 7B is an isometric view of a first example of the backside of the example carrier structure of FIG. 7A.
Figure 7C:
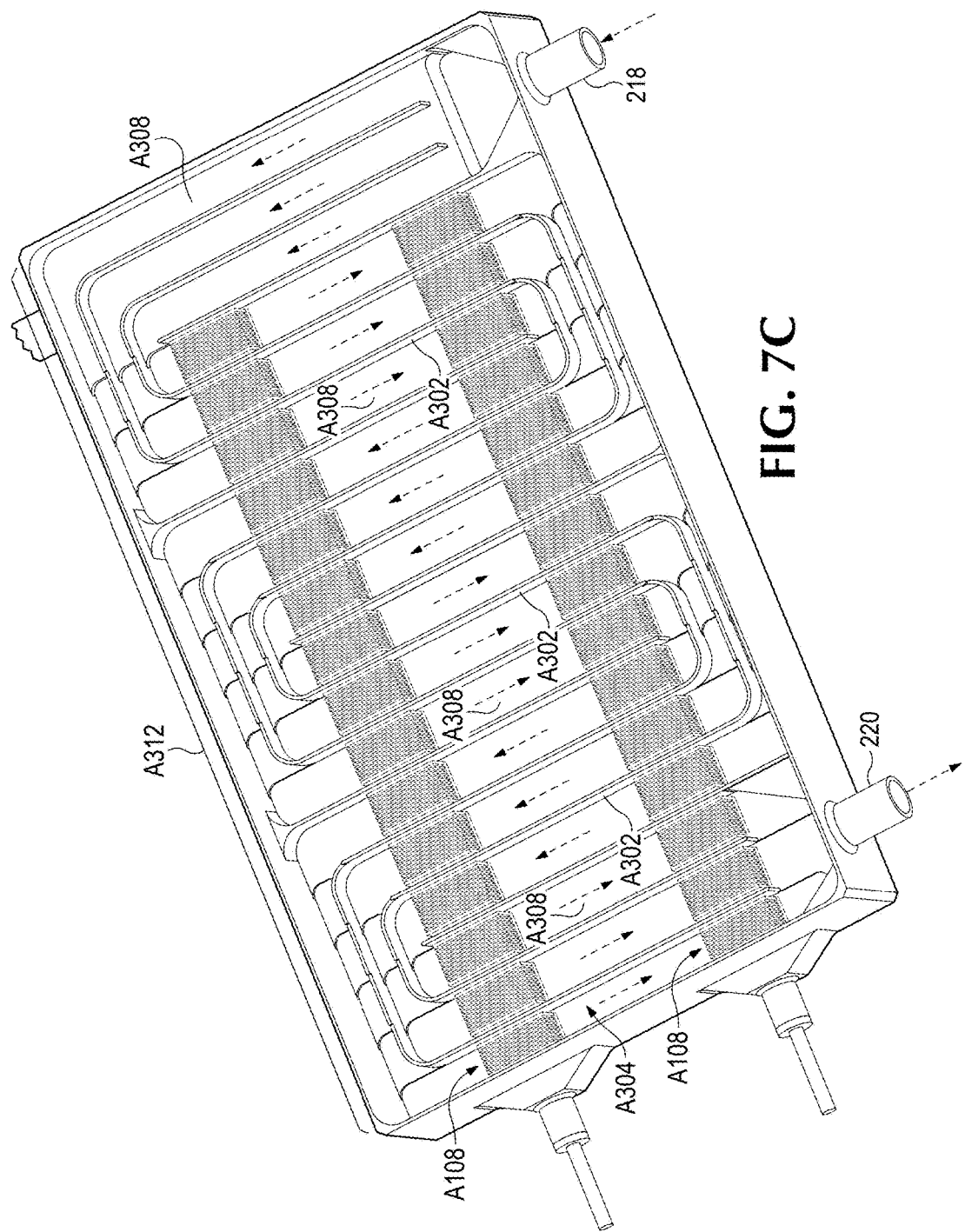
FIG. 7C is an isometric view of a second example the backside of the example carrier structure of FIG. 7A.

FIG. 7B illustrates a plan view of a backside A304 of an example carrier structure 204 of housing 202. In an example, one or more channels A306 are configured to guide a coolant across the cooling members A108 to transfer heat away from LSLD assembly A100. Bottom segment 206 may form a sealed chamber around channels A306 when coupled with carrier structure 204. Coolant may flow in the direction of arrows A308 from an area of higher pressure to an area of lower pressure, for example from inlet 218 to outlet 220. Cooling is configurable to achieve a range of pressure drops and commensurate coolant mass flow rate to maintain a desired heat removal capacity and temperature difference across the coolant. Therefore, the exact design of the channels A306 is versatile. For example, FIG. 7C shows a channel design wherein channels A312 are configured three across in a serpentine configuration from inlet 218 to outlet 220. The materials forming the channels can be coated so that many types of coolant can be used; for example, water, water and glycol (e.g., ethylene glycol (EGW), diethylene glycol (DEGW), propylene glycol (PGW)), ammonia, 1,1,1,2,-Tetrafluorethane (R134A), or the like or any combination thereof.

Example Channel Configurations

In table 1 below a number of example channel configurations for power specific coolant mass flow rates less than or equal to 0.9 kg/min/kW are provided. Table 2 shows modeled thermal performance for three examples of channel configurations for LSLD pump 200 using an SiC submount A102 and a finned-copper heatsink 104, achieving similar thermal performance at the same water flow rate but under different pressure drops.

TABLE 1

| Power (W)/Pump | No. in Series | ΔP per Pump (PSI) | Total ΔP (PSI) | ΔT per Pump (K) | Total ΔT in Series (K) | MASS FLOW Rate (kg/min/kW) |
|---|---|---|---|---|---|---|
| 360 | 4 | 1.67 | 6.7 | 3.98 | 15.9 | 0.74 |
| 360 | 5 | 1.11 | 5.6 | 2.65 | 13.3 | 0.89 |
| 480 | 4 | 1.67 | 6.7 | 5.30 | 21.2 | 0.55 |
| 480 | 5 | 1.67 | 8.3 | 5.30 | 26.5 | 0.44 |
| 600 | 4 | 1.00 | 4.0 | 3.98 | 15.9 | 0.74 |
| 600 | 5 | 1.00 | 5.0 | 3.98 | 19.9 | 0.59 |

TABLE 2

| Diode Cooling Configuration | Water Temperature Rise (° C.) | Pressure Drop (PSI) | Water Flow Rate (GPM) | Average Diode Temperature (° C.) | Average Thermal Resistance (° C./W) |
|---|---|---|---|---|---|
| 15 in parallel 2 in series | 7.0 | 0.08 | 0.21 | 30 | 1.1 |
| 5 in parallel 6 in series | 7.0 | 0.88 | 0.21 | 29 | 1.1 |
| 3 in parallel 10 in series | 7.0 | 2.67 | 0.21 | 28 | 1.0 |

Figure 8A:
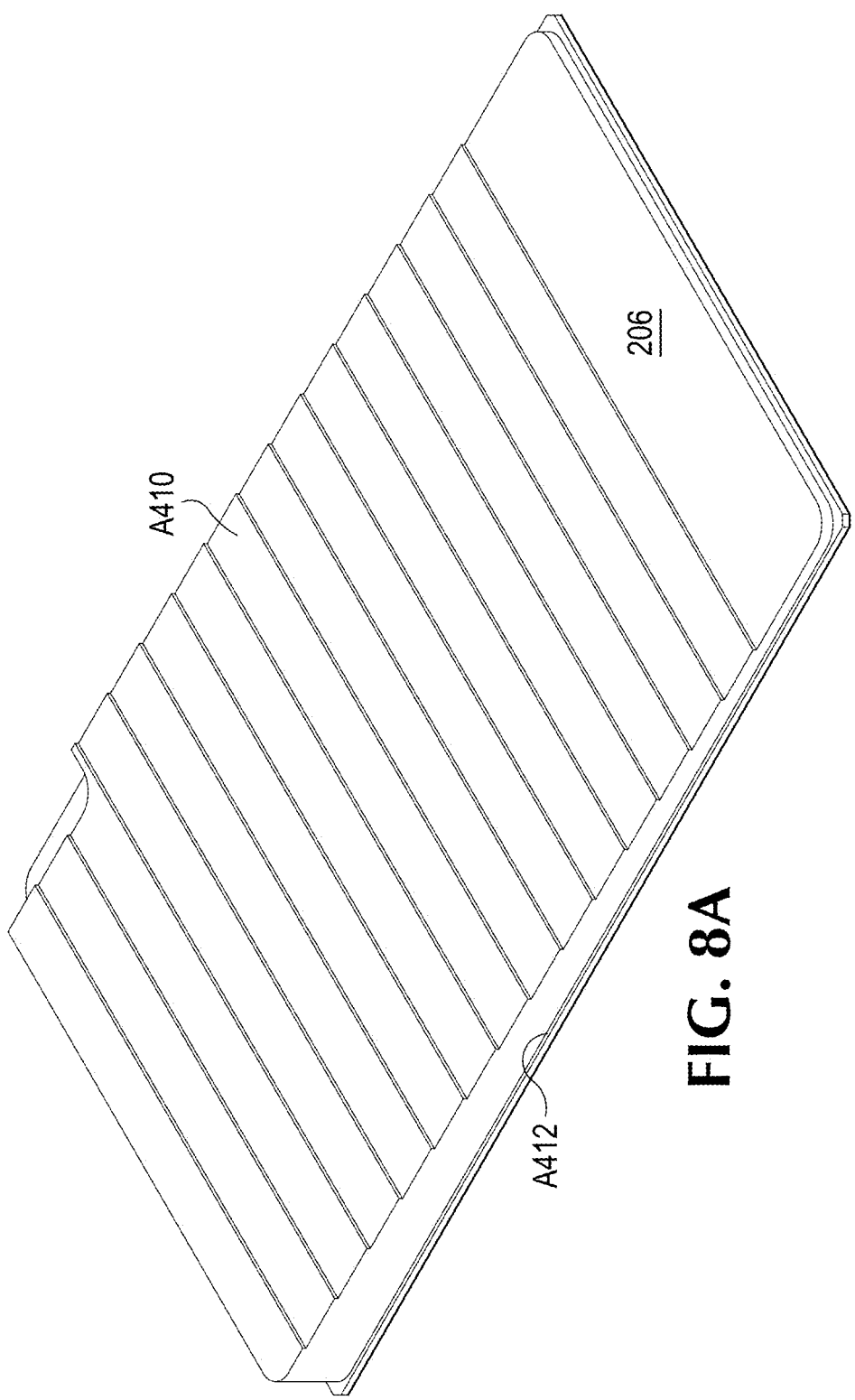
FIG. 8A is an isometric view of a top side of an example of a bottom segment of an LSLD housing.

FIG. 8A illustrates a perspective view of topside A410 of an example bottom segment 206. In an example, bottom segment 206 has a stair-step configuration that is similar to the stair-step configuration of carrier structure 204. In other examples, bottom segment 206 may have different conformations depending on the particular design of LSLD pump 200. Bottom segment 206 is configured to mate to carrier structure 204, fitting inside of carrier structure 204 with a lip A412 extending around a bottom edge of carrier structure 204.

Figure 8B:
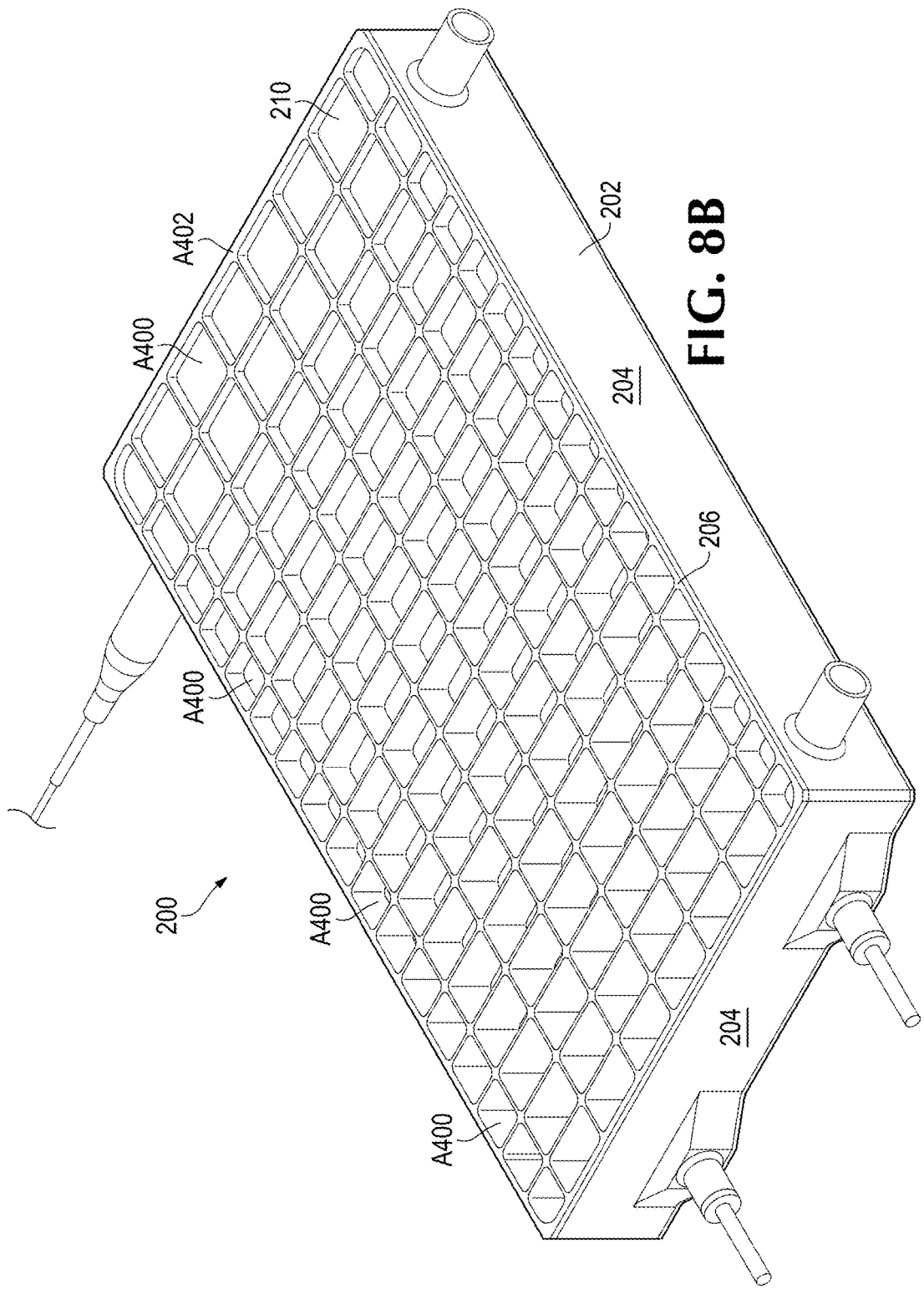
FIG. 8B is an isometric view of an example of a backside of a bottom segment of an LSLD housing.

FIG. 8B illustrates a perspective view of an example of a backside A402 of the bottom segment 206 fitted to carrier structure 204 of housing 202. Backside A402 has one or more voids A400 which may be formed by a variety of methods known to those of ordinary skill in the art, such as machining, chemical etching, 3D manufacturing, forging, die-casting, or the like or any combinations thereof. The voids 400 are formed to reduce the weight of LSLD pump 200 while providing structural support to housing 202 in order to prevent deformation of bottom segment 206 and/or other portions of housing 202. Such deformation may have devastating effects on critical optical alignments, for example, of the laser diode 101 with various optical components precisely positioned within housing 202 as described above in connection with FIG. 6B.

The voids A400 may have a variety of shapes and sizes. In some examples, voids A400 may be hexagonal and arranged in a honeycomb, or may be square and arranged in a grid as depicted in FIG. 8B. In other examples, the voids A400 may comprise any of a variety of geometrical shapes, standing alone, tiled or otherwise arranged together to optimize stiffness for lowest mass. Tiling may be done in a regular repeating pattern or in an aperiodic pattern. In an example, the shape(s) of the voids A400 may be selected to optimize structural support and/or weight or volume reduction of housing 202. Because the bottom segment 206 has a stair-step or stair case shape as shown in FIG. 8A, the depth of the voids A400 is shallower where the stair-step height is lower, and as the stair-step height increases, so too does the depth of the voids. In another example, bottom segment 206 may be flat and the voids A400 may have the same or similar depths.

FIG. 9A is a longitudinal cross-sectional side view of LSLD pump 200. In an example, LSLD assemblies A100 are disposed in apertures 212 of carrier structure 204. Cooling members A108 extend into channels A308 which are enclosed by a top surface A410 of bottom segment 206.

Bottom segment 206 is configured to mate to carrier structure 204 fitting inside of carrier structure 204 with a lip A412 extending around a bottom edge of carrier structure 204. The assembly of carrier structure 204 and bottom segment 206 may be a tight fit sufficient to create a seal and/or barrier to leakage of coolant out of channels A308. Carrier structure 204 may be coupled to bottom segment 206, and/or top surface A410 may be coupled to carrier structure 204, by a variety of methods, for example by close or friction fit, welding, laser-welding, brazing, soldering, seam-sealing, or the like or any combinations thereof.

Heights of channels A308 are defined by the distances between surface 234 of carrier structure 204 and topside A410 of bottom segment 206. Thus, the heights of channels A308 are preferably substantially uniform. Voids A400 have varying heights/volumes depending on the height of a corresponding stair-step.

FIG. 9B is an exploded longitudinal cross-sectional side view of LSLD pump 200. In an example, a wall 502 of carrier structure 204 is configured to fit snugly around a wall 504 of bottom segment 206. Coupling of the walls 502 and 504 may create a seal sufficient to prevent coolant leakage from channels A308. In an example, LSLD pump 200 may achieve up to 0.5 kg/kW specific mass.

Figure 10:
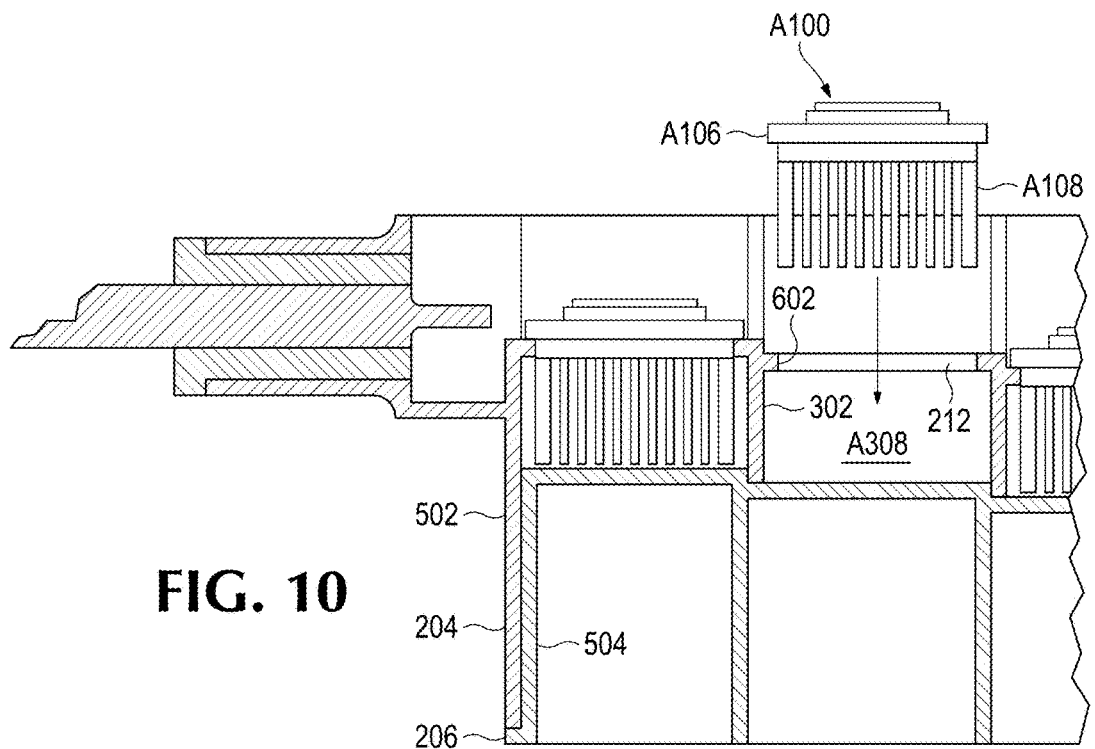
FIG. 10 is an exploded cross-sectional side view of the LSLD pump of FIGS. 9A and 9B magnified to show detail.

FIG. 10 is an exploded cross-sectional side view of LSLD pump 200. In an example, LSLD assembly A100 is disposed in aperture 212. Heatsink A104 rests on a lip 602 of aperture 212 such that cooling members A108 extend into channel A308. Channels A308 are defined, in part, by channel walls 302.

Figure 11:
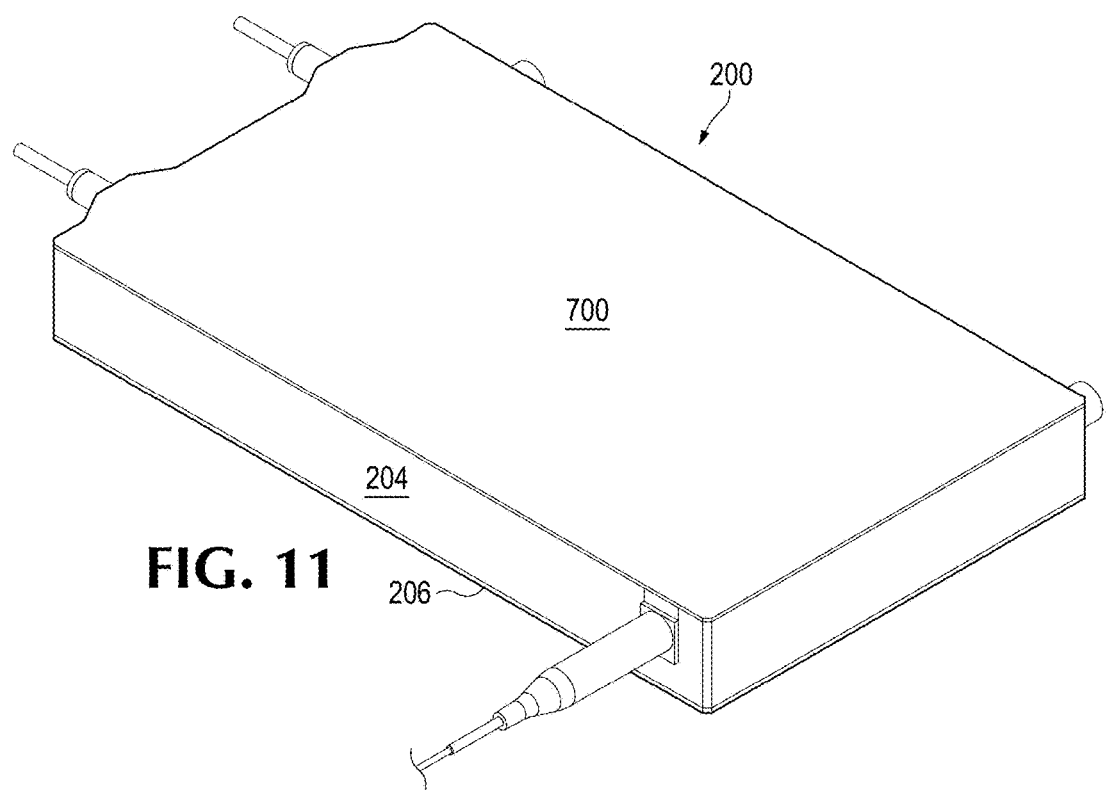
FIG. 11 is an isometric view of an example of an LSLD pump having a lid or lid member.

FIG. 11 illustrates an example of an LSLD pump 200 having a lid 700 for enclosing the LSLD pump. Lid 700 is a thermally noncritical part and may comprise low-density material.

Topological Optimization of Heatsink

Figure 12:
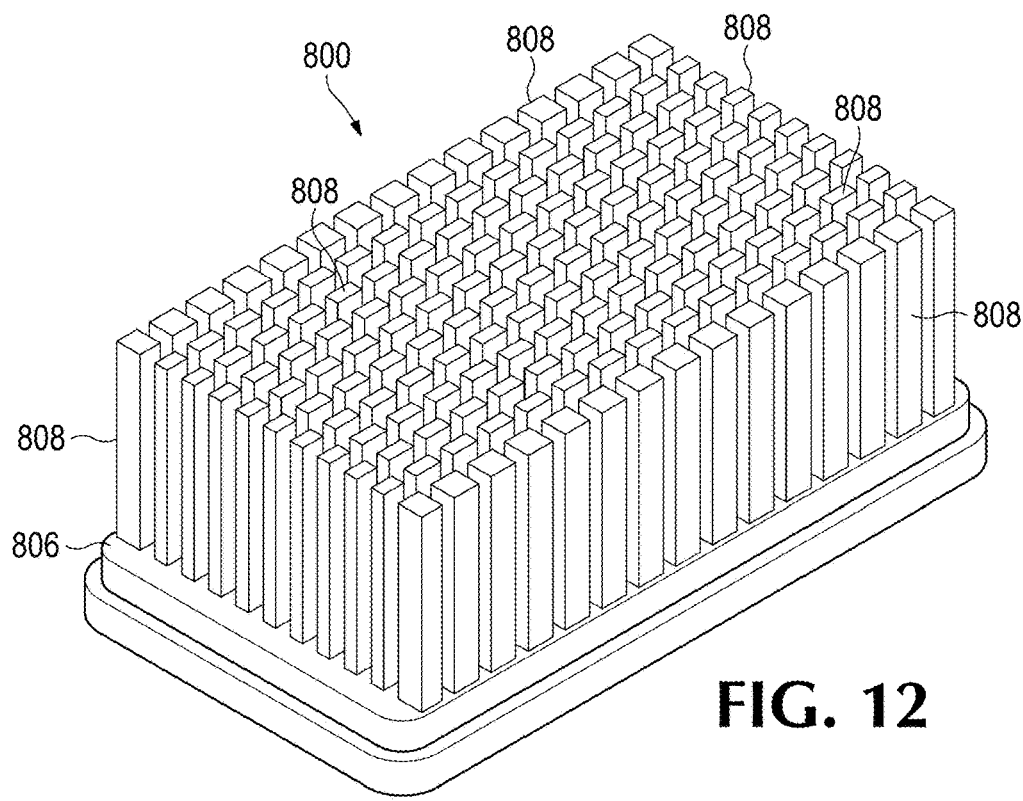
FIG. 12 is an isometric view of a heatsink for an LSLD pump.

FIG. 12 illustrates an example of a specialized heatsink 806 for LSLD assemblies 800 for implementation in LSLD pump 200. In an example, heatsink 806 may be made from a variety of thermally conductive materials, such as APG, Cu, AL, Si, or the like or any combinations thereof. Cooling members 808 may comprise pegs or posts having a high surface area-to-volume ratio to enable removal of excess heat from a laser diode/submount assembly (not shown) such as discussed above. The cross-sections of the pegs or posts may have any of a variety of geometric shapes, such as square, rectangular, polygonal, circular, or the like or any combination thereof, and may have other shapes as well. The configuration shown may further reduce the weight of the LSLD pump 200 and increase the thermal transfer coefficient as compared to fm-shaped cooling members A108, further improving thermal performance and reducing weight.

Figure 13A:
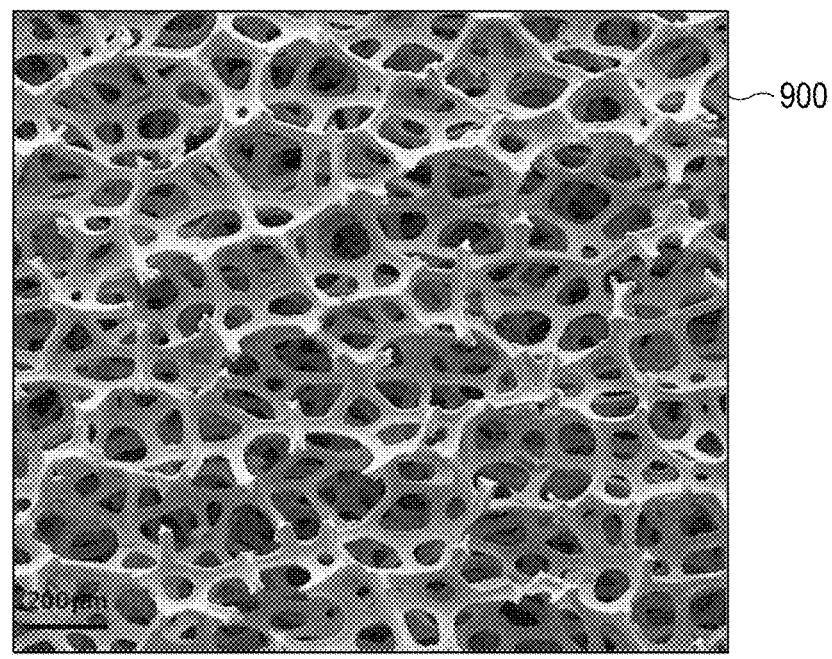
FIG. 13A is a photograph of an example of an example graphite foam material for use in a heatsink for an LSLD pump.

FIG. 13A depicts an example of a graphite foam material 900 for increasing the surface area for contact with a coolant for cooling LSLD pump 200. The graphite foam 900 is lightweight and has high thermal conductivity. In an example, heatsink 806 (see FIG. 12) and/or cooling members 808 may comprise the graphite foam 900, which may be coupled to submount A102 by gluing, brazing, soldering, laser welding, or the like or any combination thereof.

Figure 13B:
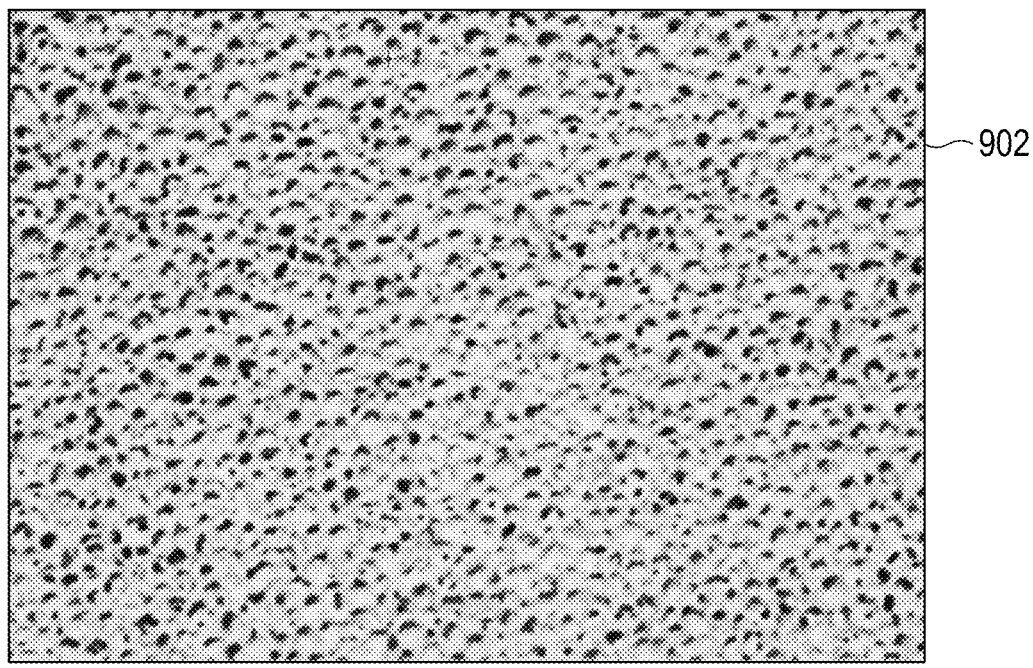
FIG. 13B depicts an example of an example microporous copper material for use in a heatsink for an LSLD pump.

FIG. 13B depicts an example of a microporous copper material 902 for increasing the surface area for contact with a coolant for cooling LSLD pump 200. The microporous copper 902 is lightweight with 80% porosity, has high thermal performance, and requires little processing in order to prepare it for use. In an example, heatsink 806 and/or cooling members 108 may comprise microporous copper, which may be coupled to submount A102 by gluing, brazing, soldering, laser welding, or the like or any combination thereof.

Figure 13C:
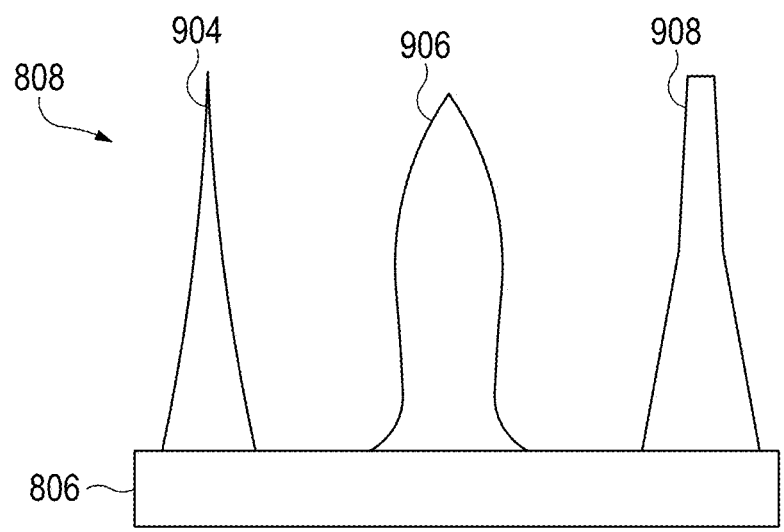
FIG. 13C is a side view of cooling members of a heatsink for an LSLD pump comprising various shapes.

FIG. 13C depicts example cooling members 808 of heatsink 806 comprising various shapes. In an example, cooling members 808 may comprise an elongated wedge 904, a parabolic cone 906, and/or a bottleneck 908 that may be improve thermal transfer by increasing surface-to-volume ratio and/or increasing turbulence, thereby promoting more complete transfer of heat throughout a coolant in close proximity with the cooling members 108. Cooling members 108 may be provided in any of the shapes 904, 906, and/or 908 or may have a variety of these shapes in a single heatsink. It will be appreciated that these are merely examples, and that many alternative shapes could be used to optimize the variables noted above and the claimed subject matter is not limited in this regard.

Figure 13D:
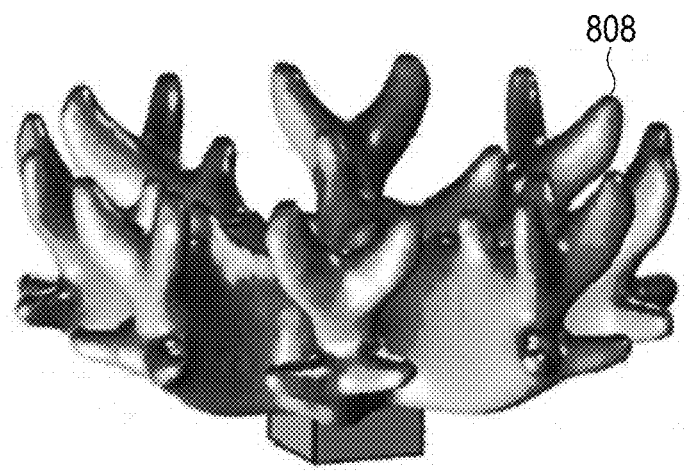
FIG. 13D is a photograph of example cooling members formed using computer modeling and 3D manufacturing techniques.

FIG. 13D depicts example cooling members 808 formed using computer modeling and 3D manufacturing techniques. These methods may be used to identify a "3D topologically optimized structure" for a particular laser power, coolant substance, and/or laser diode pump architecture. Modeling enables optimizing thermal transfer by identifying structures that increase surface are-to-volume ratios, turbulent flow, and other factors, that promote more complete transfer of heat into a coolant. In an example, cooling members 808 may be formed by micro-machining or 3D manufacturing silicon or other materials known to those of ordinary skill in the art. Silicon is less costly than copper and fabrication of 3D structures in silicon is also relatively easy compared to machining copper since silicon can be micro-machined at a wafer level.

Figure 14A:
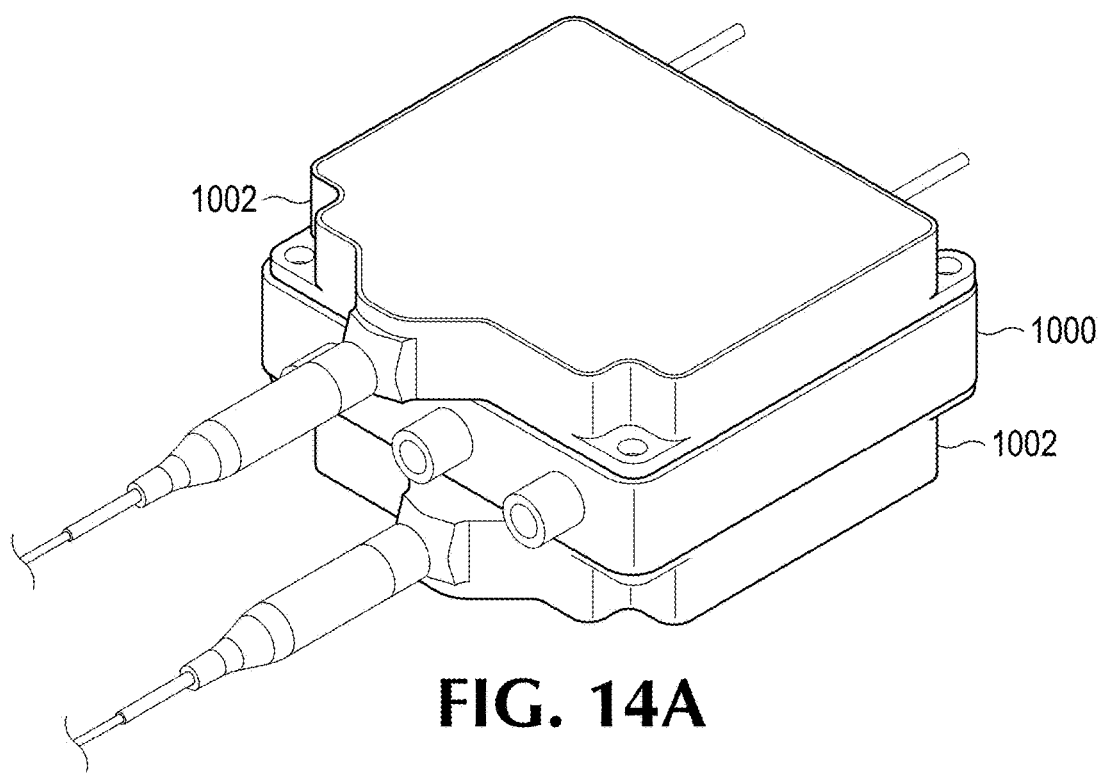
FIG. 14A is a perspective view of an example of a plurality of LSLD pumps coupled to a manifold configured to enable the LSLD pumps to be arranged in a compact layout.
Figure 14B:
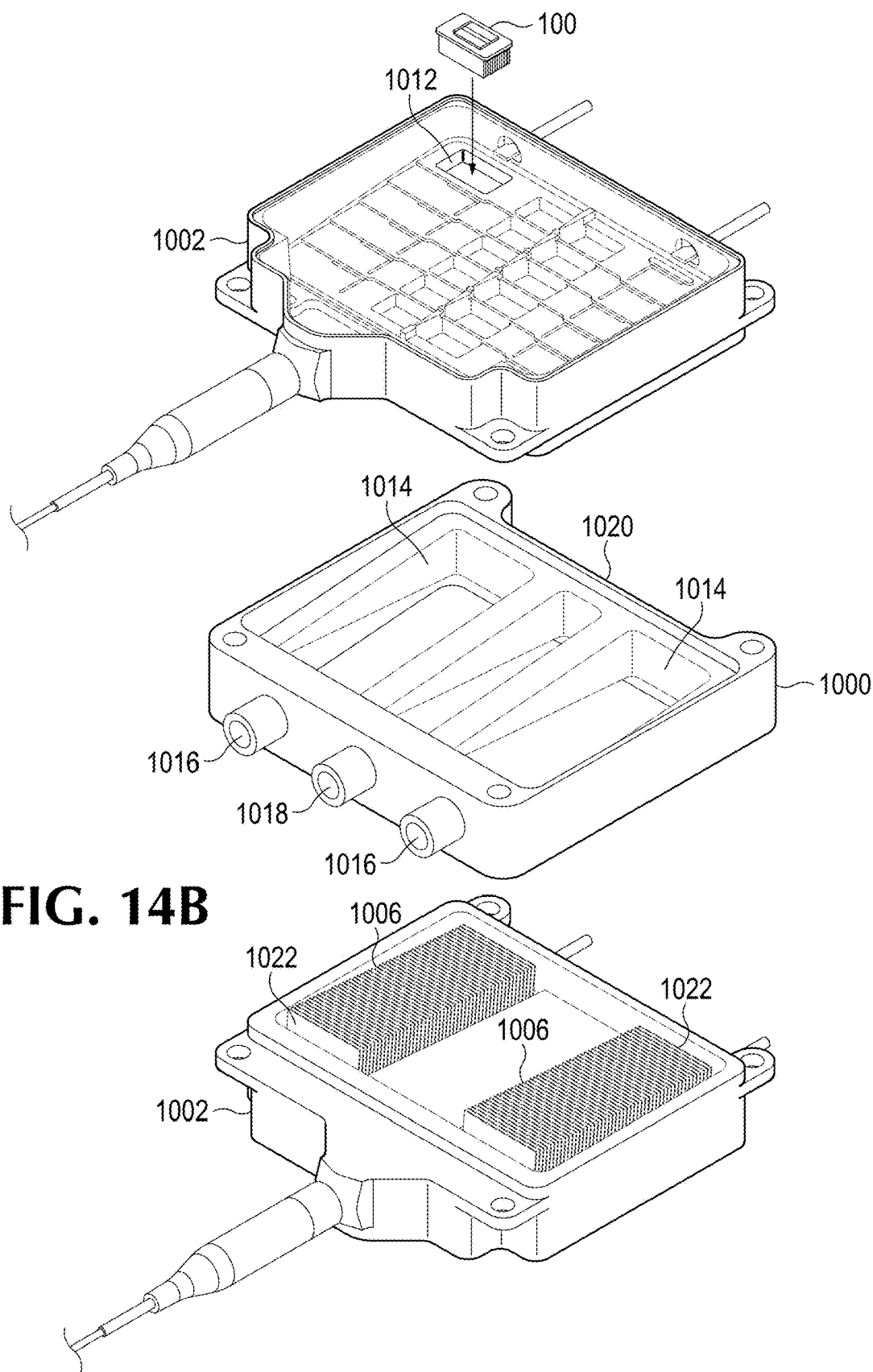
FIG. 14B is an exploded view of an example of a plurality of LSLD pumps coupled to a manifold configured to enable the LSLD pumps to be arranged in a compact layout.
Figure 14C:
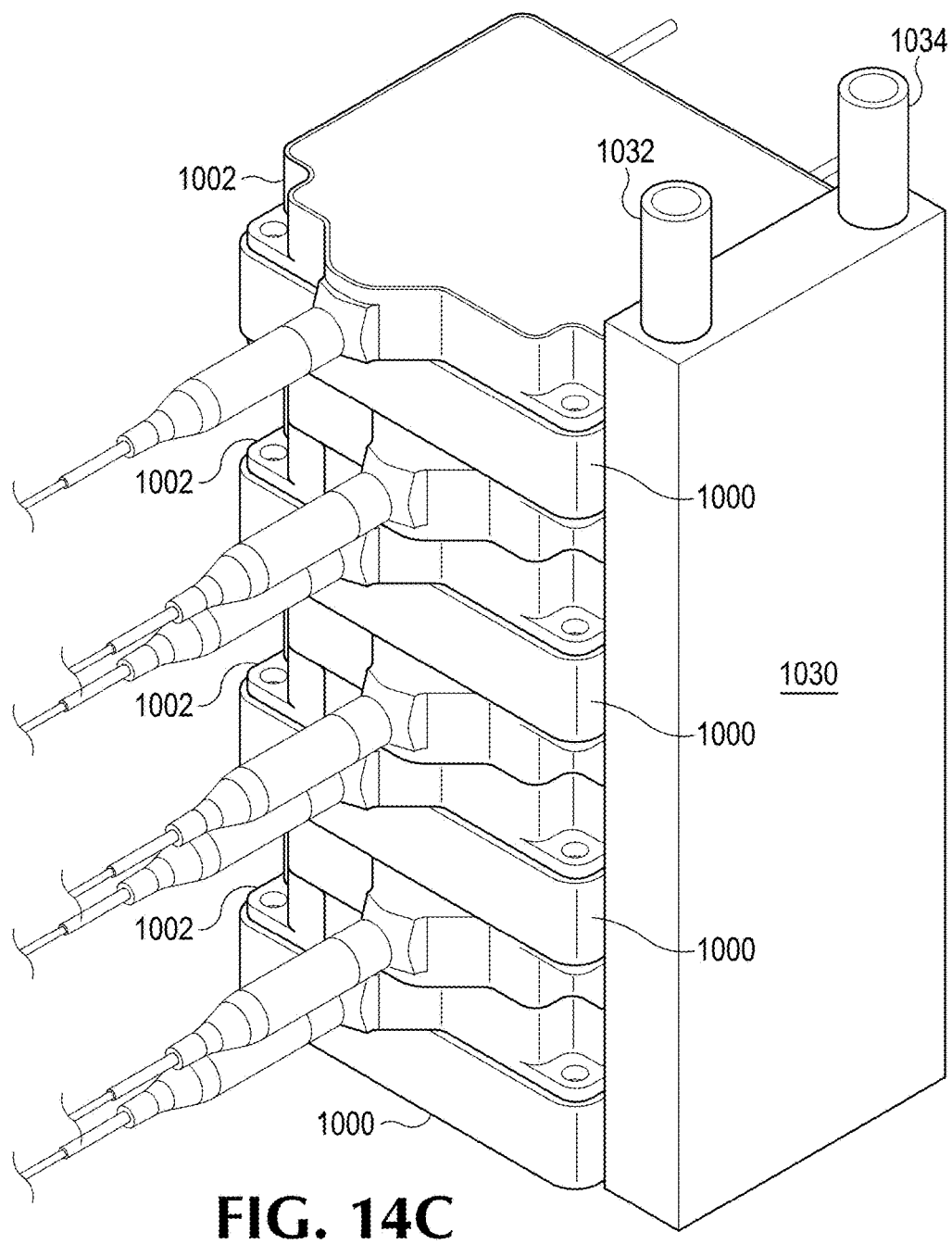
FIG. 14C is a perspective view of an example of a plurality of LSLD pumps layered with intervening manifolds having a shared coolant source to enable the LSLD pumps to be arranged in a compact layout.

FIGS. 14A-14C depict examples of a plurality of LSLD pumps sharing one or more cooling manifolds 1000.

FIG. 14A depicts an example manifold 1000 coupled between two LSLD pumps 1002. LSLD pumps 1002 are similar to LSLD pumps 200 described above, however in this example, LSLD pumps 1002 have a 2×6 arrangement of LSLD assemblies 100; that is, each pump 1002 has two rows and six columns of LSLD assemblies. In an example, manifold 1000 may comprise lightweight material, for example PEEK, plastic (e.g., polypropylene), glass, fiberglass, or the like or any combination thereof. Manifold 1000 may be used to introduce coolant to remove excess heat dissipated by the heatsinks 1006 (see FIG. 10B) of both LSLD pumps 1002. Heatsinks 1006 are similar to heatsinks 104 described above with respect to FIG. 1. Including a manifold 1000 reduces the need for a chilling plate or other additional heat transfer devices, which typically add excess mass and volume to laser diode pump systems. Manifold 1000 can be designed in numerous different configurations depending on the available volume allocation and the shape of the volume for multi-kilowatt systems.

FIG. 14B is an exploded view of LSLD pumps 1002 and manifold 1000. One of the LSLD assemblies 100 and apertures 1012 thereof are visible in upper LSLD pump 1002. Manifold 1000 has channels 1014 sized to permit alignment with cooling members 1022 (e.g., fins or the like as described above) of heatsinks 1006 for directing coolant around and through the structural features of cooling members 1022. In the current example, the cooling members 1022 are fins. Inlet ports 1016 and outlet port 1018 supply coolant to the channels 1014. In another example, depending on the needs of the application, inlet ports 1016 and outlet port 1018 may be reversed wherein ports 1016 may be the outlet ports and port 1018 may be the inlet port.

With reference to FIG. 14C, another strategy is to stack multiple LSLD pumps 1002 and manifolds 1000 one on top of the other. FIG. 14C shows a plurality of LSLD pumps layered with intervening manifolds 1000 and a common manifold 1030 configured to feed coolant into and expel fluid from the manifolds 1000 to enable the LSLD pumps 1002 to be arranged in a compact configuration. This type of packing configuration is useful for applications where available space is very tight.

In this particular configuration, with a 150 W (Watt) output per LSLD pump 1002, a total of 2100 W can be generated in a total volume of 1355 $cm^3$ (cubic centimeters), resulting in approximately 1.55 $W/cm^3$. High brightness diodes can be combined using a commercial 7×1 fiber-combiner to produce approximately 1 kW output from a 220 µm (micro-meter) and 0.22 NA (numerical aperture) beam. Then, using a (6+1):1 combiner, a total of 6 kW of pump power can be deployed into a 400 µm and 0.46 NA DC fiber amplifier to produce 5 kW of single mode output power. There are yet other configurations that can be invoked to befit a particular volume sizes and shape requirement.

LSLD pumps according to the invention employ stacked laser beams and optics as described above in connection with FIG. 6B, following the same principles described above in connection with the conductively cooled laser diode packages 100, 300 and 400.

Figure 15A:
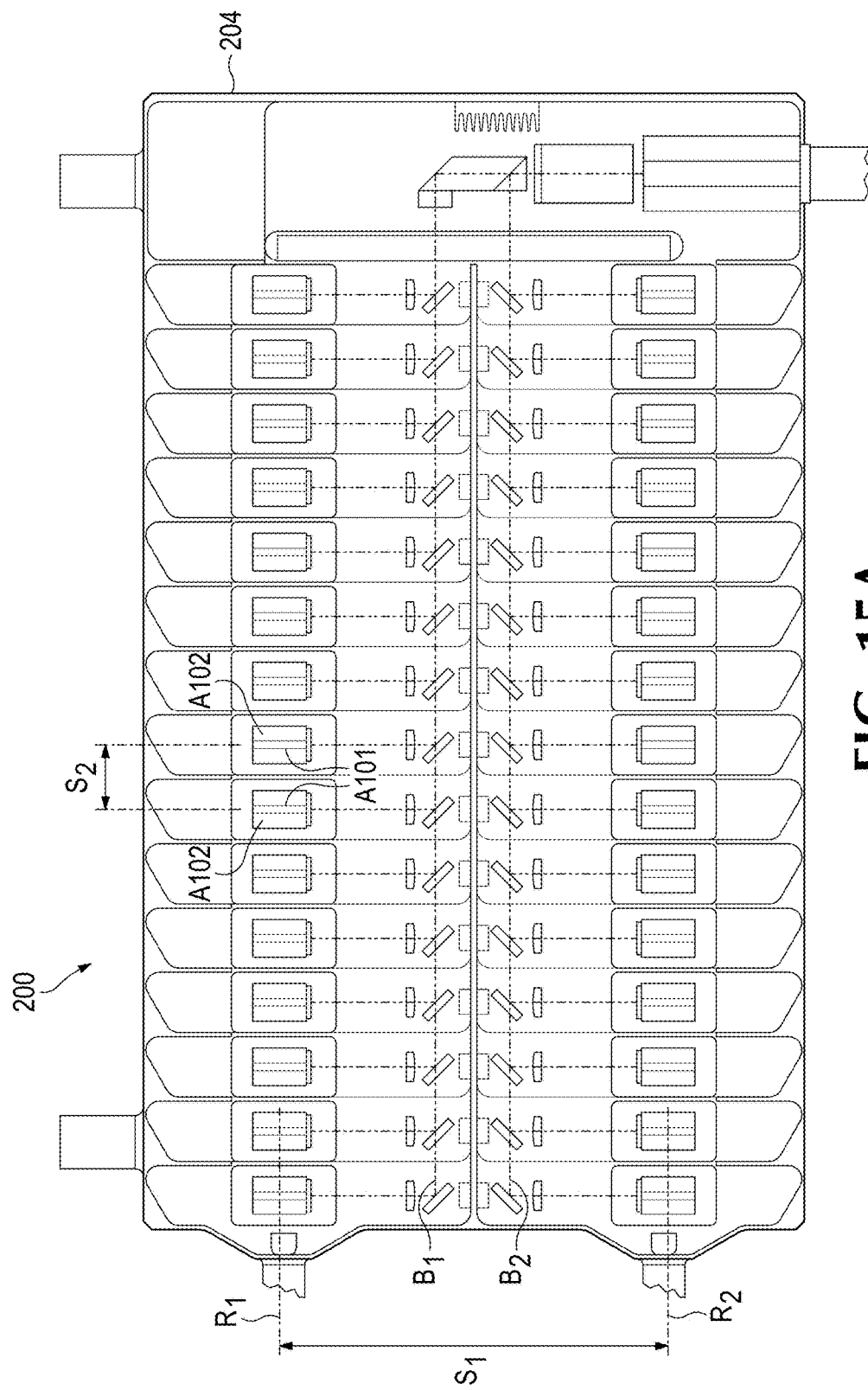
FIG. 15A is a top, plan view of the LSLD pump of FIG. 6A.
Figure 15B:
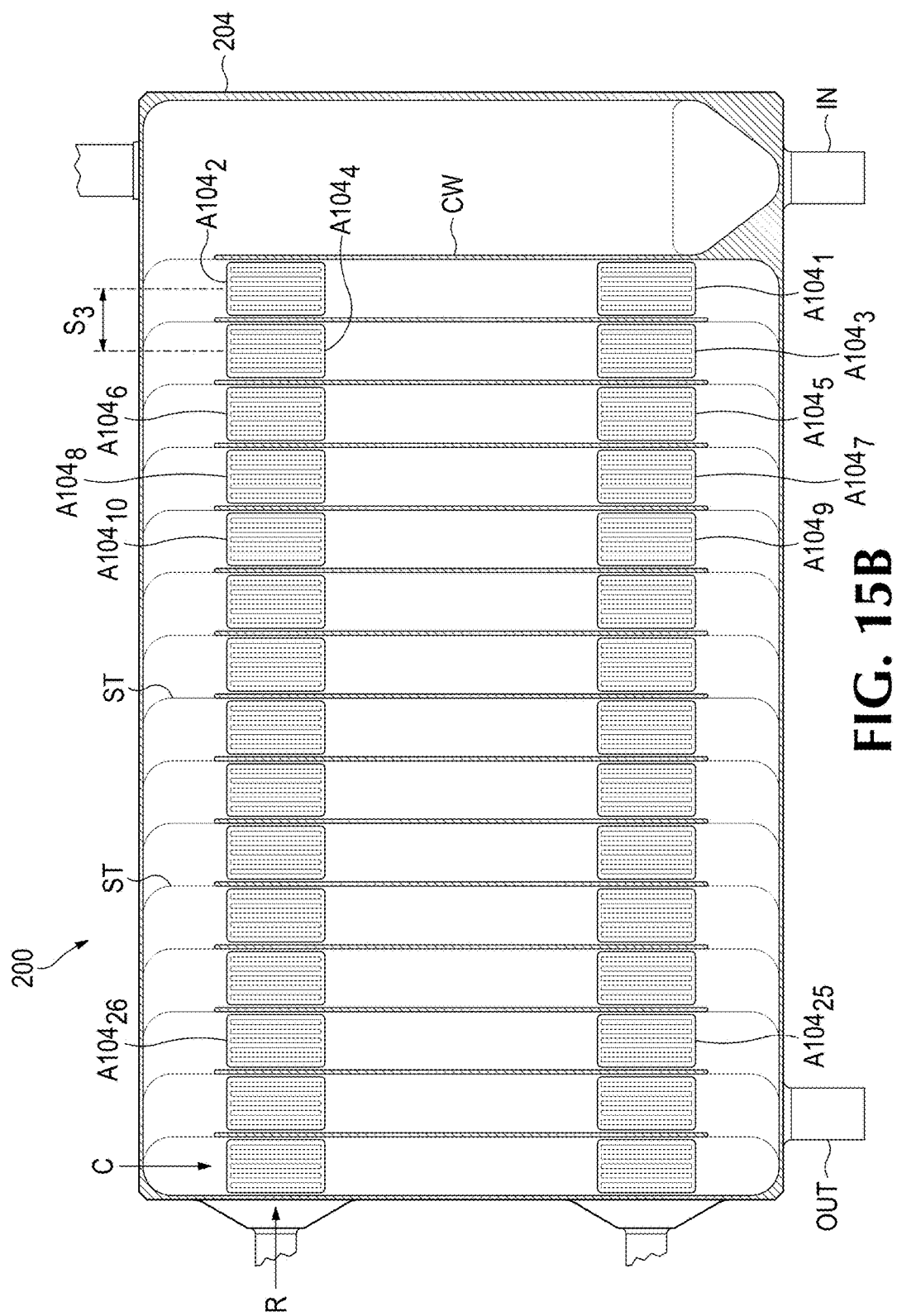
FIG. 15B is a bottom, plan view of the LSLD pump of FIG. 15A.

FIGS. 15A and 15B show the high brightness LSLD pump 200 described above. FIG. 15A shows the front sides of the pump 200 and with a carrier structure 204; and FIG. 15B shows the opposite, backsides of these elements.

FIG. 15A shows more particularly that there are two rows of the laser diodes 101, a first row "$R_1$" and a second row "$R_2$" that are spaced apart from one another by a center-to-center spacing "$S_1$." The rows of laser diodes produce respective laser beams "$B_1$" and "$B_2$." The center-to-center spacing $S_1$ is typically in the range 50 mm-60 mm, and is preferably no more than 60 mm. The spacing $S_1$ is sufficient for the laser beams and the optics used for turning them. The laser diodes A101 are spaced apart from another a distance "$S_2$," which is typically in the range 5 mm-10 mm, and which is preferably at least 4 mm. The spacing $S_2$ is sufficient to provide space for the submounts A102 for the laser diodes 101.

FIG. 15B shows "H" heatsinks A104 attached, in one-to-one correspondence, to the submounts A102 of the H laser diodes 101 shown in FIG. 15A. The center-to-center spacing "$S_3$" between the heatsinks is the same as the spacing $S_2$ shown in FIG. 15A. Stair-steps "ST" formed in the carrier structure 204 corresponding to those of the bottom segment 206 shown in FIG. 8A.

For reference further below, twelve heatsinks are referenced in FIG. 15B; namely, the heatsinks "$A104_1$,"- "$A104_{10}$," "$A104_{25}$," and "$A104_{26}$."

Following the row and column arrangement of the laser diodes as shown in FIG. 15A and described above, the heatsinks shown in FIG. 15B are arranged in "R"=2 substantially parallel rows, and "C"=15 substantially parallel columns.

FIG. 15B also shows channel walls "CW" of the carrier structure 204, defining the aforementioned channels. In the previous discussion, it was noted that these channels may be enclosed by a bottom segment 206, and that the resulting enclosed volume may be referred to herein as a cooling manifold. The combination of the carrier structure and bottom segment may now and hereafter be referred to herein as a "carrier," and the term "cooling channel" will be used herein to refer to an enclosed volume defined in a cooling manifold. As a consequence, the term "cooling channel" will be understood to refer to the same channel walls within a carrier structure to which the term "channel" has previously been used.

It is an outstanding advantage of the present invention that a carrier can be variably configured to provide for selected combinations of a coolant mass flow rate "F" through the carrier, a pressure drop "P" of the coolant across the carrier, and a steady state temperature "T" of the laser diodes. Different configurations of carriers will be described by reference to different configurations for the channel walls CW of the carrier structure, such as the carrier structure 204, it being understood that the bottom segments corresponding to those carrier structures will be configured to enclose the volumes defined by the channel walls to define the cooling channels, to constrain the coolant to flow past one or more specific, predetermined heatsinks A104. Where the heatsink A104 includes a plurality of cooling members A108, the cooling members extend away from the attachment surface 105 into a channel, and the channel constrains the coolant to flow past the cooling members. Where there are multiple spaced-apart cooling members A108, or where the cooling members are microporous, the coolant, more specifically, flows "through" the cooling members.

In general, there are "M" cooling channels for conducting a coolant from one or more inlets "IN" of a carrier to one or more outlets "OUT" of the carrier, where each cooling channel is configured to constrain a coolant to flow past "N" of the heatsinks A104, where M and N can be any integers that multiplied together equal the total number H of heatsinks, and wherein at least one of M and N is at least 2. Where M is at least 2, M is the number of cooling channels in parallel, and where N is at least two, N is the number of heatsinks served by the cooling channel in series.

FIGS. 16A-16F show some examples of different channel wall configurations for the carrier structure 204 for the LSLD pump 200, all pertaining to the same quantity "H"=30 heatsinks, for 30 laser diodes 101, as shown in FIGS. 15A and 15B. For better clarity of presentation, the stair-steps ST shown in FIG. 15B are omitted in FIGS. 16A-16F.

Figure 16A:
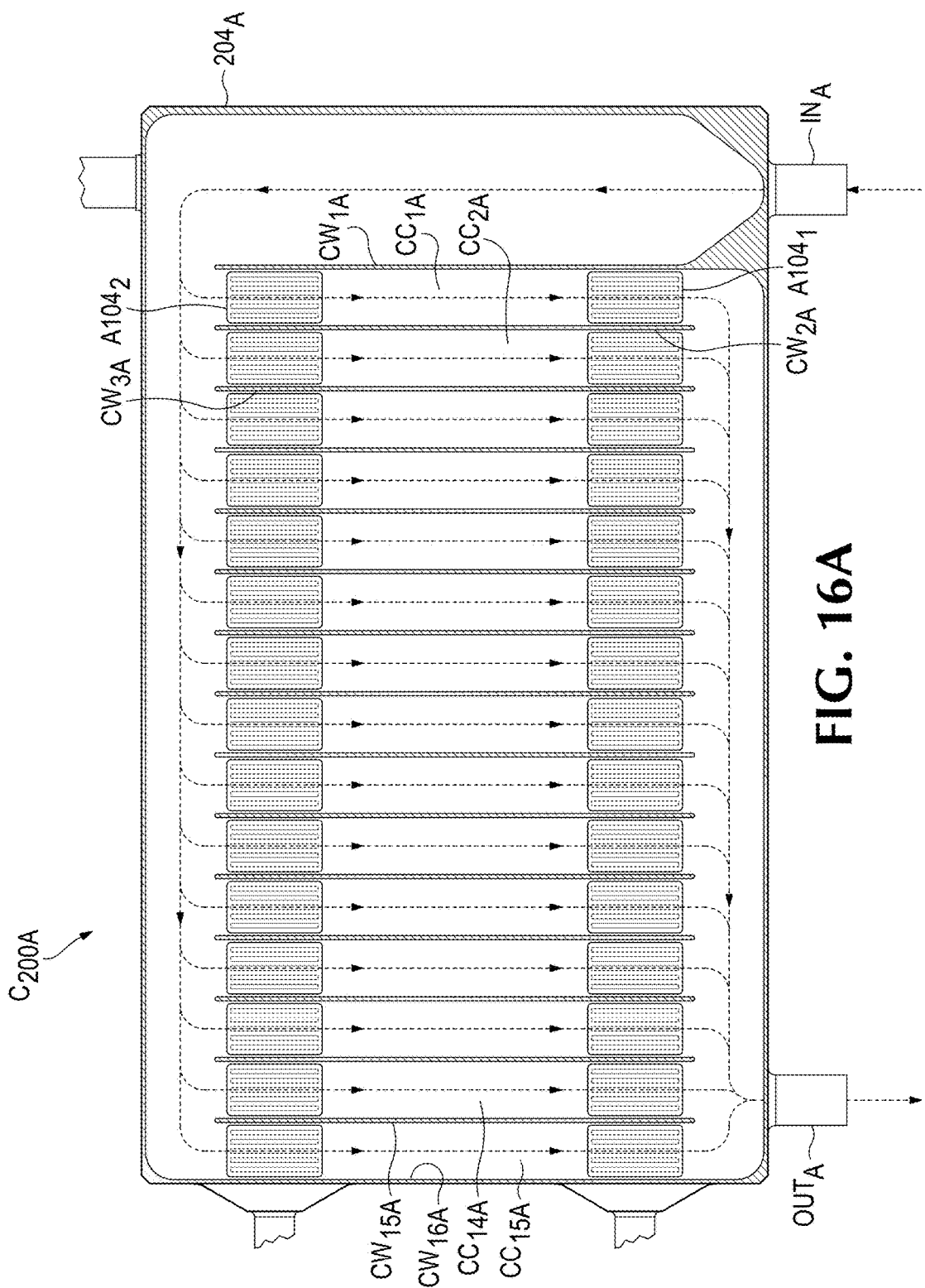
FIG. 16A is a bottom, plan view of an LSLD pump such as the LSLD pump of FIGS. 15A and 15B with a first example channel configuration where M=15 and N=2.

FIG. 16A shows an example carrier "$C_{200A}$" where M=15 and N=2; i.e., 15 cooling channels in parallel, each for conducting coolant past 2 heatsinks in series. In particular, there are 15+1=16 channel walls CW, namely "$CW_{1A}$," "$CW_{2A}$," "$CW_{3A}$" ... "$CW_{15A}$," and "$CW_{16A}$," which define fifteen cooling channels "CC," namely "$CC_{1A}$," "$CC_{2A}$," "$CC_{3A}$" ... "$CC_{14A}$," and "$CC_{15A}$." As an example, one of the fifteen cooling channels $CC_{1A}$, defined between the channel walls $CW_{1A}$ and $CW_{2A}$, conducts coolant obtained at the input "$IN_A$" of the carrier $C_{200A}$, past the two heatsinks $A104_1$ and $A104_2$ in series; and thereafter the coolant is expelled from the carrier at the output "$OUT_A$."

Figure 16B:
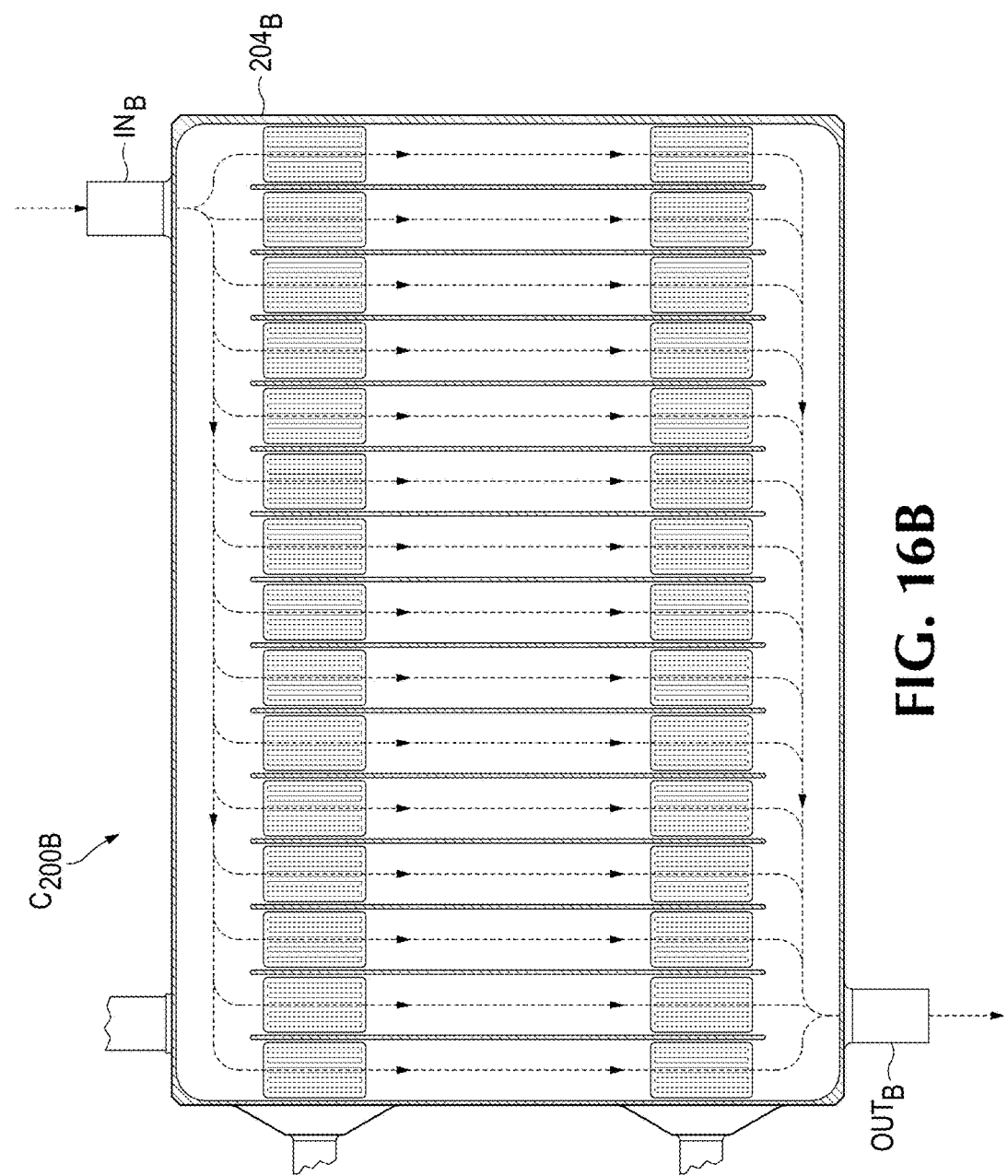
FIG. 16B is a bottom, plan view of an alternative to the LSLD pump of FIG. 16A, particularly adapted for side-by-side mounting.

FIG. 16B shows a carrier "$C_{200B}$" with a channel configuration having the same M and N parameters as that of the carrier of FIG. 16A, but with a carrier structure "$204_B$" that is shortened in the direction of the arrow, relative to the carrier structure 204A shown in FIG. 16A, as a consequence of providing an inlet "$IN_B$," corresponding to the inlet $IN_A$ of the carrier $C_{200A}$, at the opposite side of the carrier. This further minimizes the size of the carrier, and facilitates mounting the carriers side-by-side as will be discussed further below.

Figure 16C:
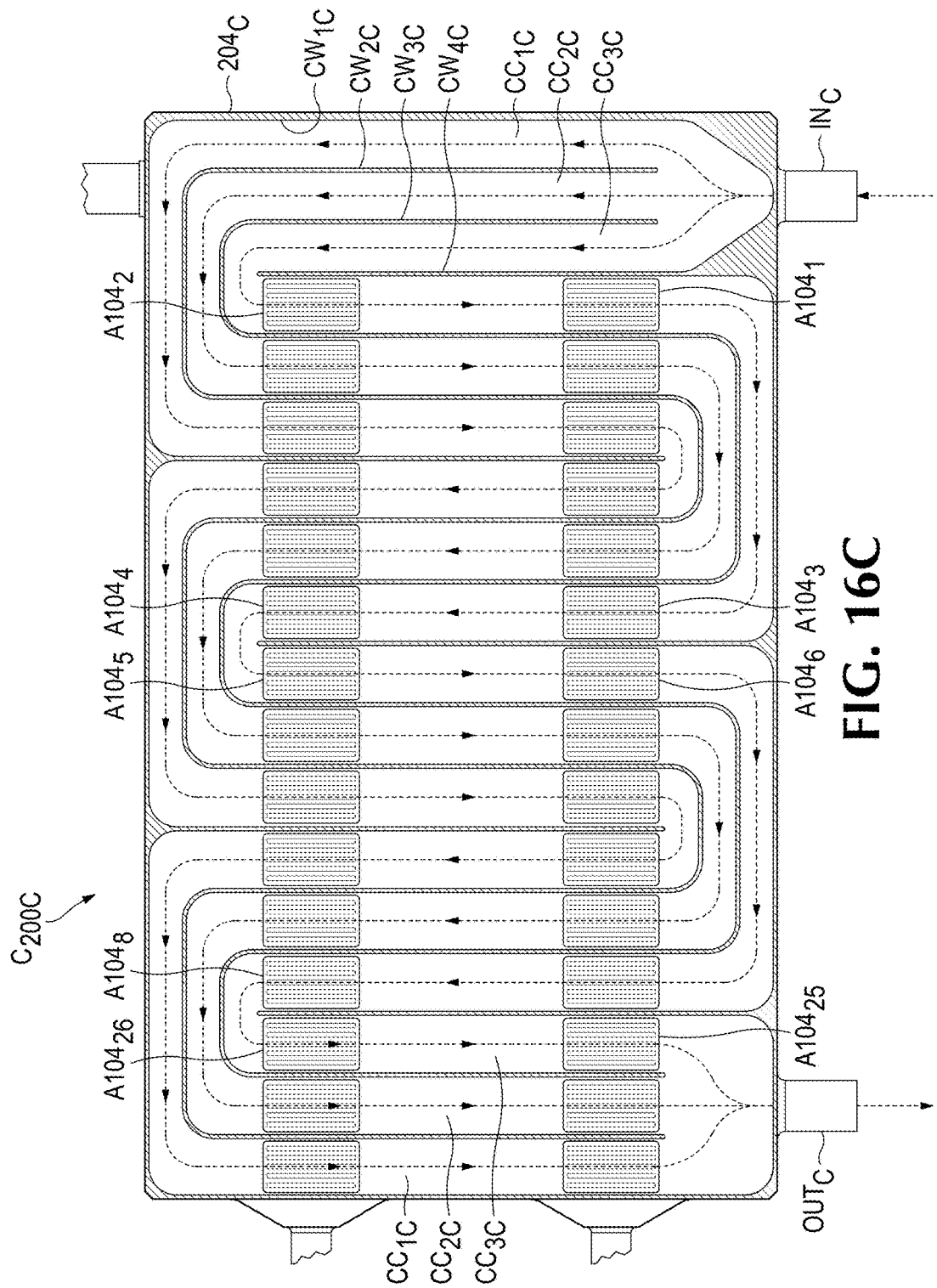
FIG. 16C is a bottom, plan view of an LSLD pump such as the LSLD pump of FIGS. 15A and 15B with a second example channel configuration where M=3 and N=10.

FIG. 16C shows an example carrier "$C_{200C}$" where M=3 and N=10; i.e., 3 cooling channels in parallel, each for conducting coolant past 10 heatsinks in series. In particular, there are 3+1=4 channel walls CW, namely "$CW_{1C}$," "$CW_{2C}$," "$CW_{3C}$" and "$CW_{4C}$," which define three cooling channels "CC," namely "$CC_{1C}$," "$CC_{2C}$," and "$CC_{3C}$." As an example, one of the three cooling channels $CC_{3C}$, defined between the channel walls $CW_{3C}$ and $CW_{4C}$, conducts coolant obtained at the input "$IN_C$" of the carrier $C_{200C}$, past the ten heatsinks $A104_1$-$A104_{10}$ in series; and thereafter the coolant is expelled from the carrier at the output "$OUT_C$."

Figure 16D:
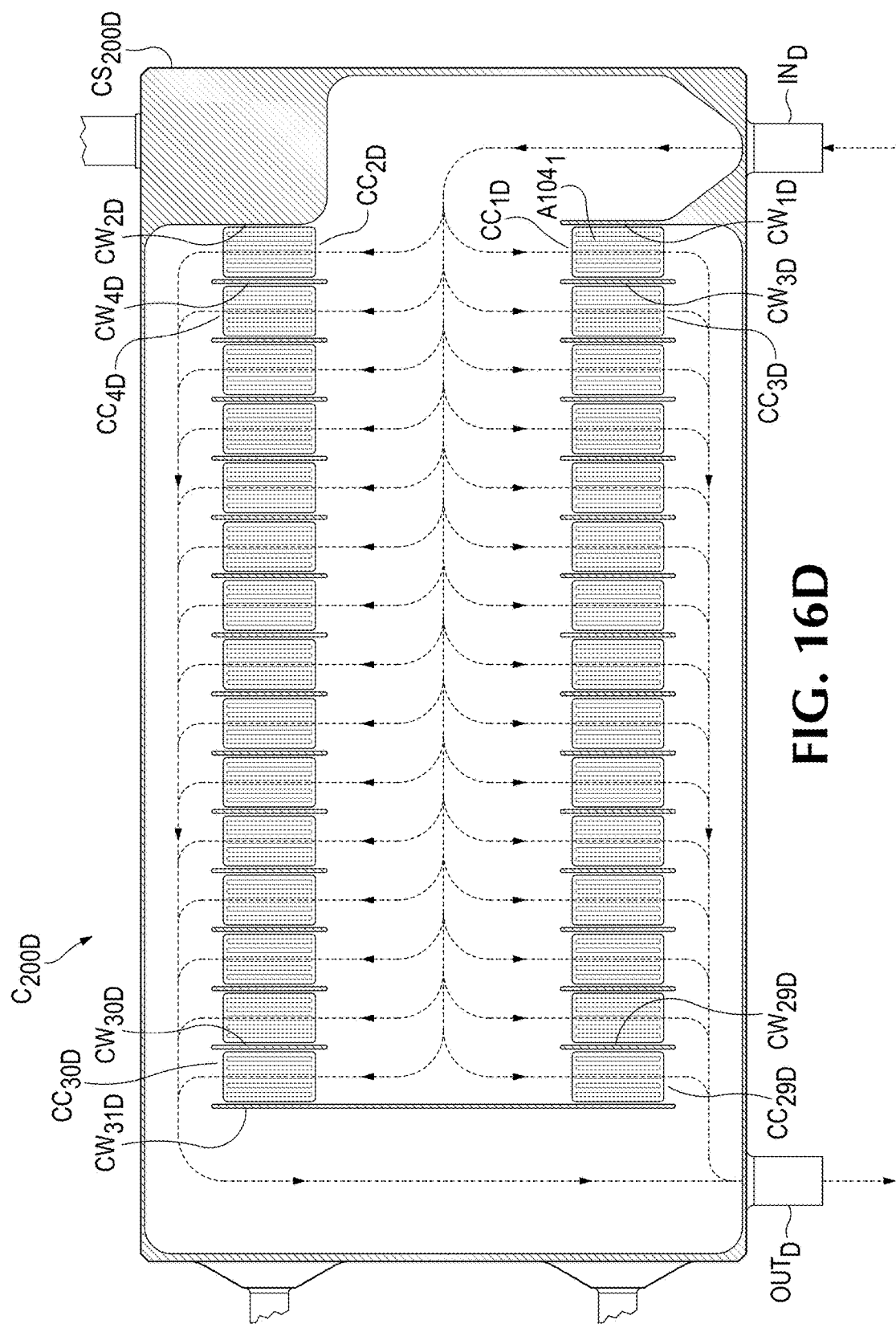
FIG. 16D is a bottom, plan view of an LSLD pump such as the LSLD pump of FIGS. 15A and 15B with a third example channel configuration where M=30 and N 1.

FIG. 16D shows an example carrier "$C_{200D}$" where M=30 and N=1; i.e., 30 cooling channels in parallel, each for conducting coolant past 1 heatsink. In particular, there are 30+1=31 channel walls CW, namely "$CW_{1D}$," "$CW_{2D}$," "$CW_{3D}$" ... "$CW_{30D}$," and "$CW_{31D}$," which define thirty cooling channels "CC," namely "$CC_{1D}$," "$CC_{2D}$," "$CC_{3D}$" ... "$CC_{29D}$," and "$CC_{30D}$." As an example, one of the thirty cooling channels $CC_{1D}$, defined between the channel walls $CW_{1D}$ and $CW_{3D}$, conducts coolant obtained at the input "$IN_D$" of the carrier $C_{200D}$, past one heatsink $A104_1$; and thereafter the coolant is expelled from the carrier at the output "$OUT_D$." Note that in this example, the carrier structure "$CS_{200D}$" is elongated in the direction indicated by the arrow, relative to, e.g., the carrier structure $204_A$ in FIG. 16A, to allow space for the channel $CW_{30C}$ to connect internally to the outlet.

Figure 16E:
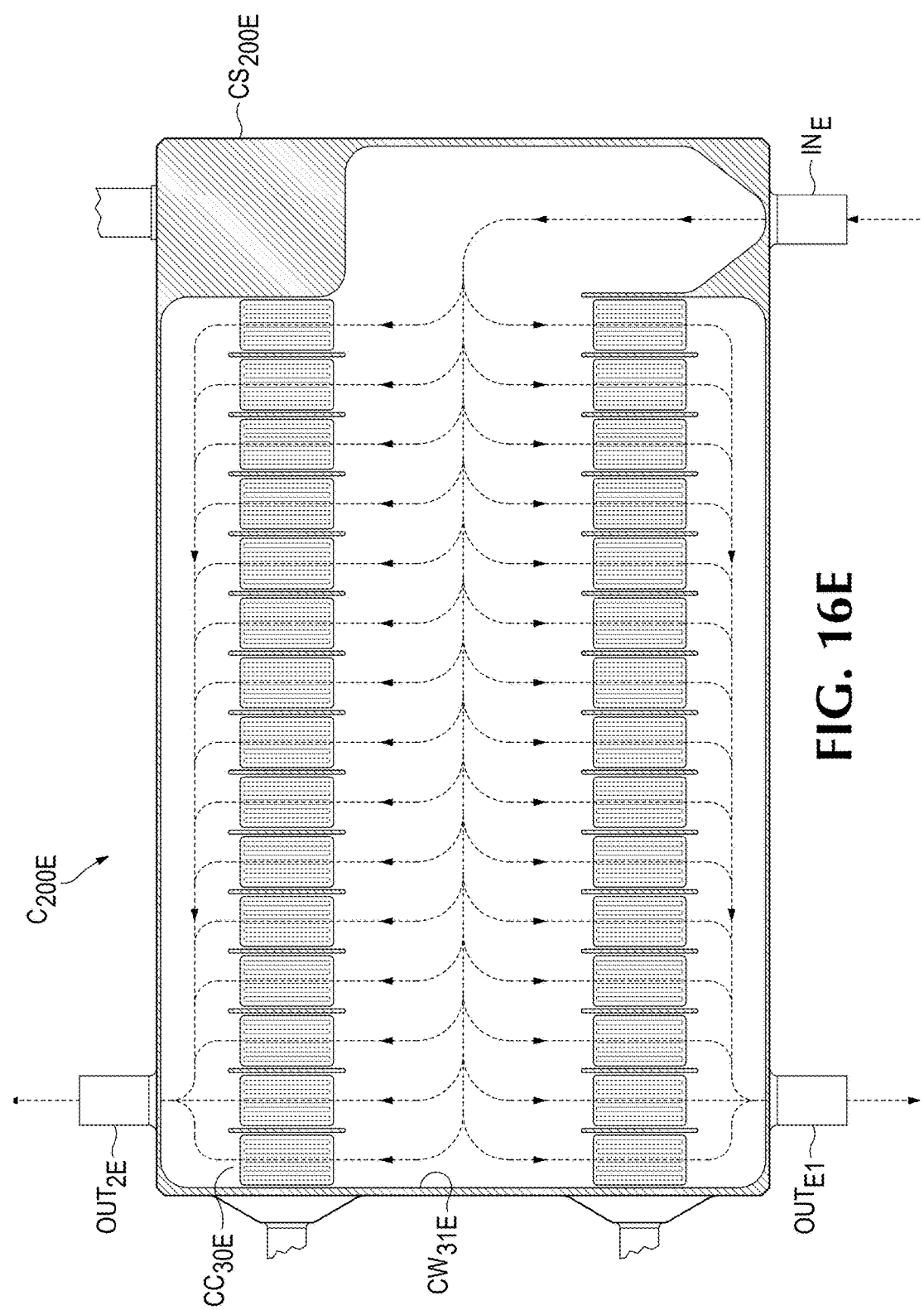
FIG. 16E is a bottom, plan view of an alternative to the LSLD pump of FIG. 16D.

By contrast, FIG. 16E shows an example carrier "$C_{200E}$," having the same M=30, N=1 configuration as the example carrier $C_{200D}$ of FIG. 16D, except that, instead of providing additional space in the carrier structure $CS_{200D}$ provided to allow the cooling channel $CW_{30D}$ to connect internally to the outlet $OUT_D$, an additional outlet "$OUT_{2E}$" is provided. For comparison between FIGS. 16D and 16E, the cooling channel "$CC_{30E}$" in the carrier $C_{200E}$ corresponds to the cooling channel $CC_{30D}$ in the carrier $C_{200D}$; and the channel wall "$CW_{31E}$" in the carrier $C_{200E}$ corresponds to the channel wall $CW_{31E}$ in the carrier $C_{200\#}$.

Figure 16F:
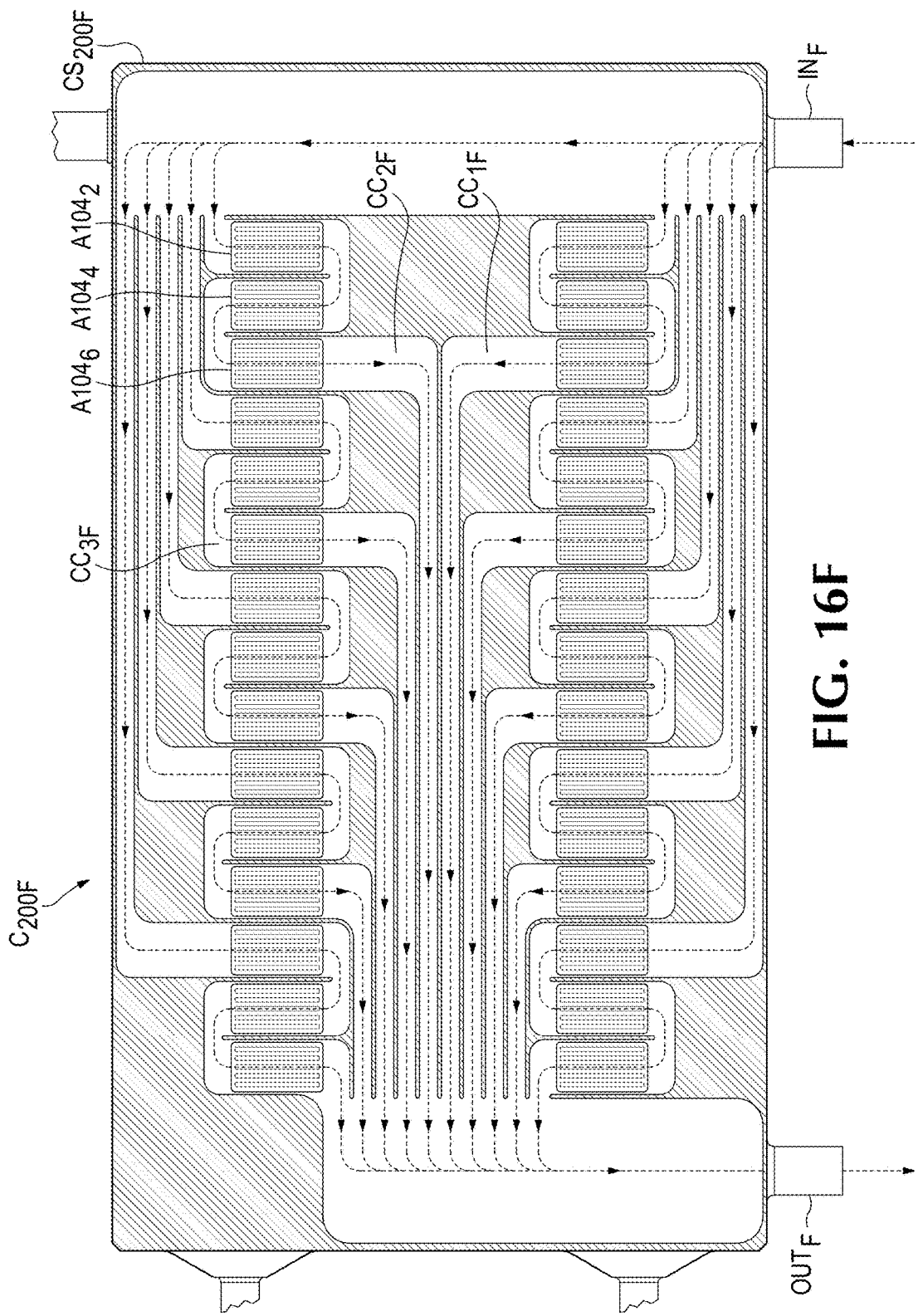
FIG. 16F is a bottom, plan view of an LSLD pump such as the LSLD pump of FIGS. 15A and 15B with a second example channel configuration where M=10 and N=3.

FIG. 16F shows another example carrier "$C_{200F}$" with a carrier structure "$CS_{204F}$," inlet "$IN_F$" and outlet "$OUT_F$" where M=10 cooling channels in parallel, e.g., the cooling channels "$CC_{1F}$," "$CC_{2F}$," and "$CC_{3F}$," each with N=3 heatsinks in series, e.g., the heatsinks $A104_2$, $A104_4$, and $A104_6$ of the cooling channel $CC_{2F}$.

The above M and N combinations are examples. For H=30 heatsinks A104 there are eight possible (M, N) combinations: (M=30, N=1); (M=15, N=2); (M=10, N=3); (M=6, N=5); (M=5, N=6); (M=3, N=10); (M=2, N=15); and (M=1, N=30). These are all the possible integer values of M and N that when multiplied together equal the total number of heatsinks H. It may be noted that, while it is generally preferable for the number of heatsinks H to be the same as the number of laser diodes 101, this is not essential.

Carriers, which are combinations of carrier structures and lids or lid members, according to the invention can be variably configured to provide for selected combinations of coolant mass flow rate "F" through the carrier, pressure drop "P" of the coolant across the carrier, and steady state temperature "T" of the laser diodes, by selecting a particular M and N combination. Examples of how different M and N configurations can provide for unique and significant variations in these environmental parameters is given in Tables I and II above. In particular, Tables I and II provide values for these variables for the particular configurations of FIGS. 16A and 16C; i.e., (M=15, N=2) and (M=3, N=10). It may be noted that these F, P, and T parameters are not independent from one another, so that varying one of these parameters will generally vary the other two.

For purposes of definition herein, a carrier is a support structure for mounting a plurality of laser diodes. The laser diodes may be mounted to respective separately provided heat sinks, to form respective laser diode assemblies, with the laser diode assemblies being, in turn, mounted to the carrier. In such cases, the carrier may also define fluid conducting, and in particular embodiments liquid conducting, cooling channels for conducting a coolant that is provided to an inlet of the carrier under pressure, and which is expelled from the carrier at an outlet of the carrier, for transferring heat away from the heat sinks, and thence for transferring heat away from the laser diodes.

A cooling channel for purposes herein is a conduit in a carrier through which a fluid, called a "coolant," under pressure will be substantially constrained to flow past, or flow through (hereinafter "flow past"), a predetermined one or more heat sinks.

A heatsink for purposes herein is a structure that has a heat exchanging surface which, when the heatsink is mounted to a carrier, forms part of a cooling channel such that fluid flowing through the cooling channel will make substantially direct physical contact with the heatsink. As mounted to a carrier, the thermal conductivity of heatsink, which for purposes herein is defined per unit of channel length in the direction of fluid flow through the channel ("per unit channel length"), that is preferably significantly larger, such as at least 2 times greater, than the thermal conductivities of other parts of the channel, excluding other heat sinks that may be part of the same channel.

The relative increase in thermal conductivity of a heat sink, as compared to other parts of a cooling channel, can be provided either or both by forming the heatsink, or a portion in contact with the coolant, of a material or materials having relatively high thermal conductivity, or by increasing the surface area, per unit channel length, of the heatsink relative to other parts of the cooling channel. As an example of the latter, the surface area of a heatsink, as mounted to a carrier so as to present a surface area for making contact with the coolant flowing in a cooling channel, including external surfaces of the heatsink such as may be provided for example by finned cooling members, and including internal surfaces of the heatsink such as may be provided for example by a microporous cooling member, may be substantially greater than the projected area of the heatsink, projected into the cooling channel. Preferably the surface area is significantly greater than the projected area of the heatsink, such at least 2 times greater.

The relative increase in thermal conductivity of a heat sink could also, or in combination with increasing the surface area as just mentioned, be provided by forming the heat sink of a material or materials that have a greater thermal conductivity than the material or materials used for forming the other parts of the cooling channel.

LSLD pumps and laser diode assemblies may be used in High Power Fiber Amplifiers (HPFA). The key drivers for SWAP are efficiency, brightness, size, and weight of the diodes, and the size and weight of packaging for the HPFA using low density materials in a compact form-factor.

A particular example of HPFA amplifier according to the invention utilizes high brightness, high efficiency, and low SWAP laser diodes provided by the nLight Corporation of Vancouver, Wash., in a compactly packaged fiber amplifier module that utilizes a fiber preamplifier and a fiber power amplifier producing single mode, narrowband output power in the range of 1.5 to 1.7 kilowatts (kW).

Figure 17:
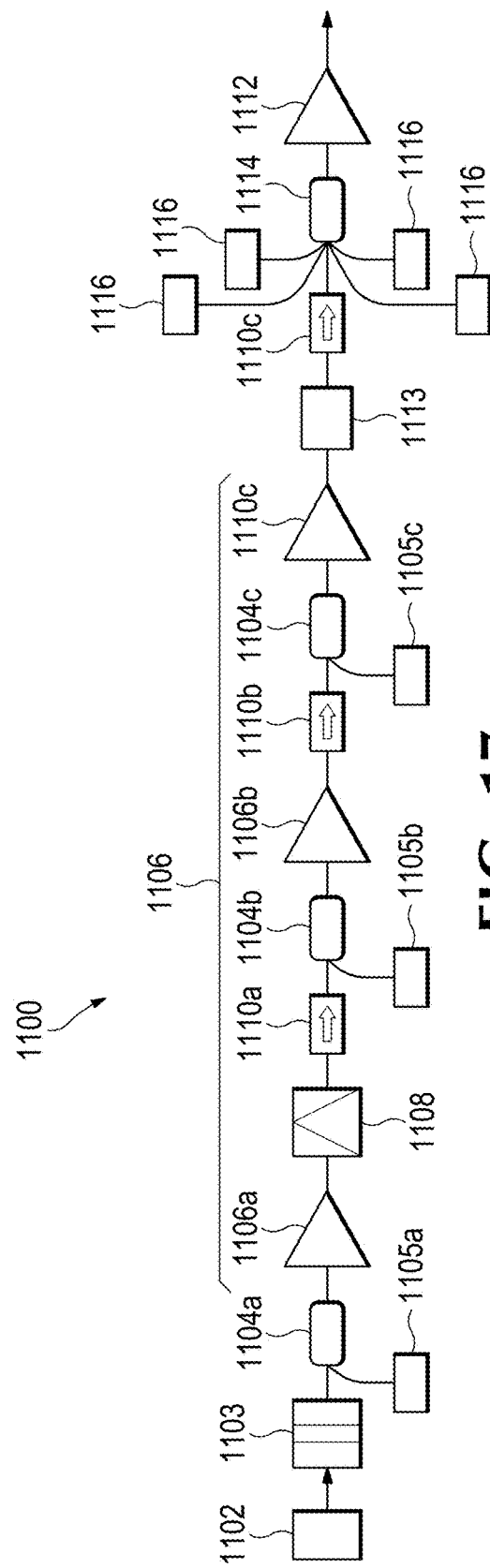
FIG. 17 is a block diagram of an LSLD pump or laser diode package according to the present invention.

FIG. 17 is a block diagram of such an amplifier 1100. The amplifier 1100 amplifies an optical seed signal emanating from a seed laser signal source 1102. The laser beam emanating from the seed laser signal source 1102 may be modulated to encode a signal in a number of different ways as known in the art. The laser power output of the seed laser signal source may be about 50 milliwatts (mW) or less.

The output of the signal source 1102 is provided as an input, through an FC/APC connector 1103, to a first (2+1):1 combiner 1104a, which combines the output of the seed laser with the output of a first preamplifier pump laser module 1105a.

The output of the first combiner 1104a is provided as input to the first stage 1106a of a fiber preamplifier 1106. The output of the first stage 1106a of the preamplifier 1106 may be fed through a bandpass filter 1108 and thence through a first isolator 1110a, into a second (2+1):1 combiner 1104b, which combines the output of the first isolator 1110a with the output of a second preamplifier pump laser module 1105b.

The output of the second combiner 1104b is provided as input to a second stage 1106b of the fiber preamplifier 1106; and the output of the second stage 1106b of the preamplifier 1106 may be fed through a second isolator 1110b into a third (2+1):1 combiner 1104c, which combines the output of the second isolator 1110b with the output of a third preamplifier pump laser module 1105c. The preamplifier pump laser modules 1106a, 1106b, and 1106c may be any standard pump laser modules.

The output of the third combiner 1104c is provided as input to the third and final stage 1106c of the three-stage fiber preamplifier 1106, to produce a pre-amplified laser signal source having a power that may be about 20 W.

The pre-amplified laser signal source output from the third stage 1106c of the preamplifier 1106 may be fed to a mode field adapter 1113 and a third isolator 1110c to a power laser amplifier 1112. At an input of the power laser amplifier 1112, the pre-amplified laser signal source obtained from the preamplifier 1106, through the mode field adapter 1113 and the third isolator 1110c, is presented to a (4+1):1 power amplifier combiner 1114, which combines the output of the third isolator 1110c with the outputs of four pump lasers 1116 according to the invention, such as the LSLD pumps 200, or the laser diode packages 100, which due to their superior cooling characteristics, are particularly advantageous for use in high power amplification.

In another example, not shown, the power amplifier combiner is a (6+1):1 combiner, for combining the outputs of six pump lasers according to the invention. Any number of pump lasers can be joined for high power amplification with a suitable power amplifier combiner.

The output of the power amplifier combiner 1114 is provided as input to a (in this example) single power amplifier stage 1112, the laser output power of which may be the in the range 1.5-1.7 kW.

Figure 18B:
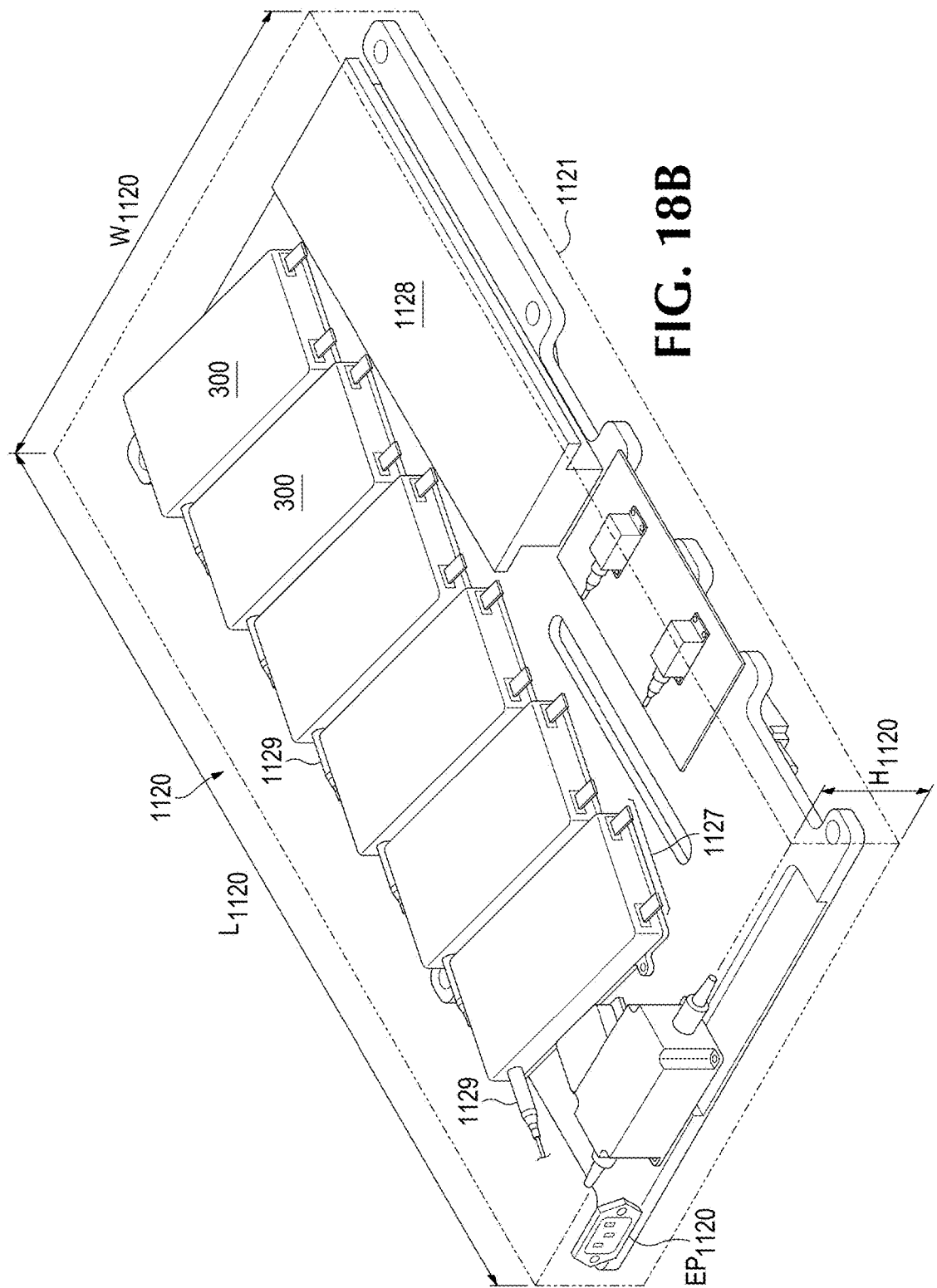
FIG. 18B is an isometric bottom view of the amplifier of FIG. 18A.

FIGS. 18A and 18B show a specific embodiment 1120 of the HPFA amplifier 1100 that utilizes six of the high brightness conductively cooled laser diode packages 300. Referring particularly to FIG. 18B, the amplifier 1100 may produce 1.7 kW of laser power and may be contained in an enclosure 1121 (shown in phantom) that has a height "$H_{1120}$" of 5.08 cm, a length "$L_{1120}$" of 50.8 cm, and a width "$W_{1120}$" of 25.4 cm, for a volume of about 6,550 cm$^3$ and a specific volume of about 3.85 cm$^3$/W. This low specific volume is achieved by the use of fewer and smaller high brightness pump modules compared to the prior art. Each of the laser diode packages 100 produces approximately 380 W or more of laser output power with greater than 50% electrical-to-optical power conversion from a 200 μm and 0.22 NA beam, from a volume of about 87 cm$^3$ which corresponds to a specific volume of about 0.23 cm$^3$/W.

The HPFA laser output power generally depends on the number of laser diodes and the type of laser diode chips that are used. In general for HPFA amplifiers having 2×N configurations, where N=9 the amplifier will typically produce between about 150 W-250 W; where N=12, the amplifier will typically produce about 200 W-300 W; and where N=15, the amplifier will typically produce 400 W-600 W.

The enclosure 1121 supports an electrical power connector "$EP_{1120}$" to provide electrical power to the laser diode packages 300 and driver electronics 1128. Each laser diode package 300 has a corresponding electrical power input 1127 and fiber laser primp beam output 1129.

Use of the pumps 300 avoids the need to use cascaded tree architecture, which typically resorts to use of 7:1 combiners feeding into a (6+1):1 signal-pump combiner. This cascaded architecture typically needs 42 pumps and six extra 7:1 pump combiners. There are also similar brightness pumps known in the art but their volumes are significantly larger due to the use of several large optics to fiber-couple an array of laser diode bars or mini-bars with multiple chips on them.

Figure 19B:
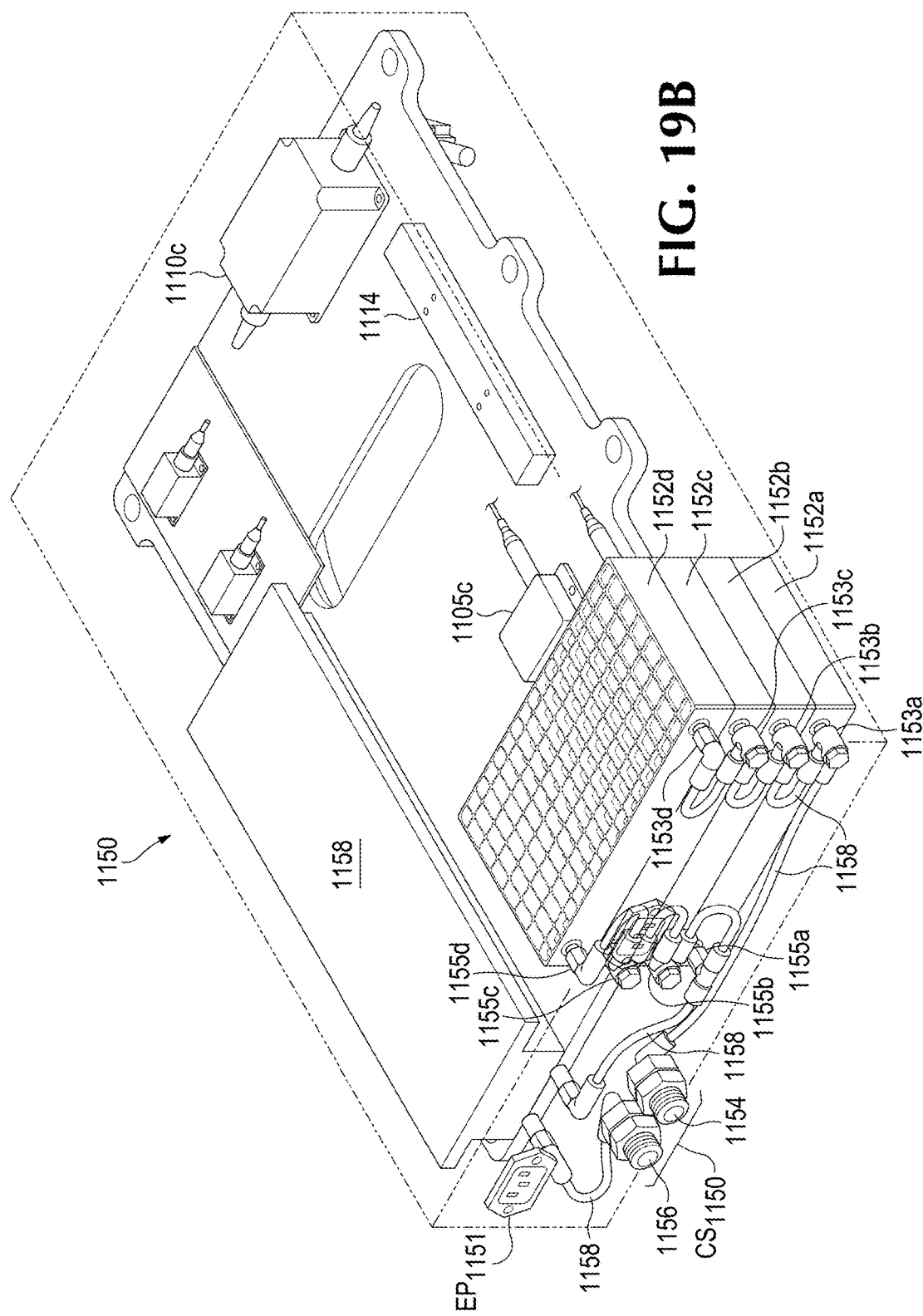
FIG. 19B is an isometric bottom view of the amplifier of FIG. 19A.

FIGS. 19A and 19B show a specific embodiment 1150 of the HPFA amplifier 1100 that utilizes four high brightness fluid cooled LSLD pumps 1152a-1152d according to the invention, as the pump lasers 1116 of FIG. 17. Each of the pumps 1152a-1152d has a respective coolant inlet 1153a-1153d for receiving coolant at relatively high pressure, and a respective coolant outlet 1155a-1155d for expelling coolant at a relatively low pressure. The pressure drop P for a given pump is the difference in the coolant pressure at the inlet for that pump (e.g., the inlet 1153a for the pump 1152a) and the coolant pressure at the outlet for that pump (e.g., the outlet 1155a for the pump 1155a).

The inlets and outlets are plumbed together, and to amplifier coolant supply connectors "$CS_{1150}$" (see FIG. 19B) comprising an amplifier inlet 1154 and an amplifier outlet 1156, with plumbing lines 1158, to allow coolant to flow into the amplifier 1150, through the channels of the pumps as described above, and out from the amplifier 1150. The pressure drop P for the amplifier 1150 as a whole is the difference in the coolant pressure at the inlet 1154 for the amplifier and the coolant pressure at the outlet 1156 for the amplifier.

The pumps may be plumbed for coolant flow in parallel as shown, or in series, or in any desired combination thereof. With the pumps plumbed in parallel as shown in FIGS. 19A and 19B, the pressure drop P for amplifier 1150 is essentially the same as the pressure drop P for each of the pumps 1152a-1152d; whereas if the pumps were all plumbed in series, the pressure drop P for the amplifier 1150 would essentially be four times the pressure drop P for each of the pumps. So in addition to allowing for varying the aforementioned environmental parameters F (coolant mass flow rate), P (pressure drop), and T (steady state temperature) for the pumps by varying the M and N parameters for the channels, these same variables can also be varied, separately or in combination, by varying the number M* of pumps that are plumbed in parallel and the number N* of pumps that are plumbed in series.

As an example of how to plumb the pumps 1152a-1152d in series, the fluid connection between the inlet 1153a and the inlet 1153b shown in FIGS. 19A and 19B could be disconnected; the fluid connection that is shown between the outlet 1155b and the outlet 1155c could be disconnected; and the fluid connection that is shown between the inlet 1153c and the inlet 1153d could be disconnected. In such case the outlets 1155b and 1155d would serve as inlets, and the inlets 1153b and 1153d would serve as outlets, reversing the coolant flow direction shown in FIGS. 16A-16F for the LSLD pumps 1152b and 1152d, the coolant flowing through the pumps 1152a-1152d in series, in that order. This is just one example. The amplifier 1150 has an enclosure 1151 (shown in phantom). The enclosure 1151 supports an electrical power connector "$EP_{1151}$" to provide electrical power to the pumps 1152a-1152d and pump diode driver electronics 1158, which may also be fluid cooled, through additional plumbing lines 1158 such as shown. Each of the pumps 1152a-1152d has a corresponding electrical power input (not visible) and fiber laser pump beam output 1159.

Figure 20:
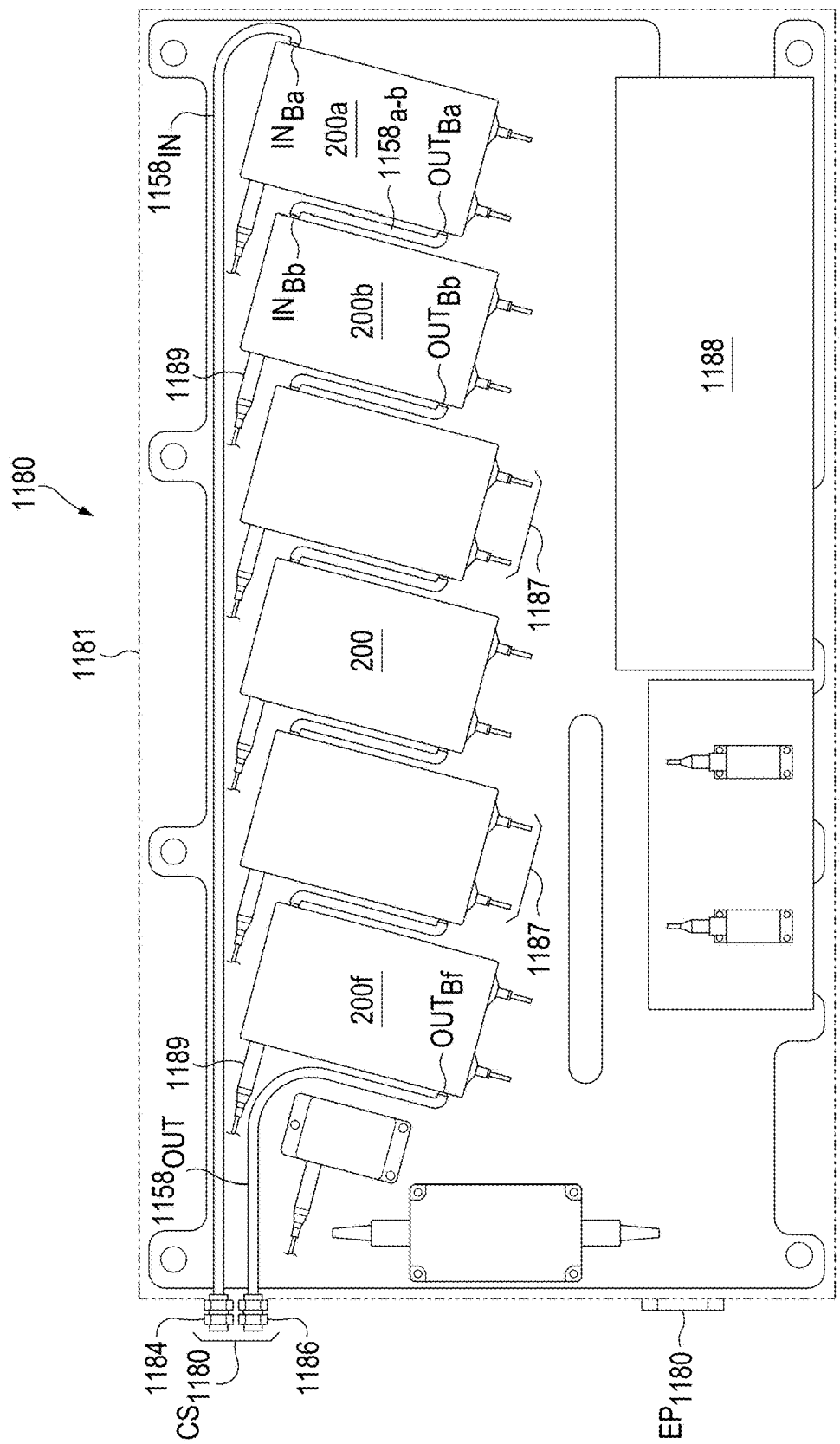
FIG. 20 is a plan view of an HPFA amplifier similar to that of FIG. 18A, employing six fluid cooled LSLD pumps according to the present invention.

FIG. 20 shows a specific embodiment 1180 of the HPFA amplifier that is a modification of the embodiment 1120. The embodiment 1180 utilizes, in place of conductively cooled laser diode packages 300, fluid cooled LSLD pumps 200, with the carriers $C_{200B}$ of FIG. 16B that facilitate side-by-side mounting of the LSLD pumps by virtue of having inlets $IN_B$ and outlets $OUT_B$ that are on opposite sides of the carriers.

The amplifier 1120 has an enclosure 1181 (shown in phantom). The enclosure 1181 supports coolant supply connectors "$CS_{1150}$" for supplying coolant to and expelling coolant from the LSLD pumps 200. The LSLD pumps 200 are plumbed for cooling in series; for example, an inlet "$IN_{Ba}$" of the LSLD pump 200a is connected to an inlet 1184 of the coolant supply connectors $CS_{1180}$ through a plumbing line "$1158_{IN}$," and an outlet "$OUT_{Ba}$" of the LSLD pump 200a is connected to an inlet "$IN_{Bb}$" of the LSLD pump 200b through a plumbing line "$1158_{a-b}$;" and an outlet of the LSLD pump 200f is connected to an outlet 1186 of the coolant supply connectors $CS_{1180}$ through a plumbing line "$1158_{OUT}$."

The enclosure 1181 also supports an electrical power connector "$EP_{1180}$" to provide electrical power to the laser diode packages 200 and driver electronics 1188. Each laser diode package 200 has a corresponding electrical power input 1187 and fiber laser pump beam output 1189.

For fluid cooled embodiments, a fluid pump is needed to cause coolant to flow through the coolant flow channels of the laser pumps described above. The fluid pump is generally externally provided. Such fluid pumps are known in the art and need not be described further for purposes herein.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only the claims that follow.

In addition, the specific embodiments described in the specification, drawings, summary of the invention, and abstract of the disclosure are not intended to limit the scope of any of the claims, but are only meant to provide illustrative examples of the invention to which the claims are drawn. The scope of the invention is understood to be encompassed by the language of the claims, and structural and functional equivalents thereof.

The invention claimed is:
1. A laser assembly, comprising:
a plurality H of distinct, spaced-apart heatsinks for mounting a respective plurality of distinct, spaced apart laser diodes, said heatsinks having respective diode mounting members having respective attachment surfaces for receiving respective said laser diodes; and a carrier having a plurality M of fluid coolant flow channels for conducting a coolant from an inlet of said carrier, through said carrier, to an outlet of said carrier, each of said channels being configured to conduct the coolant past a predetermined number N of said heatsinks in series, wherein M multiplied by N equals H, and wherein, for a given coolant and a given rate of heat generation by said laser diodes, a coolant mass flow rate F of the coolant through the carrier, a coolant pressure drop P of the coolant across the carrier, and a steady state temperature T of the laser diodes, depends on the combination of M and N, allowing for selecting M and N to vary the combinations of the variables F, P and T uniquely and significantly, and thereby allowing for optimizing said variables for a particular application.

2. The laser assembly of claim 1, wherein said heatsinks each have respective sets of cooling members disposed opposite the respective attachment surfaces and extending away therefrom into a respective one of said coolant flow channels so as to provide for coolant flowing therethrough.

3. The laser assembly of claim 1, wherein said heatsinks are arranged in an integer number R of substantially parallel rows of said heatsinks, and said rows define an integer number C of substantially parallel columns of said heatsinks.

4. The laser assembly of claim 3, wherein R =2.

5. The laser assembly of claim 4, wherein C =15.

6. The laser assembly of claim 5, wherein M is 15 and N is 2.

7. The laser assembly of claim 5, wherein M is 3 and N is 10.

8. The laser assembly of claim 1, wherein the number of laser diodes equals the number H of heatsinks.

9. The laser assembly of claim 1, wherein said laser diodes emit respective laser diode beams and said laser assembly further comprises a laser diode beam multiplexer for multiplexing said laser diode beams to produce a single laser module output beam.

10. The laser assembly of claim 9, wherein said heatsinks are arranged in two substantially parallel rows, wherein the laser diode beams of the lasers of one of said rows points inwardly toward the other of said rows, wherein said laser assembly further comprises a plurality of mirrors, and wherein each of said laser diode beams is redirected by a respective one of said mirrors toward said multiplexer.

11. The laser assembly of claim 10, wherein said multiplexer comprises a cross-polarization beam combiner for producing said laser module output beam.

12. The laser assembly of claim 9, wherein said multiplexer comprises a cross-polarization beam combiner for producing said laser module output beam.

13. The laser assembly of claim 12, wherein said laser module output beam defines a first pump beam, the laser assembly further comprising a seed laser signal source, a signal source laser preamplifier for producing a pre-amplified laser signal source, a combiner for combining said first pump beam with said pre-amplified laser signal source, and a power laser amplifier for receiving the combined first pump beam and pre-amplified laser signal source for amplifying said pre-amplified laser signal source in response to said first pump beam.

14. The laser assembly of claim 13, further comprising one or more additional said laser assemblies for producing respective additional pump beams, and wherein said combiner is configured for combining said additional pump beams with said first pump beam.

15. The laser assembly of claim 11, wherein said laser module output beam defines a first pump beam, the laser assembly further comprising a seed laser signal source, a signal source laser preamplifier for producing a pre-amplified laser signal source, a combiner for combining said first pump beam with said pre-amplified laser signal source, and a power laser amplifier for receiving the combined first pump beam and pre-amplified laser signal source for amplifying said pre-amplified laser signal source in response to said first pump beam.

16. The laser assembly of claim 15, further comprising one or more additional said laser assemblies producing respective additional pump beams, and wherein said combiner is configured for combining said additional pump beams with said first pump beam.

17. The laser assembly of claim 10, wherein said laser module output beam defines a first pump beam, the laser assembly further comprising a seed laser signal source, a signal source laser preamplifier for producing a pre-amplified laser signal source, a combiner for combining said first pump beam with said pre-amplified laser signal source, and a power laser amplifier for receiving the combined first pump beam and pre-amplified laser signal source for amplifying said pre-amplified laser signal source in response to said first pump beam.

18. The laser assembly of claim 17, further comprising one or more additional said laser assemblies producing respective additional pump beams, and wherein said combiner is configured for combining said additional pump beams with said first pump beam.

19. The laser assembly of claim 9, wherein said laser module output beam defines a first pump beam, the laser assembly further comprising a seed laser signal source, a signal source laser preamplifier for producing a pre-amplified laser signal source, a combiner for combining said first pump beam with said pre-amplified laser signal source, and a power laser amplifier for receiving the combined first pump beam and pre-amplified laser signal source for amplifying said pre-amplified laser signal source in response to said first pump beam.

20. The laser assembly of claim 19, further comprising one or more additional said laser assemblies producing respective additional pump beams, and wherein said combiner is configured for combining said additional pump beams with said first pump beam.

21. A method for configuring a laser diode package for forced fluid cooling, comprising:

providing a plurality H of distinct, spaced-apart heatsinks for mounting a respective plurality of distinct, spaced apart laser diodes, said heatsinks having respective diode mounting members having respective attachment surfaces for receiving respective said laser diodes;

providing a carrier having a plurality M of fluid coolant flow channels for conducting a coolant from an inlet of said carrier, through said carrier, to an outlet of said carrier, each of said channels being configured to conduct the coolant past a predetermined number N of said heatsinks in series, wherein M multiplied by N equals H;

selecting a desired combination of environmental variables F, P, and T, where, for a given coolant and a given rate of heat generation by said laser diodes, F is a coolant mass flow rate through the carrier, P is a coolant pressure drop of the coolant across the carrier, and T is a steady state temperature of the laser diodes; and selecting a combination of M and N so as to most closely achieve said desired combination.

22. A method for configuring a laser fiber amplifier for forced fluid cooling, comprising:

providing a plurality of carriers for mounting respective pluralities of laser diodes, each said carrier having one or more cooling channels for conducting a coolant from an inlet of said carrier, through said carrier, to an outlet of said carrier, for cooling said laser diodes;

at least one of (A), selecting a desired coolant pressure drop P across the amplifier for a given coolant mass flow rate through the amplifier, and (B), selecting a desired coolant mass flow rate F through the amplifier for a given coolant pressure drop across the amplifier; and plumbing the inlets and outlets of said carriers together in a selected combination of parallel and series connections that achieve at least one of (A), a real coolant pressure drop across the amplifier, at the given coolant mass flow rate, that most closely matches the desired coolant pressure drop P, and (B), a real coolant mass flow rate through the amplifier, for the given coolant pressure drop, that most closely matches the desired coolant mass flow rate F.

* * * * *